(12) United States Patent
Fukagawa et al.

(10) Patent No.: US 11,860,390 B2
(45) Date of Patent: Jan. 2, 2024

(54) WAVELENGTH SELECTIVE ABSORPTION FILTER, ORGANIC ELECTROLUMINESCENT DISPLAY DEVICE, AND LIQUID CRYSTAL DISPLAY DEVICE

(71) Applicant: FUJIFILM Corporation, Tokyo (JP)

(72) Inventors: Nobutaka Fukagawa, Kanagawa (JP); Daisuke Sasaki, Kanagawa (JP); Yoshihiro Jimbo, Kanagawa (JP); Hidetomo Furuyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/868,171

(22) Filed: Jul. 19, 2022

(65) Prior Publication Data

US 2022/0381960 A1 Dec. 1, 2022

Related U.S. Application Data

(63) Continuation of application No. PCT/JP2021/006887, filed on Feb. 24, 2021.

(30) Foreign Application Priority Data

Feb. 25, 2020 (JP) .................................. 2020-029393

(51) Int. Cl.
*G02B 5/22* (2006.01)
*G02F 1/1335* (2006.01)
*H10K 59/38* (2023.01)

(52) U.S. Cl.
CPC ....... *G02B 5/223* (2013.01); *G02F 1/133509* (2013.01); *G02F 1/133514* (2013.01);
(Continued)

(58) Field of Classification Search
None
See application file for complete search history.

(56) References Cited

U.S. PATENT DOCUMENTS

2015/0338561 A1 11/2015 Moe
2016/0259104 A1* 9/2016 Lee ...................... G02B 5/3033
(Continued)

FOREIGN PATENT DOCUMENTS

EP 1408366 A2 * 4/2004 ............. B82Y 10/00
JP 11-193353 A 7/1999
(Continued)

OTHER PUBLICATIONS

Office Action, which was issued by the Japanese Patent Office dated Jan. 31, 2023, in connection with Japanese Patent Application No. 2022-503655.
(Continued)

*Primary Examiner* — Anthony J Frost
(74) *Attorney, Agent, or Firm* — Edwards Neils LLC; Jean C. Edwards, Esq.

(57) ABSTRACT

Provided are a wavelength selective absorption filter including a resin and the following dye A and dye D, each of which has a main absorption wavelength band in a different wavelength range, in which an absorbance Ab (λ) at a wavelength λ nm of this wavelength selective absorption filter satisfies a relationship of the Relational Expression (I) 0.05<Ab (450)/Ab (430)<1.00, as well as a polarizing plate and an organic electroluminescent display device or liquid crystal display device including the wavelength selective absorption filter. The dye A is a dye having a main absorption wavelength band in the wavelength selective absorption filter at a wavelength of 400 to 430 nm. The dye D is a dye having a main absorption wavelength band in the wavelength selective absorption filter at a wavelength of 640 to 730 nm.

6 Claims, 1 Drawing Sheet

(52) U.S. Cl.
CPC .. *G02F 1/133528* (2013.01); *G02F 1/133533* (2013.01); *H10K 59/38* (2023.02); *C09K 2323/031* (2020.08)

(56) References Cited

U.S. PATENT DOCUMENTS

2017/0235032 A1  8/2017  Miyazaki
2019/0004337 A1  1/2019  Tamura et al.

FOREIGN PATENT DOCUMENTS

| | | | |
|---|---|---|---|
| JP | 11193353 A | * | 7/1999 |
| JP | 2017-116951 A | | 6/2017 |
| JP | 2017-129803 A | | 7/2017 |
| JP | 2017-142412 A | | 8/2017 |
| JP | 2019-204086 A | | 11/2019 |
| WO | 2014/208749 A1 | | 12/2014 |

OTHER PUBLICATIONS

International Search Report issued in PCT/JP2021/006887 dated Apr. 20, 2021.
Written Opinion issued in PCT/JP2021/006887 dated Apr. 20, 2021.
International Preliminary Report on Patentability completed by WIPO dated Aug. 30, 2022 in connection with International Patent Application No. PCT/JP2021/006887.

* cited by examiner

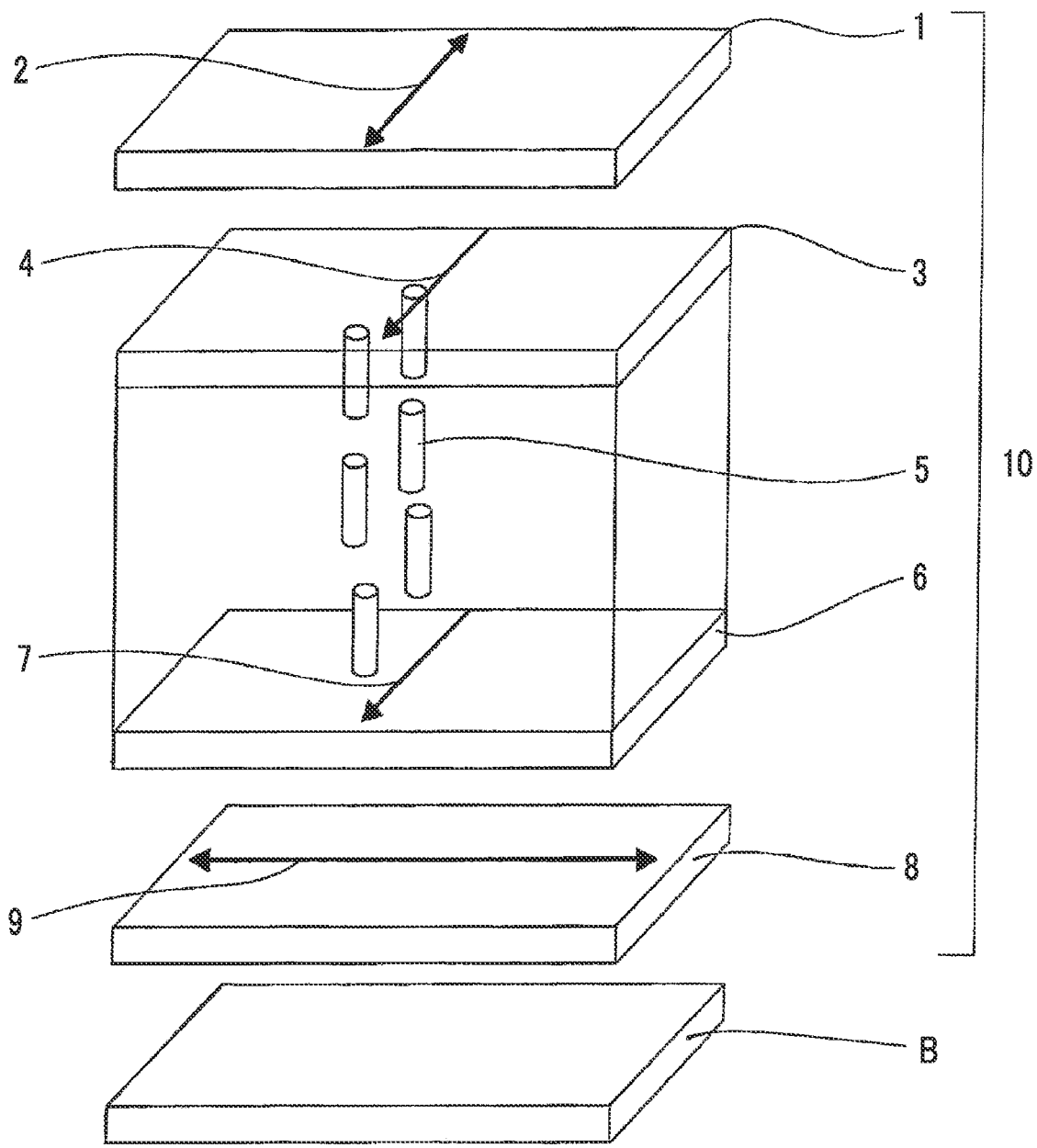

WAVELENGTH SELECTIVE ABSORPTION FILTER, ORGANIC ELECTROLUMINESCENT DISPLAY DEVICE, AND LIQUID CRYSTAL DISPLAY DEVICE

CROSS-REFERENCE TO RELATED APPLICATIONS

This application is a Continuation of PCT International Application No. PCT/JP2021/006887 filed on Feb. 24, 2021, which was published under PCT Article 21(2) in Japanese, and which claims priority under 35 U.S.C. § 119 (a) to Japanese Patent Application No. 2020-029393 filed in Japan on Feb. 25, 2020. The above applications are hereby expressly incorporated by reference, in their entirety, into the present application.

BACKGROUND OF THE INVENTION

1. Field of the Invention

The present invention relates to a wavelength selective absorption filter, an organic electroluminescent display device, and a liquid crystal display device.

2. Description of the Related Art

In a case of using an image display device such as an organic electroluminescent (OLED) display device or a liquid crystal display device, it is recognized that looking at the display for a long time may cause various symptoms such as dry eye, inflammation of the eye, fatigue, blurred vision, and headache, or asthenopia, or it may cause a decrease in eyesight.

As a countermeasure to these, there is known a technique of cutting out blue light by using an optical filter that cuts out visible light in the blue wavelength range, such as an optical filter containing a coloring agent having an absorption maximum in the vicinity of a wavelength of 430 nm. On the other hand, in a case where an optical filter having such a function of cutting out blue light is used, there is a problem that a change in tint occurs.

As a result, there is a demand for the development of an optical filter that solves the above problems together.

For example, JP2017-142412A discloses an optical film which has selective absorbability in the vicinity of 420 nm and in which a ratio of an absorbance at 450 nm to an absorbance at a wavelength of 420 nm is within a specific range. WO2014/2087149A discloses a cured film containing a coloring agent having a specific chemical structure, and it describes that the cured film has excellent blue light cutting-out properties.

Further, as a shield film that reduces light radiation harmful to the eyes from an electronic device, JP2017-116951A discloses a shield in which the transmittance in an ultraviolet range of 380 to 400 nm is reduced by 90% or more, the transmittance in a high energy visible light range of 415 to 555 nm is reduced by 10% or more, and the transmittance in a red light range of 625 to 740 nm is reduced by 10% or more.

SUMMARY OF THE INVENTION

In the panel or monitor industry in recent years, as the function of cutting out blue light, it has been demanded to have a function of cutting out blue light, satisfying the Low Blue Light Content which is the standard of TÜV Rheinland Holding AG, in order to suppress harmful effects on retinal pigment epithelial cells.

As a result of studies by the inventors of the present invention, it was found that in the optical film disclosed in JP2017-142412A or the shield disclosed in JP2017-116951A, the absorption responsible for cutting out blue light is located on the short wavelength side in the blue wavelength range, and thus it cannot be said that the blue light is sufficiently reduced, and it has become clear that there is room for improvement. Further, the shield disclosed in JP2017-116951A has a problem in that a decrease in relative brightness and a change in tint (a significant increase in the correlated color temperature) also occur.

On the other hand, it was found that in the cured film disclosed in WO2014/2087149A, although the absorption responsible for cutting out blue light is located on the long wavelength side in the blue wavelength range, a change in tint (a significant decrease in the correlated color temperature) occurs in a case where the formulation amount of the dye is adjusted so that a sufficient function of cutting out blue light is exhibited.

An object of the present invention is to provide a wavelength selective absorption filter that can achieve both an excellent function of cutting out blue light and an excellent correlated color temperature while suppressing a decrease in relative brightness in a case of being used on the front surface of an image display device; a polarizing plate containing the wavelength selective absorption filter; and an organic electroluminescent display device or liquid crystal display device.

As a result of diligent studies in consideration of the above problems, the inventors of the present invention found that in a case of using, in combination, a dye A having an absorbance ratio that satisfies a specific relational expression and a dye D exhibiting absorption in the red light range in the visible light range, as dyes exhibiting a function of cutting out blue light, it is possible to achieve both an excellent correlated color temperature and an excellent function of cutting out blue light while suppressing a decrease in relative brightness. Further studies have been carried out based on these findings, whereby the present invention has been completed.

That is, the above object has been achieved by the following means.

<1> A wavelength selective absorption filter comprising a resin; and the following dye A and dye D, each of which has a main absorption wavelength band in a different wavelength range.

wherein an absorbance Ab (k) at a wavelength k nm of this wavelength selective absorption filter satisfies a relationship of the following Relation Expression (I), the dye A: a dye having a main absorption wavelength band in the wavelength selective absorption filter at a wavelength of 400 to 430 nm the dye D: a dye having a main absorption wavelength band in the wavelength selective absorption filter at a wavelength of 640 to 730 nm $$0.05 < Ab(450)/Ab(430) < 1.00. \qquad \text{Relational Expression (I)}$$

<2> The wavelength selective absorption filter according to <1>, in which the dye A is a coloring agent represented by General Formula (A1),

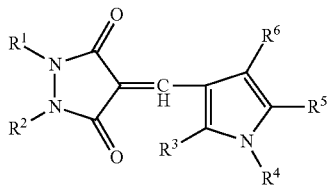

General Formula (A1)

in the formula, $R^1$ and $R^2$ each independently represent an alkyl group or an aryl group, $R^3$ to $R^5$ each independently represent a hydrogen atom or a substituent, and $R^5$ and $R^6$ may be bonded to each other to form a 6-membered ring.

<3> A polarizing plate comprising the wavelength selective absorption filter according to <1> or <2>.

<4> An organic electroluminescent display device or a liquid crystal display device, comprising the wavelength selective absorption filter according to <1> or <2>.

In the present invention, in a case where there are a plurality of substituents, linking groups, and the like (hereinafter, referred to as substituents and the like) represented by specific reference numerals or formulae, or in a case where a plurality of substituents and the like are defined at the same time, the respective substituents and the like may be the same or different from each other unless otherwise specified. The same applies to the definition of the number of substituents or the like. In addition, in a case where a plurality of substituents and the like are close to each other (particularly in a case where the substituents and the like are adjacent to each other), the substituents and the like may also be linked to each other to form a ring unless otherwise specified. In addition, unless otherwise specified, rings, for example, alicyclic rings, aromatic rings, and heterocyclic rings may be further fused to form a fused ring.

In the present invention, in a case where the number of carbon atoms of a certain group is defined, this number of carbon atoms means the number of carbon atoms of the entire group thereof unless otherwise specified in the present invention or the present specification. That is, in a case where this group is in a form of further having a substituent, the number of carbon atoms means the number of carbon atoms of the entire group including this substituent.

In the present invention, unless otherwise specified, the wavelength selective absorption filter may contain one kind of each of the components constituting the wavelength selective absorption filter (for example, a dye, a resin, and another component that may be appropriately contained) or may contain two or more kinds thereof.

In the present invention, in a case where an E type double bond and a Z type double bond are present in a molecule, the double bond may be any one thereof or may be a mixture thereof, unless otherwise specified.

In the present invention, the representation of a compound (including a complex) is used to mean not only the compound itself but also a salt thereof, and an ion thereof. In addition, it is meant to include those in which a part of the structure is changed, as long as the effects of the present invention are not impaired. Furthermore, it is meant that a compound, which is not specified to be substituted or unsubstituted, may have any substituent, as long as the effects of the present invention are not impaired. The same applies to the definition of a substituent or a linking group.

In addition, in the present invention, the numerical range indicated by using "to" means a range including the numerical values before and after "to" as the lower limit value and the upper limit value, respectively.

In the present invention, the "composition" includes a mixture in which the component concentration varies within a range in which a desired function is not impaired, in addition to a mixture in which the component concentration is constant (each component is uniformly dispersed).

In the present invention, the description of "having a main absorption wavelength band at a wavelength XX to YY nm" means that a wavelength at which the maximum absorption is exhibited (that is, the maximal absorption wavelength) is present in the wavelength range of XX to YY nm. Therefore, in a case where the maximal absorption wavelength is present in the above-described wavelength range, the entire absorption band including this wavelength may be in the above-described wavelength range or may also extend up to the outside of the above-described wavelength range. In addition, in a case where there are a plurality of maximal absorption wavelengths, it suffices that a maximal absorption wavelength at which the highest absorbance is exhibited is present in the above-described wavelength range as long as the effects of the present invention are exhibited. That is, the maximal absorption wavelength other than the maximal absorption wavelength at which the highest absorbance is exhibited may be present either inside or outside the above-described wavelength range of XX to YY nm within the range in which the effects of the present invention are exhibited.

According to the wavelength selective absorption filter and the polarizing plate according to aspects of the present invention, it is possible to achieve both an excellent function of cutting out blue light and an excellent correlated color temperature while suppressing a decrease in relative brightness in a case of being used on the front surface of an image display device.

Further, the organic electroluminescent display device and the liquid crystal display device according to the aspects of the present, which are equipped with the wavelength selective absorption filter according to the aspect of the present invention, have and exhibit both an excellent function of cutting out blue light and an excellent correlated color temperature while suppressing a decrease in relative brightness.

BRIEF DESCRIPTION OF THE DRAWINGS

FIG. 1 is a schematic view illustrating an outline of an embodiment of a liquid crystal display device which includes a wavelength selective absorption filter of the present invention in a backlight.

DESCRIPTION OF THE PREFERRED EMBODIMENTS

[Wavelength Selective Absorption Filter]

The wavelength selective absorption filter of the present invention contains a resin and the following dye A and dye D, each of which has a main absorption wavelength band in a different wavelength range, in which an absorbance Ab (λ) at a wavelength λ nm of the wavelength selective absorption filter satisfies a relationship of the following Expression (I).

the dye A: a dye having a main absorption wavelength band in the wavelength selective absorption filter at a wavelength of 400 to 430 nm the dye D: a dye having a main absorption wavelength band in the wavelength selective absorption filter at a wavelength of 640 to 730 nm $$0.05 < Ab(450)/Ab(430) < 1.00. \quad \text{Relational Expression (I)}$$

In the present invention, the main absorption wavelength band of a dye is a main absorption wavelength band of a dye, which is measured in a state of being a wavelength selective absorption filter. In addition, in the present invention, the absorbance ratio described in Relational Expression (I) is a value calculated by using a value of an absorbance that is measured in a state of being a wavelength selective absorption filter. Specifically, in Examples described later, it is measured and calculated in a state of being a base material-attached wavelength selective absorption filter under the conditions described in the section of the maximal absorption value of the wavelength selective absorption filter.

Regarding the form of the wavelength selective absorption filter according to the embodiment of the present invention, it suffices that the dye in the wavelength selective absorption filter exhibits an absorption spectrum and the effects of the present invention can be exhibited. One form of the wavelength selective absorption filter according to the embodiment of the present invention shall be a filter obtained by dispersing (preferably dissolving) the "dye" in the resin to make the wavelength selective absorption filter a filter that exhibits a specific absorption spectrum derived from the dye. The dispersion may be any type of dispersion, such as a random type or a regular type.

The above-described dye A and dye D that can be contained in the wavelength selective absorption filter of the present invention may be each independently one kind or two or more kinds.

The wavelength selective absorption filter according to the embodiment of the present invention may also contain a dye other than the above-described dye A and dye D within the range in which the effects of the present invention are exhibited.

Since the wavelength selective absorption filter according to the embodiment of the present invention contains the dye A and the dye D and satisfies Relational Expression (I), it is possible to achieve both an excellent function of cutting out blue light and an excellent correlated color temperature while suppressing a decrease in relative brightness in a case of being used on the front surface of an image display device. The presumable reason for this is conceived to be as follows.

The wavelength selective absorption filter according to the embodiment of the present invention has a main absorption wavelength band at a wavelength of 400 to 430 nm and contains the dye A satisfying $0.05 \leq Ab(450)/Ab(430)$ in Relational Expression (I), and thus it can exhibit an excellent function of cutting out blue light.

Further, the dye A satisfying $Ab(450)/Ab(430) < 1.00$ in Relational Expression (I) and the dye D having a main absorption wavelength band at a wavelength of 640 to 730 nm are contained in combination. It is conceived that this makes it possible for the wavelength selective absorption filter according to the embodiment of the present invention to have an excellent function of cutting out blue light and exhibit an excellent correlated color temperature while suppressing a decrease in relative brightness, by adjusting tint not to overlap with the wavelength range of the light emitting source of the image display device, in a case where the wavelength selective absorption filter is used by being disposed on the visible side (the front surface) from the light source in the image display device.

Among the above, Relational Expression (I) preferably satisfies the following preferred range, from the viewpoint of achieving the suppression of the decrease in relative brightness, the excellent function of cutting out blue light, and the excellent correlated color temperature at a higher level.

The upper limit value of Ab (450)/Ab (430) in Relational Expression (I) is preferably 0.90 or less, more preferably 0.85 or less, still more preferably 0.80 or less, and particularly preferably 0.60 or less. The lower limit value thereof is preferably 0.07 or more, more preferably 0.10 or more, and still more preferably 0.15 or more.

<Dye>

(Dye A)

The dye A is not particularly limited as long as it has a main absorption wavelength band at a wavelength of 400 to 430 nm in the wavelength selective absorption filter and is a dye described later, which satisfies Relational Expression (I) as the wavelength selective absorption filter according to the embodiment of the present invention, and various dyes can be used.

As the dye A, a coloring agent represented by General Formula (A1) is preferable in that an absorption waveform in the main absorption wavelength band is sharp.

In a case where a coloring agent represented by General Formula (A1) is used as the dye A, it is possible for the wavelength selective absorption filter according to the embodiment of the present invention to exhibit excellent light resistance, in addition to the achievement of the suppression of the decrease in relative brightness, the excellent function of cutting out blue light, and the excellent correlated color temperature.

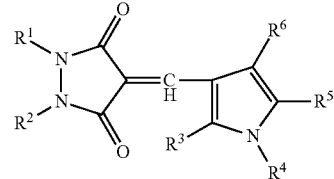

General Formula (A1)

In Formula (A1), $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

The alkyl group that can be employed as $R^1$ and $R^2$ may be any one of an unsubstituted alkyl group or a substituted alkyl group having a substituent, may be linear or branched, and may have a cyclic structure.

Examples of the unsubstituted alkyl group include a methyl group, an ethyl group, a normal propyl group, an isopropyl group, and a cyclohexyl group. The number of carbon atoms in the unsubstituted alkyl group is preferably 1 to 12 and more preferably 1 to 6.

Examples of the substituent that can be employed by the substituted alkyl group include a substituent included in the substituent group A below.

(Substituent Group A)

A halogen atom, an alkyl group, a cycloalkyl group, an aralkyl group, an alkenyl group, an alkynyl group, an aryl group, a heterocyclic group, a cyano group, a hydroxy group, a nitro group, a carboxyl group (may be in the form of a salt), an alkoxy group, an aryloxy group, a silyloxy group, a heterocyclic oxy group, an acyloxy group, a carbamoyloxy group, a sulfonyloxy group, an alkoxycarbonyloxy group, an aryloxycarbonyloxy group, an amino group (containing a substituted amino group represented by —NR$_2^a$ in addition to —NH$_2$. R$^a$ each independently represent a hydrogen atom, an alkyl group, an aryl group, or a heteroaryl group, where at least one R is an alkyl group, an aryl group, or a heteroaryl group), an acylamino group, an aminocarbonylamino group, an alkylcarbonylamino group, an alkoxycarbonylamino group, an aryloxycarbonylamino group, a sulfamoylamino group, an alkylsulfonylamino group, an arylsulfonylamino group, a sulfonamide group, a mercapto group, an alkylthio group, an arylthio group, a heterocyclic thio group, a sulfamoyl group, a sulfo group (may be in the form of a salt), an alkylsulfinyl group, an arylsulfinyl group, an alkylsulfonyl group, an arylsulfonyl group, an acyl group, an aryloxycarbonyl group, an alkoxycarbonyl group, a carbamoyl group, an imide group, a phosphino group, a phosphinyl group, a phosphinyloxy group, a phosphinylamino group, or a silyl group, and a monovalent group in which at least two of these are linked.

In the substituent group A, preferred examples of the substituent that can be contained in the substituted alkyl group include a halogen atom, an aryl group, an alkoxy group, an acyl group, and a hydroxy group.

The total number of carbon atoms in the substituted alkyl group is preferably 1 to 12. Examples thereof include a benzyl group, a hydroxybenzyl group, and a methoxyethyl group.

The total number of carbon atoms in the substituted alkyl group means the number of carbon atoms in the entire substituted alkyl group including the substituent that can be contained in the substituted alkyl group. Hereinafter, this will be used in the same meaning in regard to other groups as well.

In a case where both R$^1$ and R$^2$ represent an alkyl group, the alkyl groups may be the same or different from each other.

The aryl group that can be employed as R$^1$ and R$^2$ may be any one of an unsubstituted aryl group or a substituted aryl group having a substituent.

The unsubstituted aryl group is preferably an aryl group having 6 to 12 carbon atoms, and examples thereof include a phenyl group.

Examples of the substituent that can be employed by the substituted aryl group include a substituent included in the substituent group A below.

Among the substituent group A, preferred examples of the substituent that can be contained in the substituted aryl group include a halogen atom (for example, a chlorine atom, a bromine atom, or an iodine atom), a hydroxy group, a carboxy group, a sulfonamide group, or an amino group, (preferably, a substituted amino group represented by —NR$_2^a$, where R$^a$'s each independently represents a hydrogen atom or an alkyl group, provided that at least one R$^a$ is an alkyl group, and the amino group preferably has 1 to 4 carbon atoms), an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The substituted aryl group is preferably an aryl group having a total number of carbon atoms of 6 to 18.

For example, examples thereof include a 4-chlorophenyl group, a 2,5-dichlorophenyl group, a hydroxyphenyl group, a 4-carboxyphenyl group, a 3,5-dicarboxyphenyl group, a 4-methanesulfonamidephenyl group, a 4-methylphenyl group, a 4-methoxyphenyl group, a 4-(2-hydroxyethoxy) phenyl group, an N,N-dimethylaminophenyl group, a 4-(N-carboxymethyl-N-ethylamino)phenyl group, a 4-ethoxycarbonylphenyl group, and 4-methanesulfonyloxyphenyl group.

In a case where both R$^1$ and R$^2$ represent an aryl group, the aryl groups may be the same or different from each other.

Examples of the substituent that can be employed as R$^3$, R$^4$, R$^5$, and R$^6$ include substituents included in the substituent group A.

Among the substituent group A, R$^3$, R$^5$, and R$^6$ are preferably an alkyl group or an aryl group. That is, R$^3$, R$^5$, and R$^6$ are each independently preferably a hydrogen atom, an alkyl group, or an aryl group.

In addition, in the substituent group A, R$^4$ is preferably an alkyl group or an aryl group. That is, R$^4$ is preferably a hydrogen atom, an alkyl group, or an aryl group.

The alkyl group that can be employed as R$^3$, R$^5$, and R$^6$ may be any of an unsubstituted alkyl group or a substituted alkyl group having a substituent, and any of linear or branched, and may have a cyclic structure.

Examples of the unsubstituted alkyl group that can be employed as R$^3$, R$^5$, and R$^6$ include a methyl group, an ethyl group, a normal propyl group, and an isopropyl group. The number of carbon atoms of the unsubstituted alkyl group that can be employed as R$^3$, R$^5$, and R$^6$ is preferably 1 to 8 and more preferably 1 to 4.

Examples of the substituent that can be contained in the substituted alkyl group as R$^3$, R$^5$, and R$^6$ include substituents included in the substituent group A.

Preferred examples of the substituent that can be contained in the substituted alkyl group as R$^3$, R$^5$, and R$^6$ include an aryl group (preferably a phenyl group), a halogen atom, an acyl group, an amino group, an alkoxycarbonyl group, a carboxy group, and a hydroxy group. The total number of carbon atoms in the substituted alkyl group that can be employed as R$^3$, R$^5$, and R$^6$ is preferably 1 to 8. For example, a benzyl group, a carboxymethyl group, and a hydroxymethyl group are exemplified.

In a case where all of R$^3$, R$^5$, and R$^6$ represent alkyl groups, the alkyl groups may be the same or different from each other.

The aryl group that can be employed as R$^3$, R$^5$, and R$^6$ may be any one of an unsubstituted aryl group or a substituted aryl group which has been substituted.

The unsubstituted aryl group that can be employed as R$^3$, R$^5$, and R$^6$ is preferably an aryl group having 6 to 10 carbon atoms, and examples thereof include a phenyl group.

Examples of the substituent that can be contained in the substituted aryl group as R$^3$, R$^5$, and R$^6$ include substituents included in the substituent group A.

Preferred examples of the substituent that can be contained in the substituted aryl group as R$^3$, R$^5$, and R$^6$ include a halogen atom (for example, a fluorine atom, a chlorine atom, a bromine atom, or an iodine atom), a hydroxy group, a carboxy group, an alkyl group (preferably an alkyl groups having 1 to 4 carbon atoms; for example, methyl, ethyl, normal propyl, or isopropyl).

The substituted aryl group that can be employed as R$^3$, R$^5$, and R$^6$ is preferably an aryl group having a total number of carbon atoms of 6 to 10. Examples thereof include a 2-fluorophenyl group, a 4-chlorophenyl group, a 2,5-dichlorophenyl group, a hydroxyphenyl group, a carboxyphenyl group, a 3,5-dicarboxyphenyl group, and a 4-methylphenyl group.

In a case where both $R^3$ and $R^6$ are a substituent, $R^3$ is preferably a hydrogen atom from the viewpoint of light resistance and heat resistance.

In a case where $R^3$, $R^5$, and $R^6$ are all aryl groups, the aryl groups may be the same or different from each other.

The alkyl group that can be employed as $R^4$ may be any one of an unsubstituted alkyl group or a substituted alkyl group having a substituent, may be linear or branched, and may have a cyclic structure.

Examples of the unsubstituted alkyl group that can be employed as R include a methyl group, an ethyl group, a normal propyl group, an isopropyl group, and a cyclohexyl group. The number of carbon atoms of the unsubstituted alkyl group that can be employed as $R^4$ is preferably 1 to 8 and more preferably 1 to 4.

Examples of the substituent that can be contained in the substituted alkyl group as $R^4$ include substituents included in the substituent group A.

Preferred examples of the substituent that can be contained in the substituted alkyl group as $R^4$ include an aryl group (preferably, a phenyl group), a heterocyclic group, a carboxy group, a hydroxy group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an aryloxy group, an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), an alkylamino group (preferably an alkylamino group having 1 to 4 carbon atoms, for example, a dimethylamino group), an alkylcarbonylamino group (preferably, an alkylcarbonylamino group having 1 to 4 carbon atoms; for example, a methylcarbonylamino group), a cyano group, and an acyl group (for example, an acetyl group, a propionyl group, a benzoyl group, or a mesyl group), as well as a monovalent group in which at least the two thereof are linked to each other.

The total number of carbon atoms in the substituted alkyl group that can be employed as $R^4$ is preferably 1 to 18.

For example, a benzyl group, a carboxybenzyl group, a hydroxybenzyl group, a methoxycarbonylethyl group, an ethoxycarbonylmethyl group, a 2-cyanoethyl group, a 2-propionylaminoethyl group, a dimethylaminomethyl group, a methylcarbonylaminopropyl group, a di(methoxycarbonylmethyl)aminopropyl group, and a phenacyl group are exemplified.

The aryl group that can be employed as $R^4$ may be any one of an unsubstituted aryl group or a substituted aryl group having a substituent.

The unsubstituted aryl group that can be employed as $R^4$ is preferably an aryl group having 6 to 12 carbon atoms, and examples thereof include a phenyl group.

Examples of the substituent that can be contained in the substituted aryl group as $R^4$ include substituents included in the substituent group A.

Preferred examples of the substituent that can be contained in the substituted aryl group as $R^4$ include a halogen atom (for example, a chlorine atom, a bromine atom, or an iodine atom), a hydroxy group, a carboxy group, a sulfonamide group, an amino group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The amino group that can be contained in the substituted aryl group as R may be any one of an unsubstituted amino group ($-NH_2$) or a substituted amino group having a substituent ($-NR_2^a$ in the substituent group A).

In the amino group ($-NR_2^a$) that can be contained in the substituted aryl group as $R^4$, examples of $R^a$ include the same group as the substituted alkyl group as $R^4$.

The substituted amino group is preferably an alkylamino group in which one or two hydrogen atoms in the amino group are substituted with an alkyl group.

Examples of the alkylamino group include a methylamino group, a dimethylamino group, a diethylamino group, and a pyrrolidino group. The number of carbon atoms in the alkylamino group is preferably 1 to 8 and more preferably 1 to 4.

Further, the alkyl group in the alkylamino group may be further substituted, and for example, a di(alkoxycarbonylalkyl)amino group is preferably mentioned. The di(alkoxycarbonylalkyl)amino group preferably has 6 to 10 carbon atoms and more preferably 6 to 8 carbon atoms.

The substituted aryl group that can be employed as $R^4$ is preferably an aryl group having a total number of carbon atoms of 6 to 22. Examples thereof include a 4-chlorophenyl group, a 2,5-dichlorophenyl group, a hydroxyphenyl group, a 2,5-methoxyphenyl group, a 2-methoxy-5-ethoxycarbonylphenyl group, a 4-ethyloxycarbonylphenyl group, a 4-ethoxycarbonylphenyl group, a 4-butoxycarbonylphenyl group, a 4-octyloxycarbonylphenyl group, a 4-carboxyphenyl group, a 3,5-dicarboxyphenyl group, a 4-methanesulfonamidephenyl group, a 4-methylphenyl group, a 4-methoxyphenyl group, a 4-ethoxyphenyl group, a 4-(2-hydroxyethoxy)phenyl group, an N,N-dimethylaminophenyl group, an N,N-diethylaminophenyl group, a 4-(N-carboxymethyl-N-ethylamino)phenyl group, a 4-{N,N-di(ethoxycarbonylmethyl)amino}phenyl group, a 4-{di(ethoxycarbonylmethyl)amino}carbonylphenyl group, a 4-ethoxycarbonylphenyl group, a 4-methanesulfonyloxyphenyl group, a 4-acetylsulfamoylphenyl group, a 4-propionylsulfamoylphenyl group, and a 4-methanesulfoneamidephenyl group.

$R^5$ and $R^6$ may be bonded to each other to form a 6-membered ring. Hydrogen atoms may be eliminated during the formation of the ring to form an aromatic ring or an aliphatic ring having an unsaturated bond.

The 6-membered ring formed by $R^5$ and $R^6$ being bonded to each other is preferably a benzene ring.

In particular, from the viewpoint of light resistance, among $R^1$ and $R^2$ in Formula (A1), it is preferable that $R^1$ is an alkyl group, and it is more preferable that $R^1$ is an alkyl group and $R^2$ is an alkyl group or an aryl group. In addition, from the same viewpoint, it is still more preferable that both $R^1$ and $R^2$ are each independently an alkyl group, and it is particularly preferable that both $R^1$ and $R^2$ are an alkyl group having 1 to 8 carbon atoms.

Further, in terms of heat resistance and light resistance, it is also preferable that both $R^1$ and $R^2$ in Formula (A1) are aryl groups.

In a case where $R^1$ and $R^2$ each independently represent an aryl group, it is preferable that $R^3$, $R^5$, and $R^6$ are each independently a hydrogen atom, an alkyl group, or an aryl group and that at least one of $R^3$ or $R^6$ is preferably a hydrogen atom. Among the above, from the viewpoint of heat resistance and light resistance, a case where $R^1$ represents a hydrogen atom, and $R^5$ and $R^6$ each independently represent an alkyl group or an aryl group is more preferable. A case where $R^3$ represents a hydrogen atom and $R^5$ and $R^6$ each independently represent an alkyl group is still more preferable. A case where $R^3$ represents a hydrogen atom, $R^5$ and $R^6$ each independently represent an alkyl group, and $R^3$ and $R^6$ are bonded to each other to form a ring and fused with a pyrrole ring to form an indole ring together with the pyrrole ring is particularly preferable. That is, the coloring agent represented by General Formula (A1) is particularly preferably a coloring agent represented by General Formula (A2).

General Formula (A2)

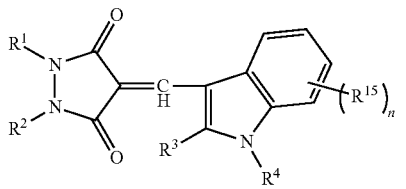

In Formula (A2), $R^1$ to $R^4$ respectively have the same meanings as $R^1$ to $R^4$ in General Formula (A1), and the same applies to the preferred aspects thereof.

In Formula (A2), $R^{15}$ represents a substituent. Examples of the substituent that can be employed as $R^{15}$ include substituents included in the substituent group A. $R^{15}$ is preferably an alkyl group, an aryl group, a halogen atom, an acyl group, an amino group, or an alkoxycarbonyl group.

As the alkyl group and the aryl group, which can be employed as $R^{15}$, the descriptions for the alkyl group and the aryl group, which can be employed as $R^3$, $R^5$, and $R^6$, can be applied respectively.

Examples of the halogen atom that can be employed as $R^{15}$ include a chlorine atom, a bromine atom, and an iodine atom.

Examples of the acyl group that can be employed as $R^{15}$ include an acetyl group, a propionyl group, and a butyroyl group.

As the amino group that can be employed as $R^{15}$, the description for the amino group that can be contained in the substituted aryl group as $R^4$ can be applied. Further, a nitrogen-containing heterocyclic group having a 5-membered to 7-membered ring in which an alkyl group on the nitrogen atom of the amino group is bonded to form a ring is also preferable.

The alkoxycarbonyl group that can be employed as $R^{15}$, is preferably an alkoxycarbonyl group having 2 to 5 carbon atoms, and examples thereof include methoxycarbonyl, ethoxycarbonyl, normal propoxycarbonyl, and isopropoxycarbonyl.

n represents an integer of 0 to 4. n is not particularly limited, and it is, for example, preferably 0 or 1.

Specific examples of the coloring agent represented by General Formula (A1) are shown below. However, the present invention is not limited thereto.

In the specific examples below, Me represents a methyl group.

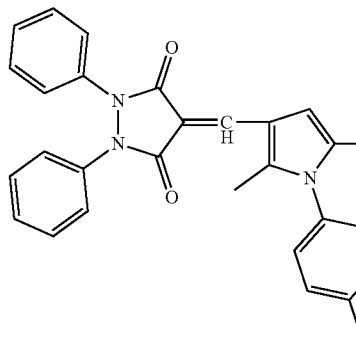

E-1

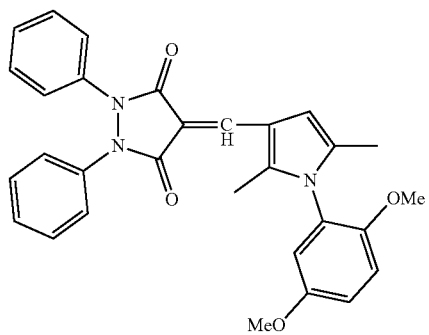

E-2

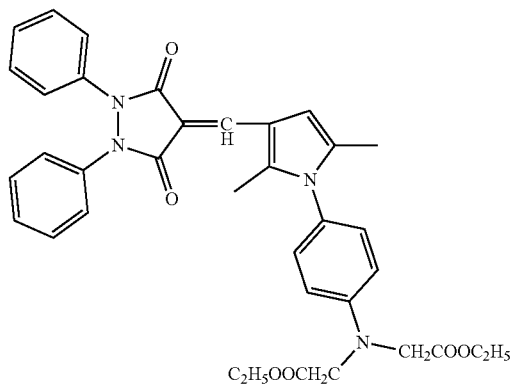

E-3

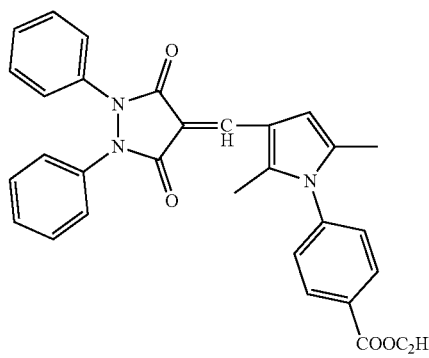

E-4

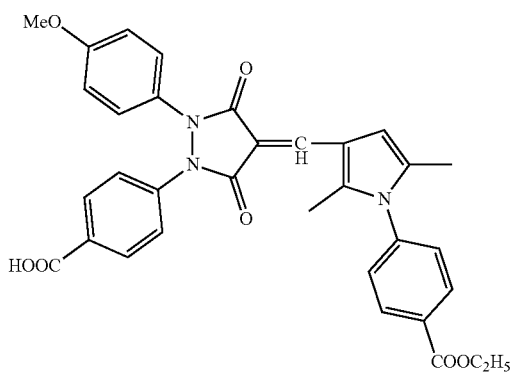
E-5
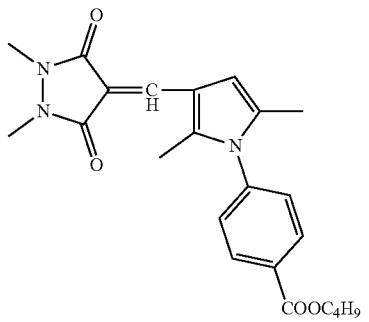
E-9
E-6
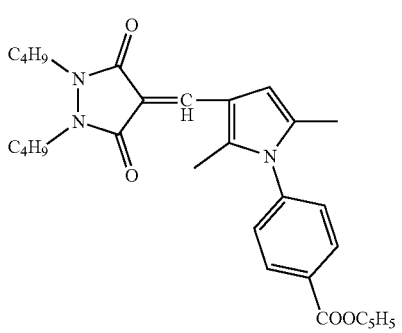
E-10
E-7
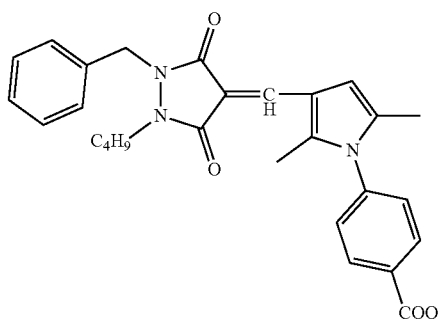
E-11
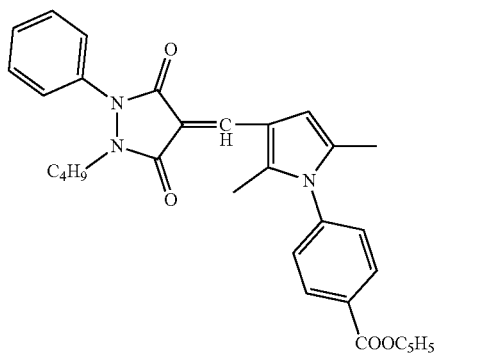
E-8
E-12
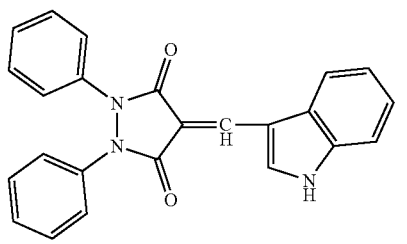
E-13

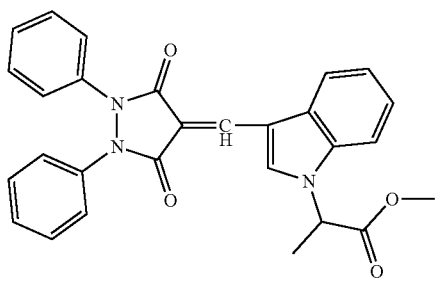
E-14
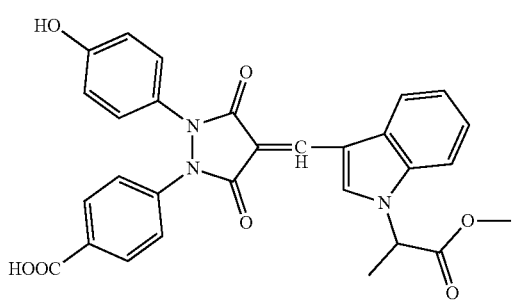
E-15
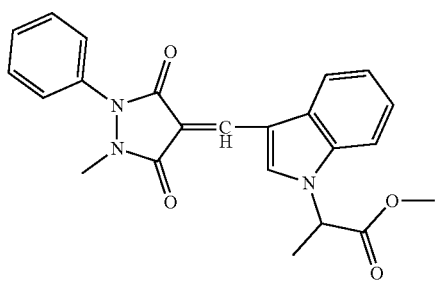
E-16
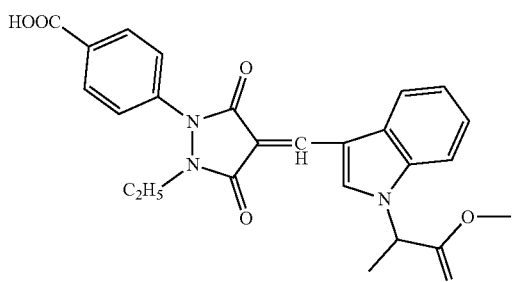
E-17
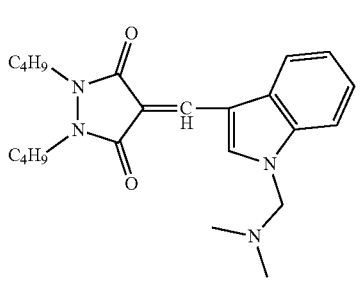
E-18
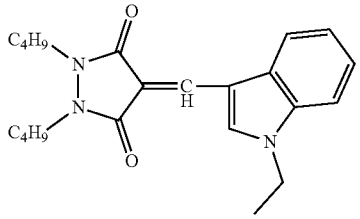
E-19
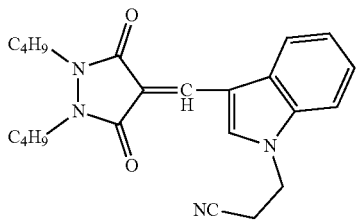
E-20
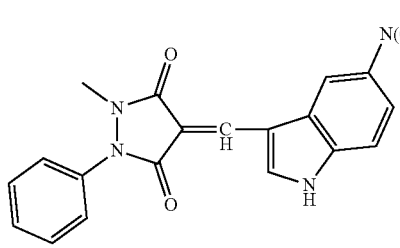
E-21
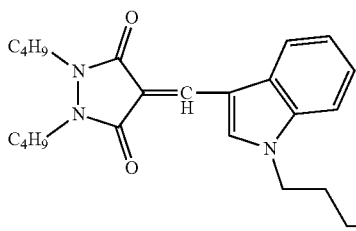
E-22
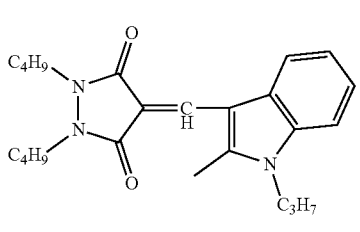
E-23
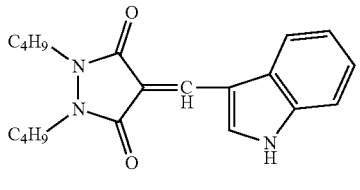
E-24
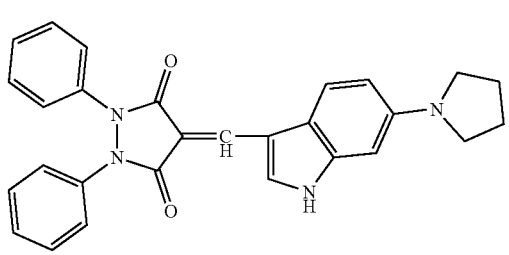
E-25

-continued
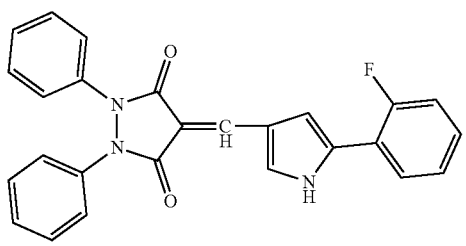
E-26
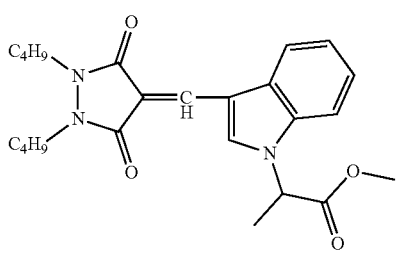
E-27
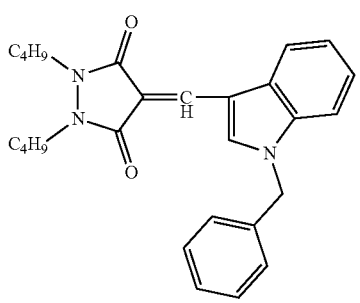
E-28
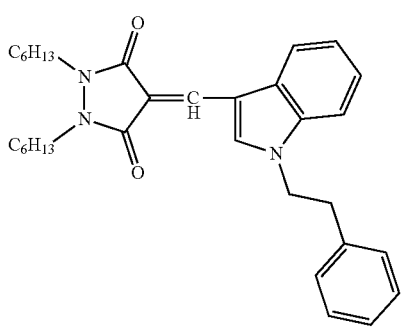
E-29
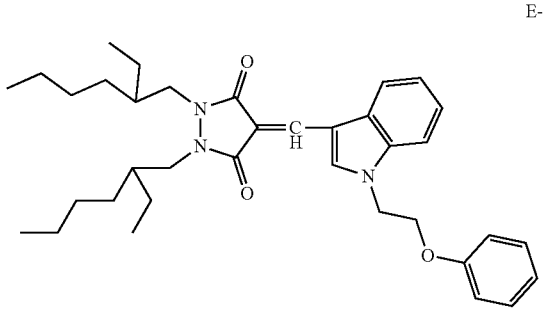
E-30
-continued
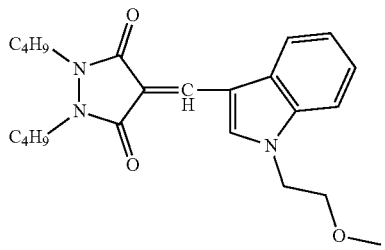
E-31
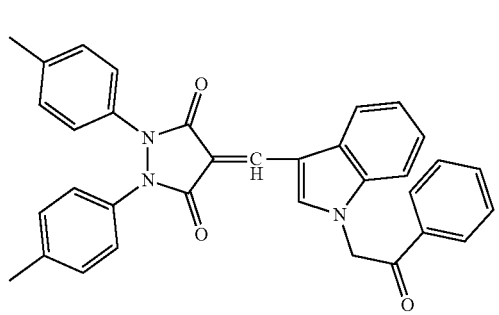
E-32
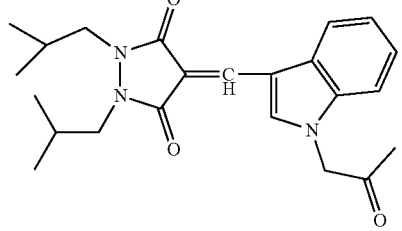
E-33
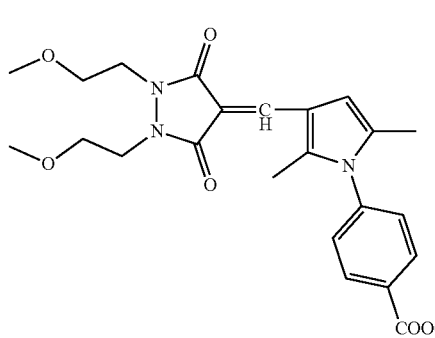
E-34
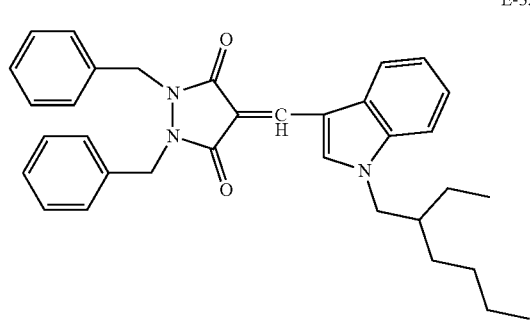
E-35

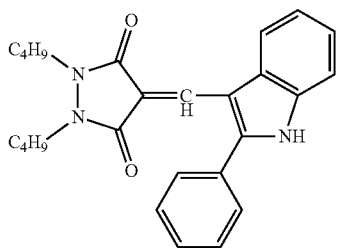

E-36

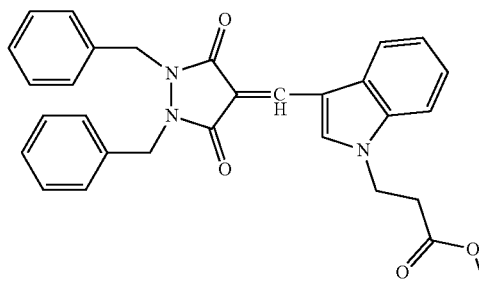

E-37

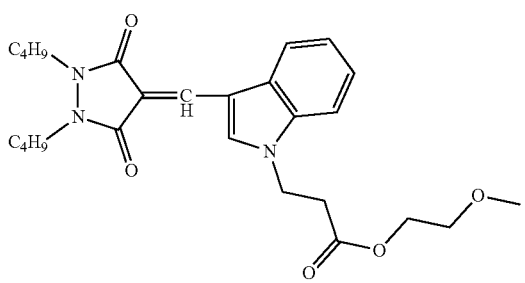

E-38

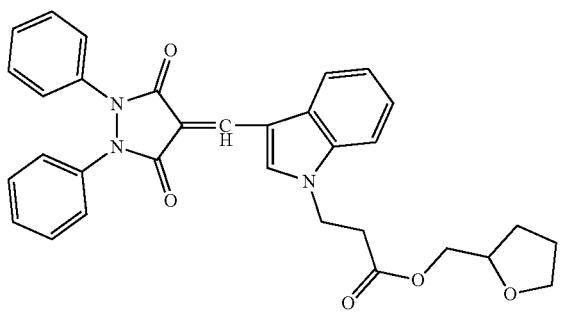

E-39

As the dye A, in addition to the coloring agent represented by General Formula (A1), the compounds described in paragraphs 0012 to 0067 of JP1993-53241 A(JP-H5-53241A) and the compounds described in paragraphs 0011 to 0076 of JP2707371B can also be preferably used.

(Dye D)

The dye D is not particularly limited as long as the dye has the main absorption wavelength band in a wavelength of 640 to 730 nm in the wavelength selective absorption filter, and various dyes can be used.

Specific examples of the dye D include individual coloring agents (dyes) which are based on, for example, pyrrole methine (PM), rhodamine (RH), boron dipyrromethene (BODIPY), squarine (SQ), and cyanine (CY).

It is preferable that the absorption waveform of the dye D in the main absorption wavelength band is sharp from the viewpoint of brightness.

Among these, Lumogen IR788 or IR765 (all, product names) manufactured by BASF SE is preferable as the above-described dye D.

Further, a squarine-based coloring agent represented by General Formula (I) also has a sharp absorption waveform in the main absorption wavelength band, and thus it is preferable as the above-described dye D.

In the present invention, in the coloring agent represented by each General Formula, a cation is present in a delocalized manner, and thus a plurality of tautomer structures are present. Therefore, in the present invention, in a case where at least one tautomer structure of a certain coloring agent matches with each general formula, the certain coloring agent shall be a coloring agent represented by the general formula. Therefore, a coloring agent represented by a specific general formula can also be said to be a coloring agent having at least one tautomer structure that can be represented by the specific general formula. In the present invention, a coloring agent represented by a general formula may have any tautomer structure as long as at least one tautomer structure of the coloring agent matches with the general formula.

(Coloring agent represented by General Formula (I))

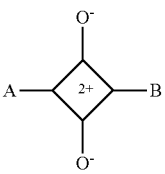

General Formula (1)

In General Formula (I), A and B each independently represent an aryl group which may have a substituent, a heterocyclic group which may have a substituent, or —CH=G. Here, G represents a heterocyclic group which may have a substituent.

The aryl group that can be employed as A or B is not particularly limited and may be a group consisting of a monocyclic ring or a group consisting of a fused ring. The aryl group preferably has 6 to 30 carbon atoms, more preferably 6 to 20 carbon atoms, and still more preferably 6 to 12 carbon atoms. Examples of the aryl group include groups respectively consisting of a benzene ring and a naphthalene ring, and a group consisting of a benzene ring is more preferable.

The heterocyclic group that can be employed as A or B is not particularly limited, and examples thereof include a group consisting of an aliphatic heterocyclic ring or an aromatic heterocyclic ring. A group consisting of an aromatic heterocyclic ring is preferable. Examples of the heteroaryl group that is an aromatic heterocyclic group include a heteroaryl group that can be employed as a substituent X described below. The aromatic heterocyclic group that can be employed as A or B is preferably a group of a 5-membered ring or a 6-membered ring and more preferably a group of a nitrogen-containing 5-membered ring. Specific examples thereof suitably include a group consisting of any one of a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzoxazole ring, or a pyrazolotriazole ring. Among these, a group consisting of any one of a pyrrole ring, a pyrazole ring, a thiazole ring, a pyridine ring, a pyrimidine ring, or a pyrazolotriazole ring is preferable. It suffices that the pyrazolotriazole ring consists of a fused ring of a pyrazole ring and a triazole ring, at least one of each of which is fused to form a fused ring. Examples thereof include a fused ring having a form in which a pyrazole ring and a triazole ring form a fused ring in a form of sharing one nitrogen atom and one carbon atom.

A and B may be bonded to the squaric acid moiety (the 4-membered ring represented by General Formula (I)) at any portion (any ring-constituting atom) without particular limitation: however, they are preferably bonded at a carbon atom.

G in —CH=G that can be employed as A or B represents a heterocyclic group which may have a substituent, and examples thereof suitably include examples shown in the heterocyclic group that can be employed as A or B. Among these, a group consisting of any one of a benzoxazole ring, a benzothiazole ring, an indoline ring, or the like is preferable.

At least one of A or B may have a hydrogen bonding group that forms an intramolecular hydrogen bond.

Each of A, B, and G may have the substituent X, and, in a case where A, B. or G has the substituent X, adjacent substituents may be bonded to each other to further form a ring structure. In addition, a plurality of substituents X may be present.

Examples of the substituent X include the following groups:
- an alkyl group (it preferably has 1 to 20 carbon atoms, more preferably 1 to 15 carbon atoms, and still more preferably 1 to 8 carbon atoms; for example, methyl, ethyl, propyl, isopropyl, butyl, t-butyl, isobutyl, pentyl, hexyl, octyl, dodecyl, trifluoromethyl, cyclopentyl, or cyclohexyl);
- an alkenyl group (it preferably has 2 to 20 carbon atoms, more preferably 2 to 12 carbon atoms, and still more preferably 2 to 8 carbon atoms; for example, vinyl, or allyl);
- an alkynyl group (it preferably has 2 to 40 carbon atoms, more preferably 2 to 30 carbon atoms, and particularly preferably 2 to 25 carbon atoms; for example, ethynyl or propargyl);
- an aryl group (it preferably has 6 to 30 carbon atoms, more preferably 6 to 20 carbon atoms, and still more preferably 6 to 12 carbon atoms; for example, phenyl or naphthyl);
- a heterocyclic group (it includes an aromatic heterocyclic group and an aliphatic heterocyclic group; it includes a group consisting of a monocyclic ring or a fused ring, and it is preferably a monocyclic group or a group consisting of a fused ring having 2 to 8 rings, and more preferably a group consisting of a monocyclic ring or a fused ring having 2 to 4 rings; the number of heteroatoms constituting the ring is preferably 1 to 3, and examples of the heteroatom constituting the ring include a nitrogen atom, an oxygen atom, and a sulfur atom, where the ring is preferably a group consisting of a 5-membered ring or a 6-membered ring; the number of carbon atoms constituting the ring in the heteroaryl group is preferably 3 to 30, more preferably 3 to 18, and still more preferably 3 to 12; for example, furyl, thienyl, pyridyl, pyridazyl, pyrimidyl, pyrazil, triazil, imidazolyl, pyrazolyl, thiazolyl, benzimidazolyl, benzoxazolyl, quinazolyl, phthalazyl, pyrrolidyl, imidazolidyl, morpholyl, or oxazolidyl);
- an aralkyl group (an alkyl portion in the aralkyl group is the same as the alkyl group described above; an aryl portion in the aralkyl group is the same as the aryl group described above; and the aralkyl group preferably has 7 to 40 carbon atoms, more preferably 7 to 30 carbon atoms, and still more preferably 7 to 25 carbon atoms);
- a ferrocenyl group;
- —$OR^{10}$ (examples thereof include a hydroxy group, an alkoxy group (methoxy, ethoxy, propyloxy, or the like), a cycloalkoxy group (cyclopentyloxy, cyclohexyloxy, or the like), an aryloxy group (phenoxy, naphthyloxy, or the like), and a heteroaryloxy group (an aromatic heterocyclic oxy group));
- —$C(=O)R^{11}$ (examples thereof include acyl groups such as acetyl, ethylcarbonyl, propylcarbonyl, cyclohexylcarbonyl, octylcarbonyl, 2-ethylhexylcarbonyl, phenylcarbonyl, naphthylcarbonyl, and pyridylcarbonyl);
- —$C(=O)OR^{12}$ (examples thereof include a carboxy group, an alkoxycarbonyl group (methyloxycarbonyl, ethyloxycarbonyl, butyloxycarbonyl, octyloxycarbonyl, or the like), and an aryloxycarbonyl group (phenyloxycarbonyl, naphthyloxycarbonyl, or the like);
- —$OC(=O)R^{13}$ (examples thereof include acyloxy groups such as acetyloxy, ethylcarbonyloxy, butylcarbonyloxy, and octylcarbonyloxy, phenylcarbonyloxy);
- —$NR^{14}R^{15}$ (examples thereof include amino groups such as amino (—$NH_2$), ethylamino, dimethylamino, butylamino, dibutylamino, cyclopentylamino, 2-ethylhexylamino, dodecylamino, anilino, naphthylamino, and 2-pyridylamino);
- —$NHCOR^{16}$ (examples thereof include amid groups such as methylcarbonylamino, ethylcarbonylamino, dimethylcarbonylamino, propylcarbonylanino, pentylcarbonylamino, cyclohexylcarbonylamino, 2-ethylhexylcarbonylamino, octylcarbonylamino, dodecylcarbonylamino, and phenylcarbonylamino, naphthylcarbonylamino);
- —$CONR^{17}R^{18}$ (examples thereof include carbamoyl groups such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, and naphthylaminocarbonyl, 2-pyridylaminocarbonyl);
- —$NHCONR^{19}R^{20}$ (examples thereof include ureido groups such as methylureido, ethylureido, pentylureido, cyclohexylureido, octylureido, dodecylureido, phenylureido, naphthylureido, and 2-pyridyl amino ureido);
- —$NHCOOR^{21}$;
- —$SR^{22}$ (examples thereof include an alkylthio group (methylthio, ethylthio, propylthio, or the like), a cycloalkylthio group (cyclopentylthio, cyclohexylthio, or the like), an arylthio group (phenylthio, naphthylthio, or the like), and a heteroarylthio group (an aromatic heterocyclic thio group));
- —$SO_2R^{23}$ (examples thereof include an alkylsulfonyl group (methylsulfonyl, ethylsulfonyl, butylsulfonyl, cyclohexylsulfonyl, 2-ethylhexylsulfonyl, or the like), and arylsulfonyl (phenylsulfonyl, naphthylsulfonyl, 2-pyridylsulfonyl, or the like));
- —$OSO_2R^{24}$ (examples thereof include an alkylsulfonyloxy group such as methanesulfonyloxy);
- —$NHSO_2R^{25}$ (examples thereof include sulfonylamide groups such as methylsulfonylamino, octylsulfonylamino, 2-ethylhexylsulfonylamino, and trifluoromethylsulfonylamino);

—SO$_2$NR$^{26}$R$^{17}$ (examples thereof include sulfamoyl groups such as aminosulfonyl, methylaminosulfonyl, dimethylaminosulfonyl, butylaminosulfonyl, cyclohexylaminosulfonyl, octylaminosulfonyl, phenylaminosulfonyl, and 2-pyridylaminosulfonyl);

—P(=O)(OR$^{28}$)$_2$ (examples thereof include phosphoryl groups such as dimethoxyphosphoryl and diphenylphosphoryl);

a halogen atom (a fluorine atom, a chlorine atom, a bromine atom, or an iodine atom);

a cyano group; and a nitro group.

Further, it is also preferable that the substituent X has a quencher moiety described later, in addition to the ferrocenyl group.

It is noted that R$^{10}$ to R$^{28}$ each independently represent a hydrogen atom, an aliphatic group, an aromatic group, or a heterocyclic group. The aliphatic group and the aromatic group, which can be employed as R$^{10}$ to R$^{28}$, are not particularly limited, and they can be appropriately selected from an alkyl group, an alkenyl group, and an alkynyl group, which are classified as the aliphatic group, and an aryl group which is classified as the aromatic group, in the substituent that can be employed as the substituent X. The heterocyclic group that can be employed as R$^{10}$ to R$^{28}$ may be aliphatic or aromatic, and it can be appropriately selected from, for example, the heterocyclic groups (the aromatic heterocyclic group and the aliphatic heterocyclic group) which can be employed as the substituent X.

Each of the alkyl group, the alkenyl group, and the alkynyl group, which can be employed as the substituent X, may be linear, branched, or cyclic, and it is preferably linear or branched.

It is noted that in a case where R$^{12}$ of —COOR$^{12}$ is a hydrogen atom (that is, a carboxy group), the hydrogen atom may be dissociated (that is, a carbonate group) or may be in a salt state. In addition, in a case where R$^{24}$ of —SO$_3$R$^{24}$ is a hydrogen atom (that is, a sulfo group), the hydrogen atom may be dissociated (that is, a sulfonate group) or may be in a salt state.

The substituent that can be employed as the substituent X may further have a substituent. Examples of the substituent which may be further contained include the substituent X.

Further, adjacent substituents may be bonded to each other to form a ring. The ring to be formed is preferably an aliphatic heterocyclic ring or a heteroaryl ring, and it is preferably a 5-membered ring or a 6-membered ring although the size of the ring to be formed is not particularly limited. Further, the number of rings to be formed is not particularly limited, and it may be one or two or more.

The ferrocenyl group that can be employed as the substituent X is preferably represented by General Formula (2M).

General Formula (2M)

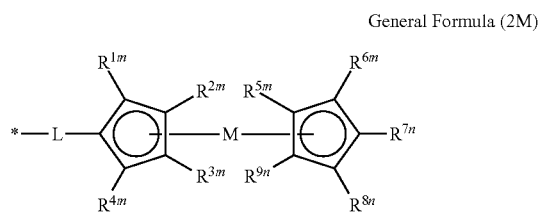

In General Formula (2M), L represents a single bond or a divalent linking group that does not conjugate with A, B, or G in General Formula (I). R$^{1m}$ to R$^{9m}$ each independently represent a hydrogen atom or a substituent. M represents an atom that can constitute a metallocene compound and represents Fe, Co, Ni, Ti, Cu, Zn, Zr, Cr, Mo, Os, Mn, Ru, Sn, Pd, Rh, V, or Pt. * represents a bonding site to A, B, or G.

In the present invention, in a case where L in General Formula (2M) is a single bond, a cyclopentadienyl ring directly bonded to A, B, or G (a ring having R$^{1m}$ in General Formula (2M)) is not included in the conjugated structure which conjugates with A, B. or G.

The divalent linking group that can be employed as L is not particularly limited as long as it is a linking group that does not conjugate with A, B, or G. and it may have a conjugated structure in the inside thereof or at a cyclopentadiene ring side end part in General Formula (2M). Examples of the divalent linking group include an alkylene group having 1 to 20 carbon atoms, an arylene group having 6 to 20 carbon atoms, a divalent heterocyclic group obtained by removing two hydrogens from the heterocyclic ring, —CH=CH—, —CO—, —CS—, —NR— (R represents a hydrogen atom or a monovalent substituent), —O—, —S—, —SO$_2$—, or —N=CH—, or a divalent linking group formed by combining a plurality (preferably, 2 to 6) of these groups. The divalent linking group is preferably a group selected from the group consisting of an alkylene group having 1 to 8 carbon atoms, an arylene group having 6 to 12 carbon atoms, —CH=CH—, —CO—, —NR— (R is as described above), —O—, —S—, —SO$_2$—, and —N=CH—, or a divalent linking group in which two or more (preferably 2 to 6) selected from the above group are combined, and it is particularly preferably a group selected from the group consisting of an alkylene group having 1 to 4 carbon atoms, a phenylene group, —CO—, —NH—, —O—, and —SO$_2$—, or a linking group in which two or more (preferably 2 to 6) selected from the above group are combined. The divalent linking group combined is not particularly limited, and it is preferably a group containing —CO—, —NH—, —O—, or —SO$_2$—, and examples thereof include a linking group formed by combining two or more of —CO—, —NH—, —O—, or —SO$_2$—, or a linking group obtained by combining at least one of —CO—, —NH—, —O—, or —SO$_2$— and an alkylene group or an arylene group. Examples of the linking group formed by combining two or more of —CO—, —NH—, —O—, or —SO$_2$— include —COO—, —OCO—, —CONH—, —NHCOO—, —NHCONH—, and —SO$_2$NH—. Examples of the linking group formed by combining at least one of —CO—, —NH—, —O—, or —SO$_2$— and an alkylene group or an arylene group include a group in which —CO—, —COO—, or —CONH— and an alkylene group or an arylene group are combined.

The substituent that can be employed as R is not particularly limited and has the same meaning as the substituent X.

L is preferably a single bond or a group selected from the group consisting of an alkylene group having 1 to 8 carbon atoms, an arylene group having 6 to 12 carbon atoms, —CH=CH—, —CO—, —NR— (R is as described above), —O—, —S—, —SO$_2$—, and —N=CH—, or a group in which two or more selected from the above group are combined.

L may have one or a plurality of substituents. The substituent which may be contained in L is not particularly limited, and for example, it has the same meaning as the substituent X. In a case where L has a plurality of substituents, the substituents bonded to adjacent atoms may be bonded to each other to further form a ring structure.

The alkylene group that can be employed as L may be linear, branched, or cyclic as long as the group has 1 to 20 carbon atoms, and examples thereof include methylene, ethylene, propylene, methylethylene, methylmethylene, dimethylmethylene, 1,1-dimethylethylene, butylene, 1-methylpropylene, 2-methylpropylene, 1,2-dimethylpropylene, 1,3-dimethylpropylene, 1-methylbutylene, 2-methylbutylene, 3-methylbutylene, 4-methylbutylene, 2,4-dimethylbutylene, 1,3-dimethylbutylene, pentylene, hexylene, heptylene, octylene, ethane-1,1-diyl, propane-2,2-diyl, cyclopropane-1,1-diyl, cyclopropane-1,2-diyl, cyclobutane- 1,1-diyl, cyclobutane-1,2-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, cyclohexane-1,4-diyl, and methylcyclohexane-1,4-diyl.

In a case where a linking group containing at least one of —CO—, —CS—, —NR— (R is as described above), —O—, —S—, —SO$_2$—, or —N=CH— in the alkylene group is employed as L, the group such as —CO— may be incorporated at any site in the alkylene group, and the number of the groups incorporated is not particularly limited.

The arylene group that can be employed as L is not particularly limited as long as the group has 6 to 20 carbon atoms, and examples thereof include a group obtained by further removing one hydrogen atom from each group exemplified as the aryl group having 6 to 20 carbon atoms that can be employed as A in General Formula (I).

The heterocyclic group that can be employed as L is not particularly limited, and examples thereof include a group obtained by further removing one hydrogen atom from each group exemplified as the heterocyclic group that can be employed as A.

In General Formula (2M), the remaining partial structure excluding the linking group L corresponds to a structure (a metallocene structure portion) in which one hydrogen atom is removed from the metallocene compound. In the present invention, for the metallocene compound serving as the metallocene structure portion, a known metallocene compound can be used without particular limitation, as long as it is a compound conforming to the partial structure defined by General Formula (2M) (a compound in which a hydrogen atom is bonded instead of L). Hereinafter, the metallocene structure portion defined by General Formula (2M) will be specifically described.

In General Formula (2M), $R^{1m}$ to $R^{9m}$ each independently represent a hydrogen atom or a substituent. The substituents that can be employed as $R^{1m}$ to $R^{9m}$ are not particularly limited, and they can be selected from, for example, the substituents that can be employed as the substituent X. $R^{1m}$ to $R^{9m}$ each are preferably a hydrogen atom, a halogen atom, an alkyl group, an acyl group, an alkoxy group, an amino group, or an amide group, more preferably a hydrogen atom, a halogen atom, an alkyl group, an acyl group, or an alkoxy group, still more preferably a hydrogen atom, a halogen atom, an alkyl group, or an acyl group, particularly preferably a hydrogen atom, a halogen atom, or an alkyl group, and most preferably a hydrogen atom.

Among the alkyl groups that can be employed as the substituent X, the alkyl group that can be employed as $R^{1m}$ to $R^{9m}$ is preferably an alkyl group having 1 to 8 carbon atoms, and examples thereof include methyl, ethyl, propyl, isopropyl, butyl, sec-butyl, tert-butyl, isobutyl, pentyl, tert-pentyl, hexyl, octyl, and 2-ethylhexyl.

This alkyl group may have a halogen atom as a substituent. Examples of the alkyl group substituted with a halogen atom include, for example, chloromethyl, dichloromethyl, trichloromethyl, bromomethyl, dibromomethyl, tribromomethyl, fluoromethyl, difluoromethyl, trifluoromethyl, 2,2,2-trifluoroethyl, perfluoroethyl, perfluoropropyl, perfluorobutyl.

In addition, in the alkyl group that can be employed as $R^{1m}$ or the like, at least one methylene group that forms a carbon chain may be substituted with —O— or —CO—. Examples of the alkyl group in which the methylene group is substituted with —O— include, for example, an alkyl group in which the end part methylene group of methoxy, ethoxy, propoxy, isopropoxy, isobutoxy, sec-butoxy, tert-butoxy, 2-methoxyethoxy, chloromethyloxy, dichloromethyloxy, trichloromethyloxy, bromomethyloxy, dibromomethyloxy, tribromomethyloxy, fluoromethyloxy, difluoromethyloxy, trifluoromethyloxy, 2,2,2-trifluoroethyloxy, perfluoroethyloxy, perfluoropropyloxy, or perfluorobutyloxy is substituted, and an alkyl group in which an internal methylene group of the carbon chain such as 2-methoxyethyl or the like is substituted. Examples of the alkyl group in which a methylene group is substituted with —CO— include, for example, acetyl, propionyl, monochloroacetyl, dichloroacetyl, trichloroacetyl, trifluoroacetyl, propane-2-one-1-yl, butane-2-one-1-yl.

In General Formula (2M), M represents an atom that can constitute a metallocene compound, and represents Fe, Co, Ni, Ti, Cu, Zn, Zr, Cr. Mo, Os, Mn, Ru, Sn, Pd, Rh, V, or Pt. Among these. M is preferably Fe, Ti, Co, Ni, Zr, Ru, or Os, more preferably Fe, Ti, Ni, Ru, or Os, still more preferably Fe or Ti, and most preferably Fe.

The group represented by General Formula (2M) is preferably a group formed by combining preferred ones of L, $R^{1m}$ to $R^{9m}$, and M. Examples thereof include a group formed by combining, as L, a single bond, or a group selected from the group consisting of an alkylene group having 2 to 8 carbon atoms, an arylene group having 6 to 12 carbon atoms, —CH=CH—, —CO—, —NR— (R is as described above), —O—, —S—, —SO$_2$—, and —N=CH—, or a group in which two or more selected from the above group are combined; as $R^{1m}$ to $R^{9m}$, a hydrogen atom, a halogen atom, an alkyl group, an acyl group, or an alkoxy group; and as M, Fe.

The alkyl group, the alkenyl group, the alkynyl group, the aralkyl group, the aryl group, and the heteroaryl group which can be employed as the substituent X and the aliphatic group, the aromatic group, and the heterocyclic group which can be employed as $R^{10}$ to $R^{28}$ each may further have a substituent or may be unsubstituted. The substituent which may be further contained therein is not particularly limited, and it is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, an alkylthio group, an arylthio group, an aromatic heterocyclic thio group, a sulfonyl group, a ferrocenyl group, a hydroxy group, a mercapto group, a halogen atom, a cyano group, a sulfo group, or a carboxy group, and it is more preferably a substituent selected from an alkyl group, an aryl group, an alkoxy group, an aryloxy group, an aromatic heterocyclic oxy group, an acyl group, an alkoxycarbonyl group, an aryloxycarbonyl group, an acyloxy group, an alkylthio group, an arylthio group, an aromatic heterocyclic thio group, a sulfonyl group, a ferrocenyl group, a hydroxy group, a mercapto group, a halogen atom, a cyano group, a sulfo group, or a carboxy group. These groups can be appropriately selected from the substituents that can be employed as the substituent X.

In a case where the dye D is a coloring agent represented by General Formula (I), a coloring agent represented by General Formula (14) is preferable.

General Formula (14)

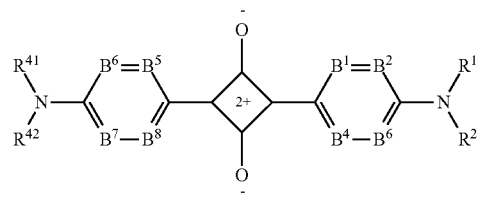

In General Formula (14), $R^1$ and $R^2$ each independently represent a hydrogen atom or a substituent. $R^1$ and $R^2$ may be the same or different from each other, and they may be bonded together to form a ring.

The substituent that can be employed as $R^1$ and $R^2$ is not particularly limited. However, examples thereof include, in the substituent X, an alkyl group (including a cycloalkyl group), an alkenyl group, an alkynyl group, an aryl group, a heterocyclic group (including an aromatic heterocyclic group and an aliphatic heterocyclic group), an alkoxy group, a cycloalkoxy group, an aryloxy group, a heteroaryloxy group, an alkylthio group, a cycloalkylthio group, an arylthio group, a heteroarylthio group, an alkoxycarbonyl group, an aryloxycarbonyl group, a phosphoryl group, a sulfamoyl group, an acyl group, an acyloxy group, an amide group, a sulfonylamide group, a carbamoyl group, a ureido group, an alkylsulfonyl group, an arylsulfonyl group, an amino group, an alkylsulfonyloxy group, a cyano group, a nitro group, a halogen atom, and a hydroxy group.

In addition, $R^{41}$ and $R^{42}$ have the same meaning as the above $R^1$ and $R^2$, respectively.

$R^1$, $R^2$, $R^{41}$, and $R^{42}$ may further have a substituent. Examples of the substituent which may be further contained include the substituent X.

Among the above. $R^1$, $R^2$, $R^1$, and $R^{42}$ are preferably an alkyl group, an alkenyl group, an aryl group, or a heteroaryl group, more preferably an alkyl group, an aryl group, or a heteroaryl group, and still more preferably an alkyl group or an aryl group is.

In General Formula (14), $B^1$, $B^2$, $B^3$, and $B^4$ each independently represent a carbon atom or a nitrogen atom. The ring including $B^1$, $B^2$, $B^3$, and $B^4$ is an aromatic ring. It is preferable that at least two or more of $B^1$ to $B^4$ are a carbon atom, and it is more preferable that all of $B^1$ to $B^4$ are a carbon atom.

The carbon atom that can be employed as $B^1$ to $B^4$ has a hydrogen atom or a substituent. Among carbon atoms that can be employed as $B^1$ to $B^4$, the number of carbon atoms having a substituent is not particularly limited; however, it is preferably zero, one, or two, and more preferably one. Particularly, it is preferable that $B^1$ and $B^4$ are a carbon atom and at least one of them has a substituent.

The substituent possessed by the carbon atom that can be employed as $B^1$ to $B^4$ is not particularly limited, and examples thereof include the above-described substituents that can be employed as $R^1$ and $R^2$. Among these, it is preferably an alkyl group, an alkoxy group, an alkoxycarbonyl group, an aryl group, an acyl group, an amide group, a sulfonylamide group, a carbamoyl group, an alkylsulfonyl group, an arylsulfonyl group, an amino group, a cyano group, a nitro group, a halogen atom, or a hydroxy group, and it is more preferably an alkyl group, an alkoxy group, an alkoxycarbonyl group, an aryl group, an acyl group, an amide group, a sulfonylamide group, a carbamoyl group, an amino group, a cyano group, a nitro group, a halogen atom, or a hydroxy group.

Further, $B^5$, $B^6$, $B^7$, and $B^8$ have the same meaning as the above $B^1$, $B^2$, $B^3$, and $B^4$, respectively.

The substituent possessed by the carbon atom that can be employed as $B^1$ to $B^8$ may further have a substituent. Examples of the substituent which may be further contained include the substituent X.

Examples of the substituent that can be possessed by the carbon atom that can be employed as $B^1$, $B^4$, $B^5$, and $B^8$ still more preferably include an alkyl group, an alkoxy group, a hydroxy group, an amide group, a sulfonylamide group, or a carbamoyl group, and particularly preferably an alkyl group, an alkoxy group, a hydroxy group, an amide group, or a sulfonylamide group, where a hydroxy group, an amide group, or a sulfonylamide group is most preferable.

It is still more preferable that the substituent that can be possessed by the carbon atom that can be employed as $B^2$, $B^3$, $B^6$, and $B^7$ is an alkyl group, an alkoxy group, an alkoxycarbonyl group, an acyl group, an amino group, a cyano group, a nitro group, or a halogen atom, and it is particularly preferable that the substituent of any one of them is an electron withdrawing group (for example, an alkoxycarbonyl group, an acyl group, a cyano group, a nitro group, or a halogen atom).

In General Formula (14), $R^1$ and $R^2$ may be bonded to each other to form a ring, and $R^1$ or $R^2$ and the substituent contained in $B^2$ or $B^3$ may be bonded to each other to form a ring. In addition, $R^{41}$ and $R^{42}$ may be bonded to each other to form a ring, and $R^{41}$ or $R^{42}$ and the substituent contained in $B^6$ or $B^7$ may be bonded to each other to form a ring.

In the above description, the ring to be formed is preferably a heterocyclic ring or a heteroaryl ring, and it is preferably a 5-membered ring or a 6-membered ring although the size of the ring to be formed is not particularly limited. Further, the number of rings to be formed is not particularly limited, and it may be one or two or more. Examples of the form in which two or more rings are formed include a form in which the substituents of $R^1$ and $B^2$ and the substituents of $R^2$ and $B^3$ are respectively bonded to each other to form two rings.

Specific examples of the dye D are shown below. The following compounds F-1 to F-33 are coloring agents represented by General Formula (1).

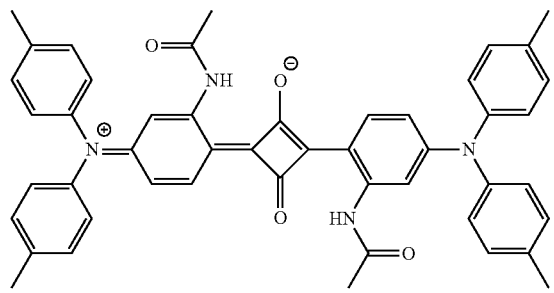

F-1

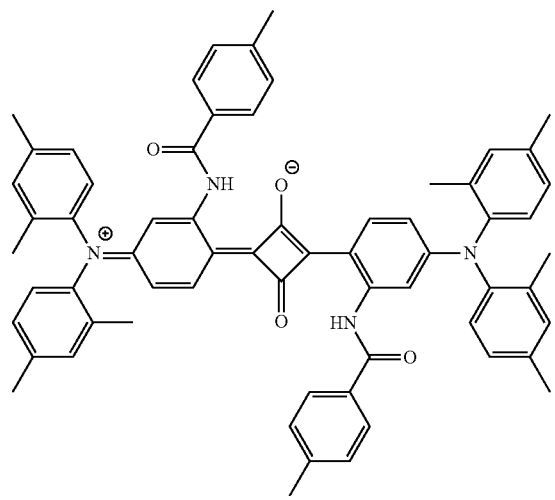

F-2

-continued
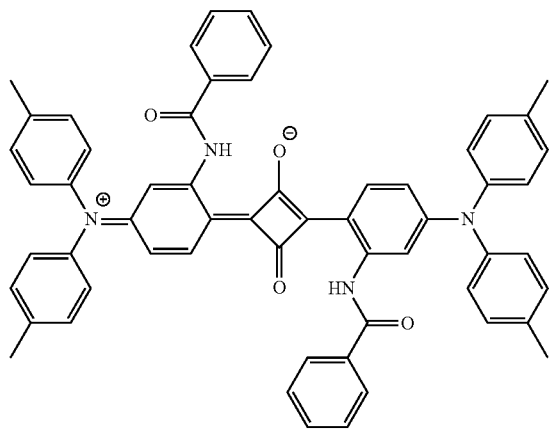
F-3
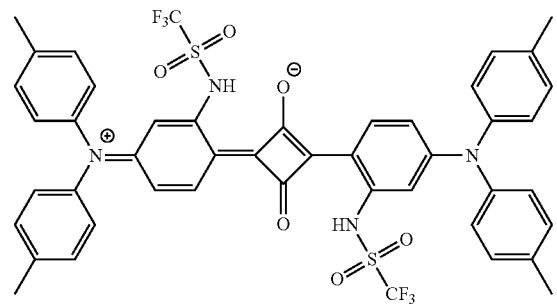
F-4
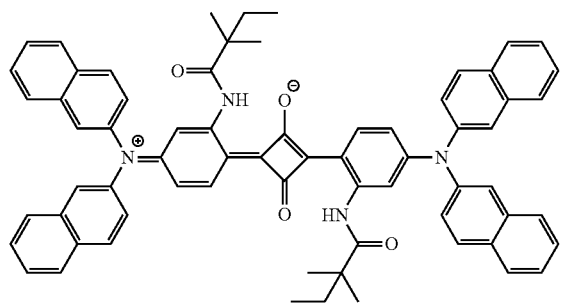
F-5
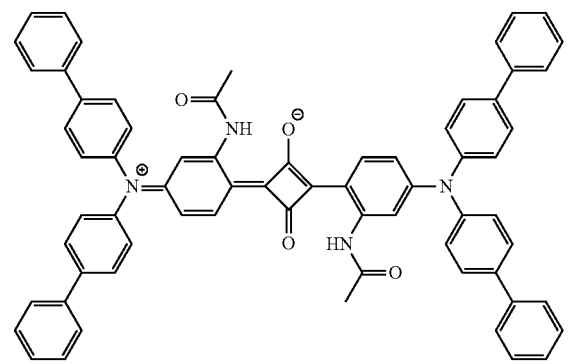
F-6
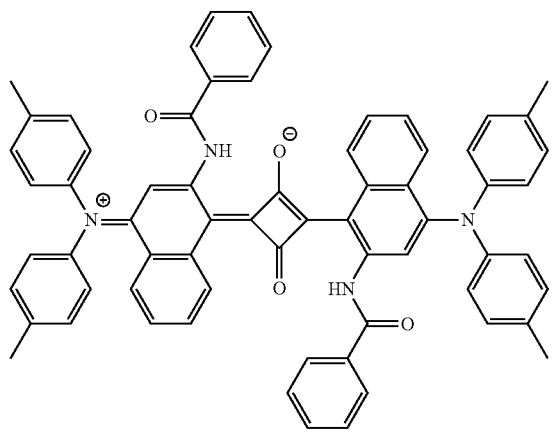
F-7
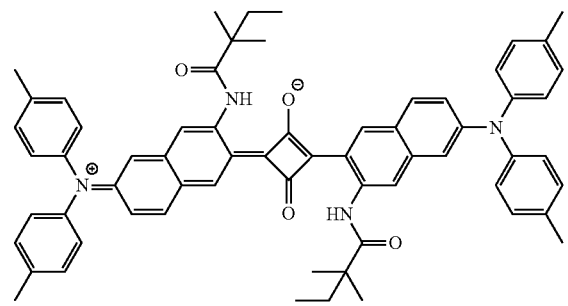
F-8
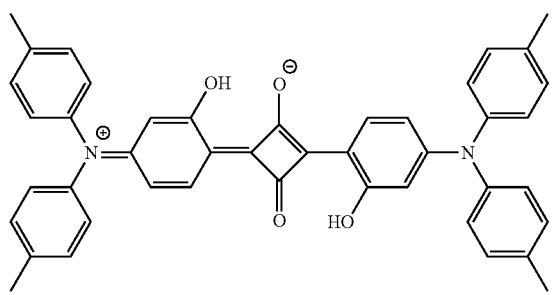
F-9
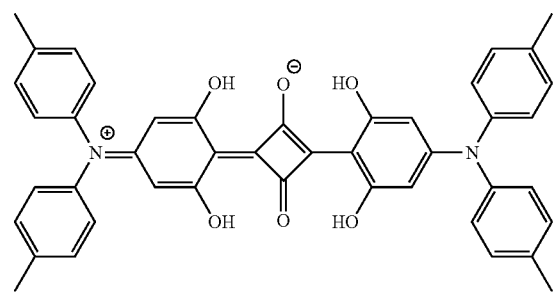
F-10

-continued
F-11
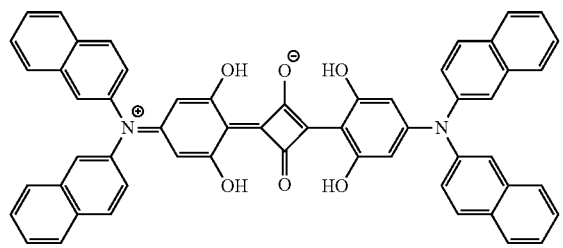
F-12
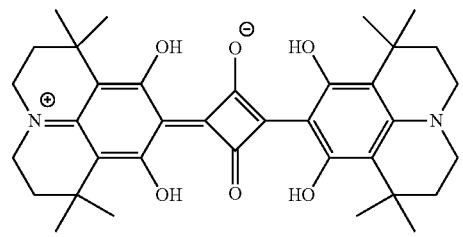
F-13
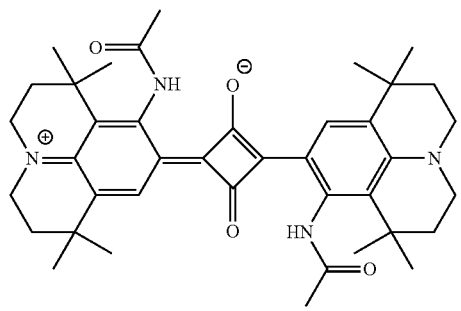
F-14
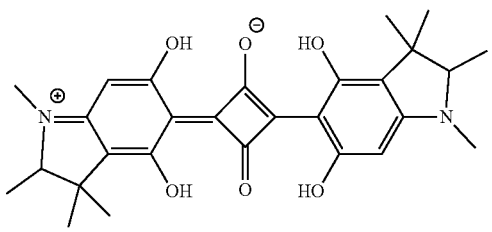
F-15
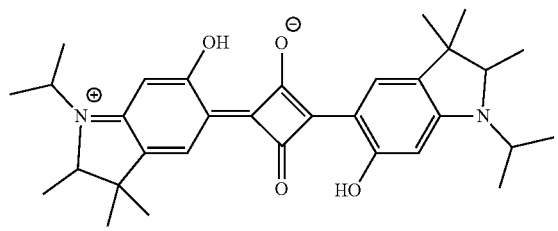
F-16
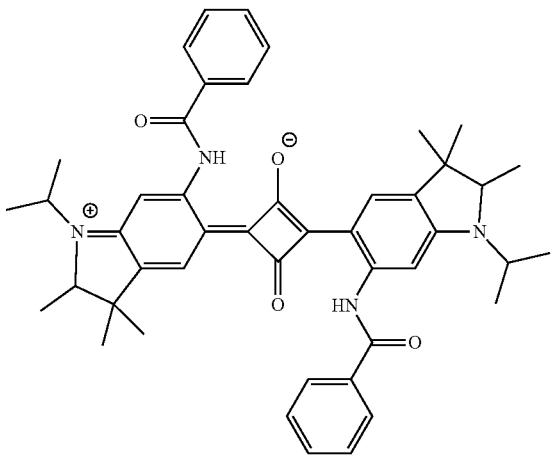
F-17
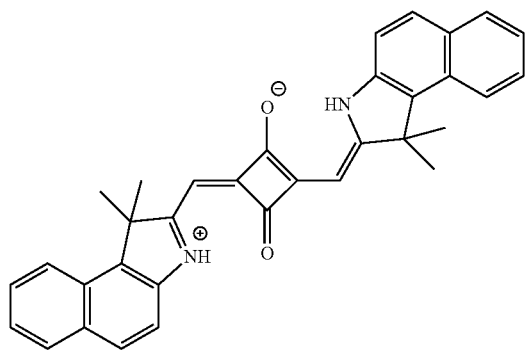
F-18
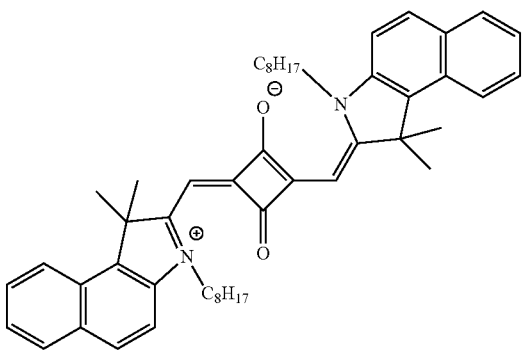

-continued
F-19
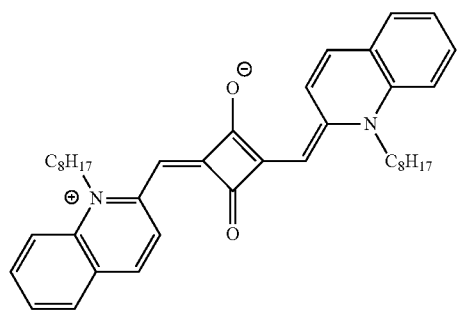
F-20
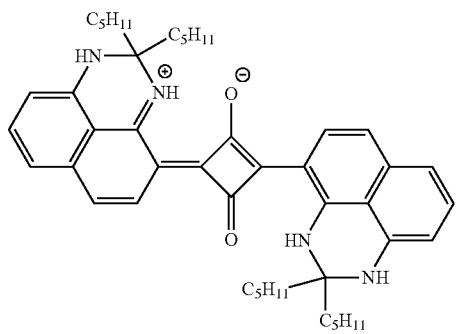
F-21
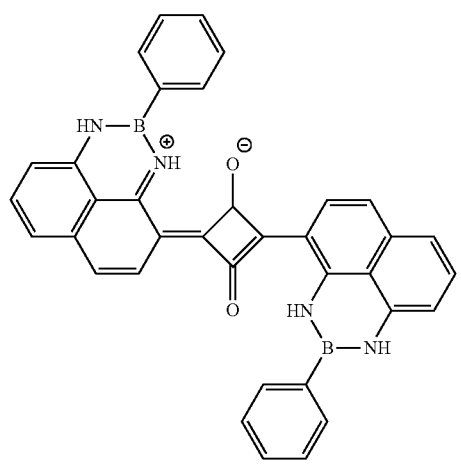
F-22
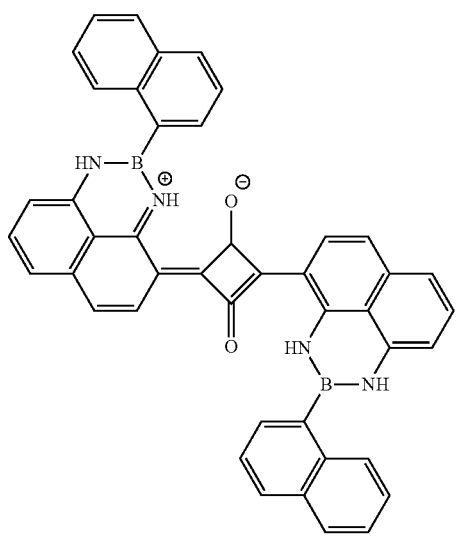
F-23
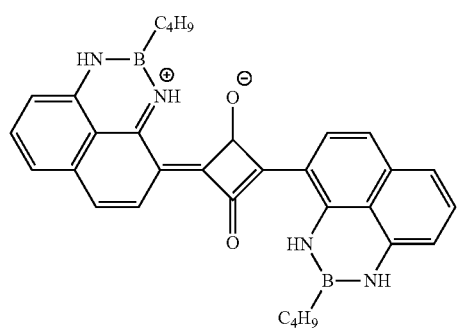
F-24
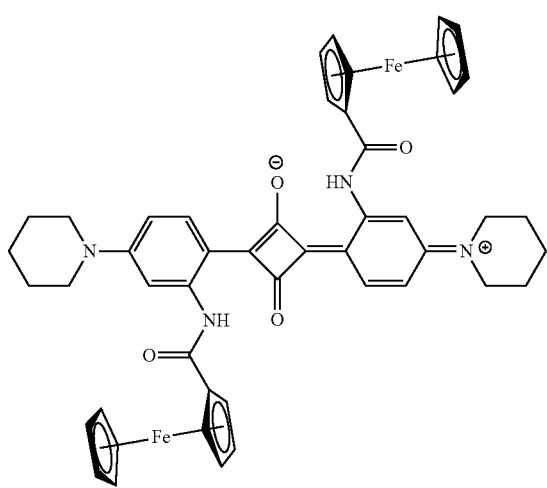

-continued
F-25
F-26
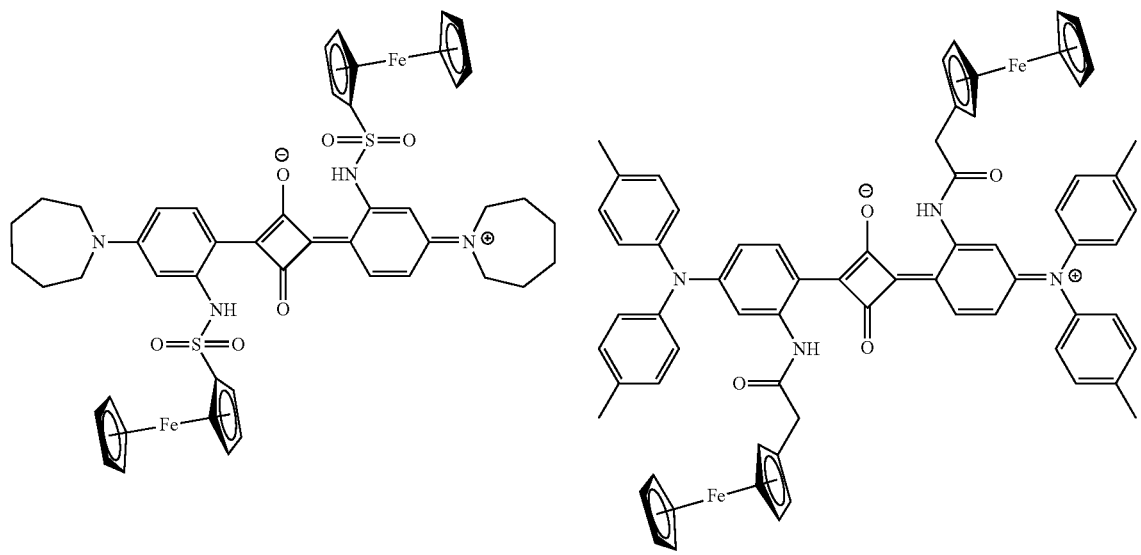
F-27
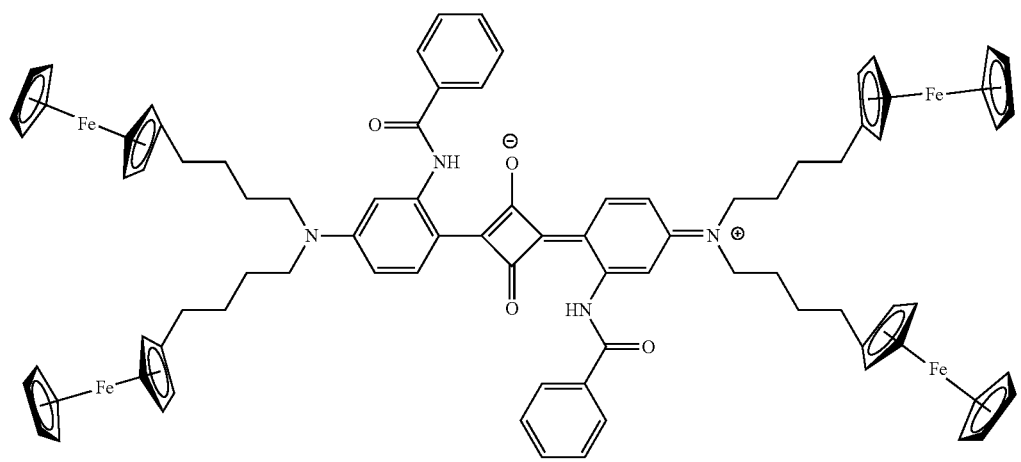
F-28
F-29
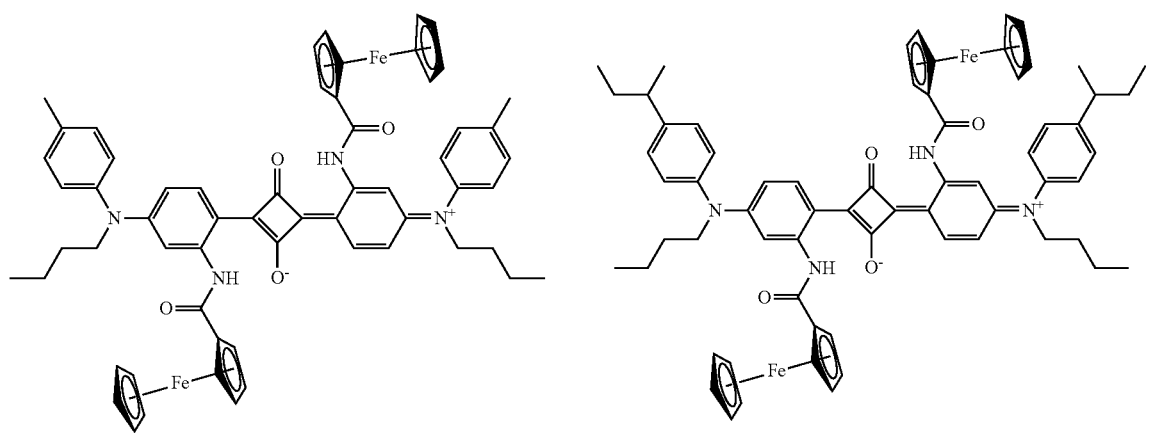

-continued

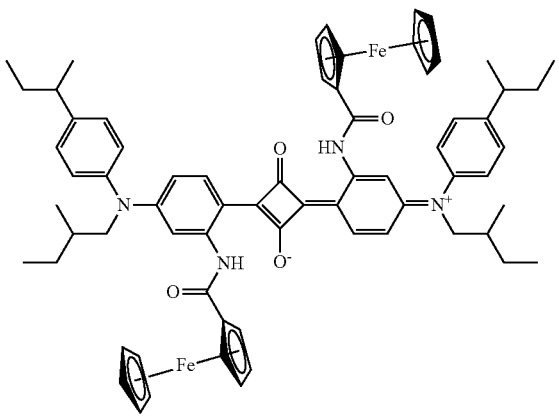
F-30

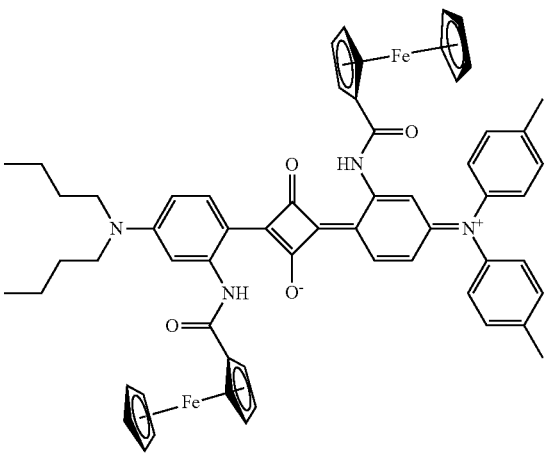
F-31

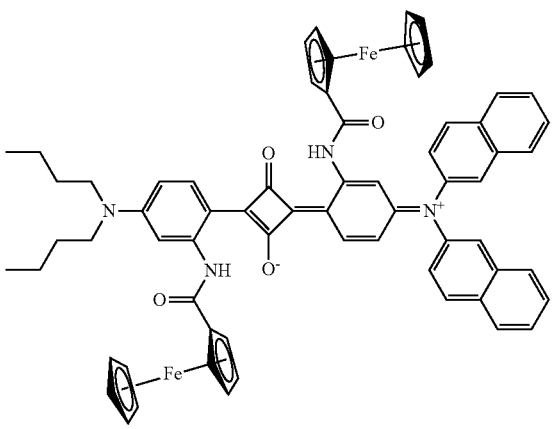
F-32

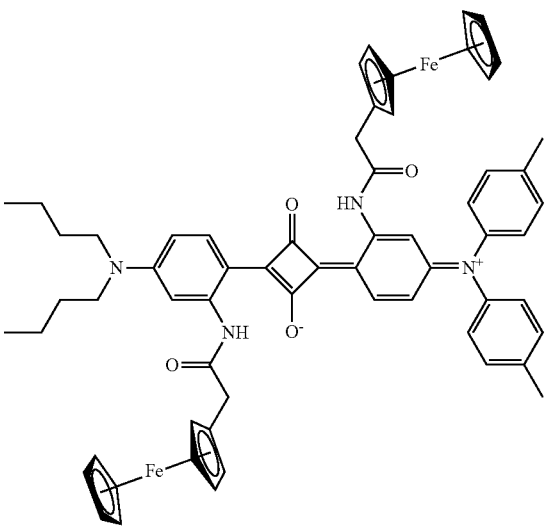
F-33

The main absorption wavelength band of the dye D in the wavelength selective absorption filter is preferably 660 to 730 nm.

The content of the dye A in the wavelength selective absorption filter according to the embodiment of the present invention is not particularly limited as long as the wavelength selective absorption filter according to the embodiment of the present invention exhibits a desired function of cutting out blue light, and it can be appropriately adjusted depending on the absorption waveform or molar extinction coefficient of the dye A in the wavelength range in which blue light is cut out. For example, the lower limit value thereof is preferably 0.01% by mass or more and more preferably 0.1% by mass or more. The upper limit value thereof is not particularly limited as long as the wavelength selective absorption filter according to the embodiment of the present invention exhibits a desired relative brightness and correlated color temperature; however, it is, for example, preferably 45% by mass or less, more preferably 30% by mass or less, still more preferably 15% by mass or less, and particularly preferably 10% by mass.

The content of the dye D in the wavelength selective absorption filter according to the embodiment of the present invention can be appropriately adjusted so that the wavelength selective absorption filter according to the embodiment of the present invention exhibits a desired correlated color temperature, in accordance with the content of the dye A in the wavelength selective absorption filter according to the embodiment of the present invention. For example, the lower limit value thereof is preferably 0.05% by mass or more and more preferably 0.2% by mass or more, and the upper limit value thereof is preferably 50% by mass or less, more preferably 40% by mass or less, still more preferably 20% by mass or less, and particularly preferably 10% by mass.

The content proportions of dye A and dye D in the wavelength selective absorption filter according to the embodiment of the present invention are appropriately adjusted according to the kind of each dye, and in terms of the mass ratio (the dye A:the dye D), they are preferably 1:0.1 to 10 and more preferably 1:0.2 to 6.

In a case where the dye D is the quencher-embedded coloring agent, it is preferable that the wavelength selective absorption filter according to the embodiment of the present invention contains 0.1% by mass or more of the content of the quencher-embedded coloring agent, in terms of the antireflection effect. The upper limit value thereof is preferably 45% by mass or less.

<Resin>

The resin contained in the wavelength selective absorption filter according to the embodiment of the present invention (hereinafter, also referred to as a "matrix resin") is not particularly limited as long as it can disperse (preferably dissolve) the dye and has the desired light transmittance (the light transmittance is preferably 80% or more in the visible range having a wavelength of 400 to 800 nm).

In a case where the dye D is a squaraine-based coloring agent represented by General Formula (I), the matrix resin is preferably a low-polarity matrix resin in which the squaraine-based coloring agent can exhibit sharper absorption. Since the squaraine-based coloring agent exhibits sharper absorption, the wavelength selective absorption filter according to the embodiment of the present invention can further suppress the decrease in relative brightness. Here, the low polarity means that an fd value defined by Relational Expression I is preferably 0.50 or more.

$$fd=\delta d/(\delta d+\delta p+\delta h) \quad \text{Relational Expression I:}$$

In Relational Expression I, $\delta d$, $\delta p$, and $\delta h$ respectively indicate a term corresponding to a London dispersion force, a term corresponding to a dipole-dipole force, and a term corresponding to a hydrogen bonding force with respect to a solubility parameter $\delta t$ calculated according to the Hoy method. A specific calculation method of fd will be described later. That is, fd indicates a ratio of $\delta d$ to the sum of $\delta d$, $\delta p$, and $\delta h$.

In a case where the fd value is set to 0.50 or more, a sharper absorption waveform can be easily obtained.

Further, in a case where the wavelength selective absorption filter according to the embodiment of the present invention contains two or more matrix resins, the fd value is calculated as follows.

$$fd=\Sigma(w_i \cdot fd_i)$$

Here, $w_i$ represents the mass fraction of the i-th matrix resin, and $fd_i$ represents the fd value of the i-th matrix resin.

—Term $\delta d$ Corresponding to London Dispersion Force—

The term $\delta d$ corresponding to the London dispersion force refers to $\delta d$ obtained for the Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

—Term $\delta p$ Corresponding to Dipole-Dipole Force—

The term $\delta p$ corresponding to the dipole-dipole force refers to $\delta p$ obtained for Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

—Term $\delta h$ Corresponding to Hydrogen Bonding Force—

The term $\delta h$ corresponding to the hydrogen bonding force refers to $\delta h$ obtained for the Amorphous Polymers described in the column "2) Method of Hoy (1985, 1989)" on pages 214 to 220 of the document "Properties of Polymers 3$^{rd}$. ELSEVIER, (1990)", and is calculated according to the description in the column of the document.

In addition, in a case where the matrix resin is a resin exhibiting a certain hydrophobicity, the moisture content of the wavelength selective absorption filter according to the embodiment of the present invention can be set to a low moisture content, for example, 0.5% or lower, and the light resistance of the wavelength selective absorption filter according to the embodiment of the present invention is improved, which is preferable.

The resin may contain any conventional component in addition to a polymer. However, the fd of the matrix resin is a calculated value for the polymer constituting the matrix resin.

Preferred examples of the matrix resin include a polystyrene resin and a cyclic polyolefin resin, and the polystyrene resin is more preferable. In general, the fd value of the polystyrene resin is 0.45 to 0.60, and the fd value of the cyclic polyolefin resin is 0.45 to 0.70. As described above, it is preferable to use the resin having an fd value of 0.50 or more.

Further, for example, in addition to these preferable resins, it is also preferable to use a resin component, that imparts functionality to the wavelength selective absorption filter, such as an extensible resin component and a peelability control resin component, which will be described later. That is, in the present invention, the matrix resin is used in the meaning of including the extensible resin component and the peelability control resin component in addition to the above-described resins.

It is preferable that the matrix resin includes a polystyrene resin in terms of sharpening the absorption waveform of the coloring agent.

(Polystyrene Resin)

The polystyrene contained in the polystyrene resin means a polymer containing a styrene component. The polystyrene preferably contains 50% by mass or more of the styrene component. The wavelength selective absorption filter according to the embodiment of the present invention may contain one kind of polystyrene or two or more kinds thereof. Here, the styrene component is a structural unit derived from a monomer having a styrene skeleton in the structure thereof.

The polystyrene more preferably contains 70% by mass or more of the styrene component, and still more preferably 85% by mass or more of the styrene component, in terms of controlling the photo-elastic coefficient and the hygroscopicity to values in ranges preferable for the wavelength selective absorption filter. It is also preferable that the polystyrene is composed of only a styrene component.

Among polystyrenes, examples of the polystyrene composed of only the styrene component include a homopolymer of a styrene compound and a copolymer of two or more kinds of styrene compounds. Here, the styrene compound is a compound having a styrene skeleton in the structure thereof and is meant to include, in addition to styrene, a compound in which a substituent is introduced within a range where an ethylenically unsaturated bond of styrene can act as a reactive (polymerizable) group.

Specific examples of the styrene compound include the following styrenes: alkylstyrene such as α-methylstyrene, o-methylstyrene, m-methylstyrene, p-methylstyrene, 3,5-dimethylstyrene, 2,4-dimethylstyrene, o-ethylstyrene, p-ethylstyrene, and tert-butyl styrene; and substituted styrene having a hydroxyl group, an alkoxy group, a carboxy group, or a halogen atom introduced into the benzene nucleus of styrene, such as hydroxystyrene, tert-butoxy styrene, vinyl benzoic acid, o-chlorostyrene, and p-chlorostyrene. Among these, the polystyrene is preferably a homopolymer of styrene (that is, polystyrene) from the viewpoints of availability and material cost.

The constitutional component other than the styrene component that may be contained in the polystyrene is not particularly limited. That is, the polystyrene may be a styrene-diene copolymer, a styrene-polymerizable unsaturated carboxylic acid ester copolymer, or the like. In addition, it is also possible to use a mixture of polystyrene and synthetic rubber (for example, polybutadiene and polyisoprene). Further, high impact polystyrene (HIPS) obtained by subjecting styrene to graft polymerization with synthetic rubber is also preferable. Further, a polystyrene obtained by dispersing a rubber-like elastic body in a continuous phase of a polymer including a styrene component (for example, a copolymer of a styrene component and a (meth)acrylate ester component), and subjecting the copolymer to graft polymerization with a rubber-like elastic body (referred to as graft type high impact polystyrene "graft HIPS") is also preferable. Furthermore, a so-called styrene-based elastomer can also be suitably used.

In addition, the polystyrene may be hydrogenated (may be a hydrogenated polystyrene). The hydrogenated polystyrene is not particularly limited, and it is preferably a hydrogenated styrene-diene-based copolymer such as a hydrogenated styrene-butadiene-styrene block copolymer (SEBS) obtained by hydrogenating a styrene-butadiene-styrene block copolymer (SBS) or hydrogenated styrene-isoprene-styrene block copolymer (SEPS) obtained by hydrogenating a styrene-isoprene-styrene block copolymer (SIS). Only one of these hydrogenated polystyrenes may be used, or two or more thereof may be used.

In addition, the polystyrene may be modified polystyrene. The modified polystyrene is not particularly limited, and examples thereof include polystyrene having a reactive group such as a polar group introduced therein. Specific examples thereof preferably include acid-modified polystyrene such as maleic acid-modified and epoxy-modified polystyrene.

As the polystyrene, a plurality of kinds of polystyrene resins having different compositions, molecular weights, and the like may be used in combination.

The polystyrene-based resin can be obtained using a conventional method such as anion, bulk, suspension, emulsification, or a solution polymerization method. In addition, in the polystyrene, at least a part of the unsaturated double bond of the benzene ring of the conjugated diene and the styrene monomer may be hydrogenated. The hydrogenation rate can be measured by a nuclear magnetic resonance apparatus (NMR).

As the polystyrene resin, a commercially available product may be used, and examples thereof include "CLEAREN 530L" and "CLEAREN 730L" manufactured by Denki Kagaku Kogyo Kabushiki Kaisha, "TUFPRENE 126S" and "ASAPRENE T411" manufactured by Asahi Kasei Corporation, "KRATON D1102A", "KRATON D1116A" manufactured by Kraton Polymers Japan Ltd., "STYROLUX S" and "STYROLUX T" manufactured by Styrolution Group, "ASAFLEX 840" and "ASAFLEX 860" manufactured by Asahi Kasei Chemicals Corporation (all are SBS), "679", "HF77", and "SGP-10" manufactured by PS Japan Corporation, "DIC STYRENE XC-515" and "DIC STYRENE XC-535" manufactured by DIC Corporation (all are GPPS), "475D", "H0103", and "HT478" manufactured by PS Japan Corporation, and "DIC STYRENE GH-8300-5" manufactured by DIC Corporation (all are HIPS). Examples of the hydrogenated polystyrene-based resin include "TUFTEC H series" manufactured by Asahi Kasei Chemicals Corporation, and "KRATON G series" manufactured by Shell Japan Ltd. (all are SEBS), "DYNARON" manufactured by JSR Corporation (hydrogenated styrene-butadiene random copolymer), and "SEPTON" manufactured by Kuraray Co., Ltd. (SEPS). Examples of the modified polystyrene-based resin include "TUFTEC M series" manufactured by Asahi Kasei Chemicals Corporation, "EPOFRIEND" manufactured by Daicel Corporation, "Polar Group Modified DYNARON" manufactured by JSR Corporation, and "RESEDA" manufactured by ToaGosei Co., Ltd.

The wavelength selective absorption filter according to the embodiment of the present invention preferably contains a polyphenylene ether resin in addition to the polystyrene resin. By containing the polystyrene resin and the polyphenylene ether resin together, the toughness of the wavelength selective absorption filter can be improved, and the occurrence of defects such as cracks can be suppressed even in a harsh environment such as high temperature and high humidity.

However, in the calculation of the fd value described above, the fd value of the polyphenylene ether resin is not taken into consideration, in a case where the wavelength selective absorption filter according to the embodiment of the present invention contains a polyphenylene ether resin in addition to the polystyrene resin.

As the polyphenylene ether resin, ZYLON S201A, ZYLON 202A, ZYLON S203A, and the like, manufactured by Asahi Kasei Corporation, can be preferably used. In addition, a resin in which the polystyrene resin and the polyphenylene ether resin are mixed in advance may also be used. As the mixed resin of the polystyrene resin and the polyphenylene ether resin, for example, ZYLON 1002H, ZYLON 1000H, ZYLON 600H, ZYLON 500H, ZYLON 400H, ZYLON 300H, ZYLON 200H, and the like manufactured by Asahi Kasei Corporation can be preferably used.

In a case where the polystyrene resin and the polyphenylene ether resin are contained in the wavelength selective absorption filter according to the embodiment of the present invention, the mass ratio of both resins is preferably 99/1 to 50/50, more preferably 98/2 to 60/40, and still more preferably 95/5 to 70/30, in terms of the polystyrene resin/polyphenylene ether resin. In a case where the formulation ratio of the polyphenylene ether resin is set within the above-described preferred range, the wavelength selective absorption filter can have sufficient toughness, and a solvent can be properly volatilized in a case where a film formation is carried out with a solution.

(Cyclic Polyolefin Resin)

The cyclic olefin compound that forms the cyclic polyolefin contained in the cyclic polyolefin resin is not particularly limited as long as the compound has a ring structure including a carbon-carbon double bond, and examples thereof include a norbornene compound and a monocyclic olefin compound, a cyclic conjugated diene compound, and a vinyl alicyclic hydrocarbon compound, which are not the norbornene compound.

Examples of the cyclic polyolefin include (1) polymers including a structural unit derived from a norbornene compound; (2) polymers including a structural unit derived from a monocyclic olefin compound other than the norbornene compound; (3) polymers including a structural unit derived from a cyclic conjugated diene compound; (4) polymers including a structural unit derived from a vinyl alicyclic hydrocarbon compound; and hydrides of polymers including a structural unit derived from each of the compounds (1) to (4).

In the present invention, ring-opening polymers of the respective compounds are included in the polymers including a structural unit derived from a norbornene compound and the polymers including a structural unit derived from a monocyclic olefin compound.

The cyclic polyolefin is not particularly limited; however, it is preferably a polymer having a structural unit derived from a norbornene compound, which is represented by General Formula (A-II) or (A-III). The polymer having the structural unit represented by General Formula (A-II) is an addition polymer of a norbornene compound, and the polymer having the structural unit represented by General Formula (A-III) is a ring-opening polymer of a norbornene compound.

General Formula (A-II)

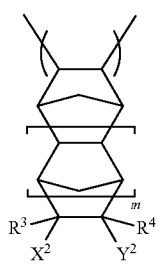

General Formula (A-III)

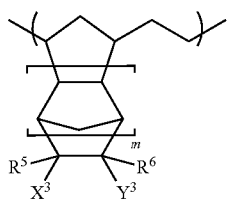

In General Formulae (A-II) and (A-III), m is an integer of 0 to 4, and preferably 0 or 1.

In General Formulae (A-II) and (A-III), $R^3$ to $R^6$ each independently represent a hydrogen atom or a hydrocarbon group having 1 to 10 carbon atoms.

The hydrocarbon group in General Formulae (A-I) to (A-III) is not particularly limited as long as the hydrocarbon group is a group consisting of a carbon atom and a hydrogen atom, and examples thereof include an alkyl group, an alkenyl group, an alkynyl group, and an aryl group (an aromatic hydrocarbon group). Among these, an alkyl group or an aryl group is preferable.

In General Formula (A-II) or (A-III), $X^2$ and $X^3$, and $Y^2$ and $Y^3$ each independently represent a hydrogen atom, a hydrocarbon group having 1 to 10 carbon atoms, a halogen atom, a hydrocarbon group having 1 to 10 carbon atoms, which is substituted with a halogen atom, $—(CH_2)_n COOR^{11}$, $—(CH_2)_n OCOR^2$, $—(CH_2)_n NCO$, $—(CH_2)_n NO_2$, $—(CH_2)_n CN$, $—(CH_2)_n CONR^{13}R^{14}$, $—(CH_2)_n NR^{13}R^{14}$, $—(CH_2)_n OZ$ or $—(CH_2)_n W$, or $(—CO)_2 O$ or $(—CO)_2 NR^{15}$ which is formed by $X^2$ and $Y^2$ or $X^3$ and $Y^3$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_p D_{(3-p)}$ ($R^{16}$ represents a hydrocarbon group having 1 to 10 carbon atoms, D represents a halogen atom, $—OCOR^{17}$, or $—OR^{17}$ ($R^{17}$ represents a hydrocarbon group having 1 to 10 carbon atoms), and p is an integer of 0 to 3). n is an integer of 0 to 10, preferably 0 to 8, and more preferably 0 to 6.

In General Formulae (A-II) and (A-III), $R^3$ to $R^6$ are each preferably a hydrogen atom or $—CH_3$, and, in terms of moisture permeability, more preferably a hydrogen atom.

$X^2$ and $X^3$ are each preferably a hydrogen atom, $—CH_3$, or $—C_2H_5$ and, in terms of moisture permeability, more preferably a hydrogen atom.

$Y^2$ and $Y^3$ are each preferably a hydrogen atom, a halogen atom (particularly a chlorine atom), or $—(CH_2)_n COOR^{11}$ (particularly $—COOCH_3$) and, in terms of moisture permeability, more preferably a hydrogen atom.

Other groups are appropriately selected.

The polymer having the structural unit represented by General Formula (A-II) or (A-III) may further include at least one or more structural units represented by General Formula (A-I).

General Formula (A-I)

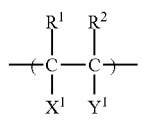

In General Formula (A-I), $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms, which is substituted with a halogen atom, $—(CH_2)_n COOR^{11}$, $—(CH_2)_n OCOR^{12}$, $—(CH_2)_n NCO$, $—(CH_2)_n NO_2$, $—(CH_2)_n CN$, $—(CH_2)_n CONR^{13}R^{14}$, $—(CH_2)_n NR^{13}R^{14}$, $—(CH_2)_n OZ$, $—(CH_2)_n W$, or $(—CO)_2 O$ or $(—CO)_2 NR^{15}$ which is formed by $X^1$ and $Y^1$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_p D_{(3-p)}$ ($R^{16}$ represents a hydrocarbon group having 1 to 10 carbon atoms, D represents a halogen atom, $—OCOR^{17}$, or $—OR^{17}$ ($R^{17}$ represents a hydrocarbon group having 1 to 10 carbon atoms), and p is an integer of 0 to 3). n is an integer of 0 to 10.

From the viewpoint of adhesiveness, the content of the structural unit derived from a norbornene compound in the cyclic polyolefin having the structural unit represented by General Formula (A-II) or (A-III) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbornene compound represents the average value in the cyclic polyolefin.

The addition (co)polymer of a norbornene compound is described in JP1998-7732A (JP-H10-7732A), JP2002-504184A, US2004/229157A1A, and WO2004/070463A.

The polymer of a norbornene compound is obtained by the addition polymerization of norbornene compounds (for example, polycyclic unsaturated compounds of norbornene).

In addition, as the polymer of a norbornene compound, copolymers obtained by the addition copolymerization of, as necessary, a norbornene compound, olefin such as ethylene, propylene, and butene, conjugated diene such as butadiene and isoprene, unconjugated diene such as ethylidene norbornene, and an ethylenically unsaturated compound such as acrylonitrile, acrylic acid, methacrylic acid, maleic acid anhydride, acrylic acid ester, methacrylic acid ester, maleimide, vinyl acetate, and vinyl chloride are exemplified. Among these, a copolymer of a norbornene compound and ethylene is preferable.

Examples of the addition (co)polymers of a norbornene compound include APL8008T (Tg: 70° C.), APL6011T (Tg: 105° C.). APL6013T (Tg: 125° C.), and APL6015T (Tg: 145° C.), which are on the market by Mitsui Chemicals, Inc.

under a product name of APEL and have mutually different glass transition temperatures (Tg). In addition, pellets such as TOPAS8007, TOPAS6013, and TOPAS6015 are commercially available from Polyplastics Co., Ltd. Further, Appear 3000 is commercially available from Film Ferrania S. R. L.

As the polymer of a norbornene compound, a commercially available product can be used. For example, it is commercially available from JSR Corporation under a product name of Arton G or Arton F, and it is also commercially available from Zeon Corporation under a product name of Zeonor ZF14, ZF16, Zeonex 250, or Zeonex 280.

The hydride of a polymer of a norbornene compound can be synthesized by the addition polymerization or the metathesis ring-opening polymerization of a norbornene compound or the like and then the addition of hydrogen. The synthesis method is described in, for example, JP1989-240517A (JP-H1-240517A), JP1995-196736A (JP-H7-196736A), JP1985-26024A (JP-S60-26024A), JP1987-19801A (JP-S62-19801A), JP2003-159767A, JP2004-309979A.

The molecular weight of the cyclic polyolefin is appropriately selected depending on the intended use, and it is a mass average molecular weight measured in terms of polyisoprene or polystyrene by the gel permeation chromatography of a cyclohexane solution (a toluene solution in a case where the polymer is not dissolved). In general, it is preferable that the molecular weight is in a range of 5,000 to 500,000, preferably 8,000 to 200,000, and more preferably 10,000 to 100,000. A polymer having a molecular weight in the above-described range is capable of satisfying both the mechanical strength of a molded body and the molding workability of compacts at a high level in a well-balanced manner.

In the wavelength selective absorption filter according to the embodiment of the present invention, the content of the matrix resin is preferably 5% by mass or more, more preferably 20% by mass or more, still more preferably 50% by mass or more, and particularly preferably 70% by mass or more.

The content of the matrix resin in the wavelength selective absorption filter according to the embodiment of the present invention is usually 99.90% by mass or less, and preferably 99.85% by mass or less.

The cyclic polyolefin contained in the wavelength selective absorption filter according to the embodiment of the present invention may be two or more kinds, and polymers having different at least one of a compositional ratio or a molecular weight may be used in combination. In this case, the total content of the respective polymers is in the above range.

(Extensible Resin Component)

The wavelength selective absorption filter according to the embodiment of the present invention can appropriately select and contain a component exhibiting extensibility (also referred to as an extensible resin component) as a resin component. Specific examples thereof include an acrylonitrile-butadiene-styrene resin (an ABS resin), a styrene-butadiene resin (an SB resin), an isoprene resin, a butadiene resin, a polyether-urethane resin, and a silicone resin. Further, these resins may be further hydrogenated as appropriate.

As the extensible resin component, it is preferable to use an ABS resin or an SB resin, and it is more preferable to use an SB resin.

As the SB resin, for example, a commercially available one can be used. Examples of such commercially available products include TR2000, TR2003, and TR2250 (all, product name, manufactured by JSR Corporation); CLEAREN 210M, 220M, and 730V (all, product name, manufactured by Denka Corporation); ASAFLEX 800S, 805, 810, 825, 830, and 840 (all, product name, manufactured by Asahi Kasei Corporation); and EPOREX SB2400, SB2610, and SB2710 (all, product name, Sumitomo Chemical Co., Ltd.).

The wavelength selective absorption filter according to the embodiment of the present invention preferably contains an extensible resin component in the matrix resin in an amount of 15% to 95% by mass, more preferably 20% to 50% by mass, and still more preferably 25% to 45% by mass.

The extensible resin component is preferably an extensible resin component having a breaking elongation of 10% or more and more preferably an extensible resin component having a breaking elongation of 20% or more, in a case where a sample having a form with a thickness of 30 μm and a width of 10 mm is produced by using the extensible resin component alone and the breaking elongation at 25° C. is measured in accordance with JIS 7127.

(Peelability Control Resin Component)

The wavelength selective absorption filter according to the embodiment of the present invention can contain, as a resin component, a component that controls the peelability (a peelability control resin component) in a case of being produced according to a method including a step of peeling the wavelength selective absorption filter according to the embodiment of the present invention from a release film, among the manufacturing methods for the wavelength selective absorption filter according to the embodiment of the present invention described later, which is preferable. In a case of controlling the peelability of the wavelength selective absorption filter according to the embodiment of the present invention from the release film, it is possible to prevent a peeling mark from being left on the wavelength selective absorption filter according to the embodiment of the present invention after peeling, and it is possible to cope with various processing speeds in the peeling step. As a result, a preferred effect can be obtained for improving the quality and productivity of the wavelength selective absorption filter according to the embodiment of the present invention.

The peelability control resin component is not particularly limited and can be appropriately selected depending on the kind of the release film. In a case where a polyester-based polymer film is used as the release film as described later, for example, a polyester resin (also referred to as a polyester-based additive) is suitable as the peelability control resin component.

The polyester-based additive can be obtained by a conventional method such as a dehydration condensation reaction of a polyhydric basic acid and a polyhydric alcohol and an addition of a dibasic anhydride to a polyhydric alcohol and a dehydration condensation reaction, and a polycondensation ester formed from a dibasic acid and a diol is preferable.

The mass average molecular weight (Mw) of the polyester-based additive is preferably 500 to 50,000, more preferably 750 to 40,000, and still more preferably 2,000 to 30,000.

In a case where the mass average molecular weight of the polyester-based additive is equal to or larger than the above-described preferred lower limit value, it is preferable from the viewpoint of brittleness and moisture-heat resistance, and in a case where the mass average molecular weight thereof is equal to or smaller than the above-described preferred upper limit value, it is preferable from the viewpoint of compatibility with the resin.

The mass average molecular weight of the polyester-based additive is a value of the mass average molecular weight (Mw) in terms of standard polystyrene measured under the following conditions. The molecular weight distribution (Mw/Mn) can also be measured under the same conditions. Mn is a number average molecular weight in terms of standard polystyrene.

GPC: Gel permeation chromatograph device (HLC-8220GPC manufactured by Tosoh Corporation, column: Guard column HXL-H manufactured by Tosoh Corporation, where TSK gel G7000HXL, TSK gel GMHXL 2 pieces, and TSK gel G2000HXL are connected in sequence, eluent: tetrahydrofuran, flow velocity: 1 mL/min, sample concentration: 0.7% to 0.8% by mass, sample injection volume: 70 μL, measurement temperature; 40° C., detector: differential refractometer (RI) meter (40° C.), and standard substance: TSK standard polystyrene manufactured by Tosoh Corporation)

Preferred examples of the dibasic acid component constituting the polyester-based additive include dicarboxylic acid.

Examples of the dicarboxylic acid include an aliphatic dicarboxylic acid and an aromatic dicarboxylic acid. An aromatic dicarboxylic acid or a mixture of an aromatic dicarboxylic acid and an aliphatic dicarboxylic acid can be preferably used.

Among the aromatic dicarboxylic acids, an aromatic dicarboxylic acid having 8 to 20 carbon atoms is preferable, and an aromatic dicarboxylic acid having 8 to 14 carbon atoms is more preferable. Specifically, preferred examples thereof include at least one of phthalic acid, isophthalic acid, or terephthalic acid.

Among the aliphatic dicarboxylic acids, an aliphatic dicarboxylic acid having 3 to 8 carbon atoms is preferable, and an aliphatic dicarboxylic acid having 4 to 6 carbon atoms is more preferable. Specifically, preferred examples thereof include at least one of succinic acid, maleic acid, adipic acid, or glutaric acid, and at least one of succinic acid or adipic acid is more preferable.

Examples of the diol component constituting the polyester-based additive include an aliphatic diol and an aromatic diol, and aliphatic diol is preferable.

Among the aliphatic diols, an aliphatic diol having 2 to 4 carbon atoms is preferable, and an aliphatic diol having 2 to 3 carbon atoms is more preferable.

Examples of the aliphatic diol include ethylene glycol, diethylene glycol, 1,2-propylene glycol, 1,3-propylene glycol, 1,3-butylene glycol, and 1,4-butylene glycol. These aliphatic diols can be used alone or two or more kinds can be used in combination.

The polyester-based additive is particularly preferably a compound obtained by fusing at least one of phthalic acid, isophthalic acid, or terephthalic acid with an aliphatic diol.

The terminal of the polyester-based additive may be sealed by reacting with a monocarboxylic acid. The monocarboxylic acid that is used for sealing is preferably an aliphatic monocarboxylic acid. Preferred examples thereof include acetic acid, propionic acid, butanoic acid, benzoic acid, and a derivative thereof, where acetic acid or propionic acid is more preferable and acetic acid is still more preferable.

Examples of the commercially available polyester-based additive include ester-based resin polyesters manufactured by Nippon Synthetic Chemical Industry Co., Ltd. (for example, LP050, TP290, LP035, LP033, TP217, and TP220) and ester-based resins Byron manufactured by Toyobo Co., Ltd. (for example, Byron 245, Byron GK890, Byron 103, Byron 200, and Byron 550, and Byron GK880).

The content of the peelability control resin component in the wavelength selective absorption filter according to the embodiment of the present invention is preferably 0.05% by mass or more, and more preferably 0.1% by mass or more in the matrix resin. In addition, the upper limit value thereof is preferably 25% by mass or less, more preferably 20% by mass or less, and still more preferably 15% by mass or less. From the viewpoint of obtaining proper adhesiveness, the above-described preferred range is preferable.

<Antifading Agent>

The wavelength selective absorption filter according to the embodiment of the present invention preferably contains an antifading agent for a dye (simply, also referred to as an antifading agent) in order to prevent the fading of the above-described dye A and dye D.

As the antifading agent, it is possible to use commonly used antifading agents without particular limitation, such as antioxidants described in paragraphs [0143] to [0165] of WO2015/005398A, the radical scavengers described in paragraphs [0166] to [0199] of WO2015/005398A, and the deterioration preventing agents described in paragraphs [0205] to [0206] of WO2015/005398A.

The compound represented by General Formula (IV) below can be preferably used as the antifading agent.

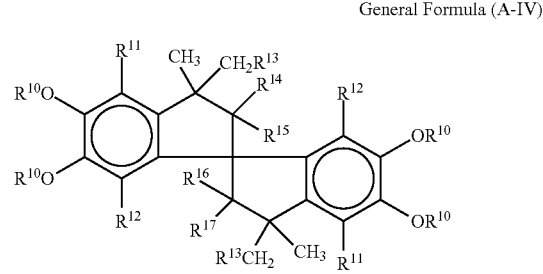

General Formula (A-IV)

In Formula (IV). $R^{10}$ represents an alkyl group, an alkenyl group, an aryl group, a heterocyclic group, or a group represented by $R^{18}CO-$, $R^{19}SO_2-$ or $R^{20}NHCO-$. Here, $R^{18}$, $R^{19}$, and $R^{20}$ each independently represent an alkyl group, an alkenyl group, an aryl group, or a heterocyclic group. $R^{11}$ and $R^{12}$ each independently represent a hydrogen atom, a halogen atom, an alkyl group, an alkenyl group, an alkoxy group, or an alkenyloxy group, and $R^{13}$, $R^{14}$, $R^{15}$, $R^{16}$, and $R^{17}$ each independently represent a hydrogen atom, an alkyl group, an alkenyl group, or an aryl group.

However, the alkyl group in $R^{10}$ to $R^{20}$ includes an aralkyl group.

Examples of the alkyl group represented by $R^{10}$ in Formula (IV) include methyl, ethyl, propyl, and benzyl; examples of the alkenyl group include allyl; examples of the aryl group include phenyl; and examples of the heterocyclic group include tetrahydropyranyl and pyrimidyl. $R^{18}$, $R^{19}$, and $R^{20}$ each independently represent an alkyl group (for example, methyl, ethyl, n-propyl, n-butyl, or benzyl), an alkenyl group (for example, allyl), an aryl group (for example, phenyl, or methoxyphenyl), or a heterocyclic group (for example, pyridyl, or pyrimidyl).

Examples of the halogen atom represented by $R^{11}$ and $R^{12}$ in Formula (IV) include chlorine and bromine; examples of the alkyl group include methyl, ethyl, n-butyl, and benzyl; examples of the alkenyl group include allyl; examples of the alkoxy group include methoxy, ethoxy, and benzyloxy; and examples of the alkenyloxy group include 2-propenyloxy.

Examples of the alkyl group represented by $R^{13}$, $R^{14}$, $R^{15}$, $R^{16}$, or $R^{17}$ in Formula (IV) include methyl, ethyl, n-butyl, and benzyl; examples of the alkenyl group include 2-propenyl; and examples of the aryl group include phenyl, methoxyphenyl, and chlorophenyl.

$R^{10}$ to $R^{20}$ may further have a substituent, and examples of the substituent include each group represented by $R^{10}$ to $R^{20}$.

Specific examples of the compound represented by General Formula (IV) are shown below. However, the present invention is not limited thereto.

General Formula (IV)

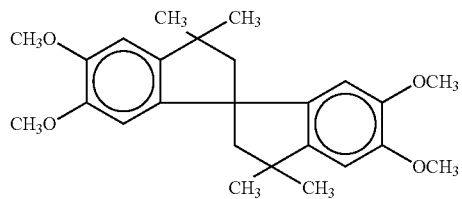
IV-1

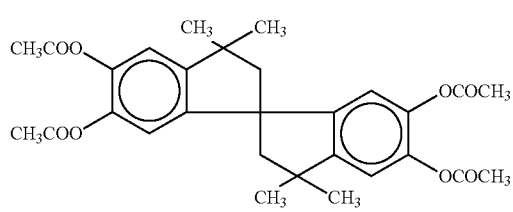
IV-2

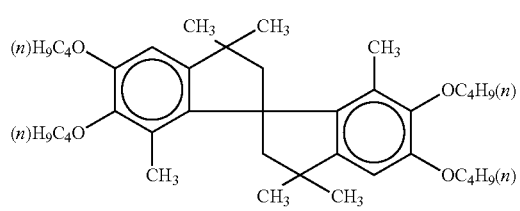
IV-3

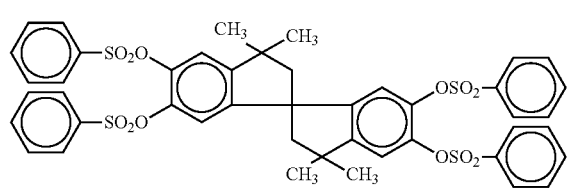
IV-4

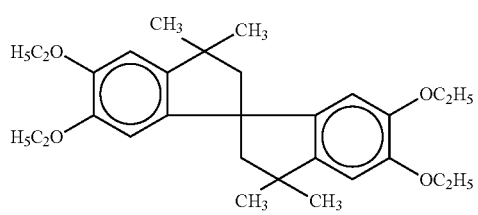
IV-5

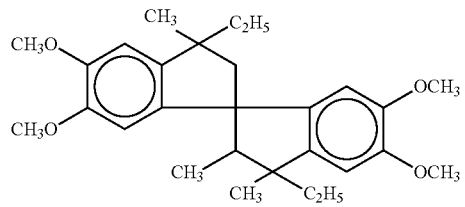
IV-6

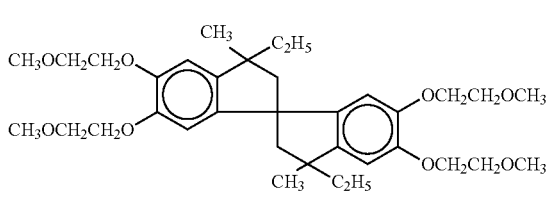
IV-7

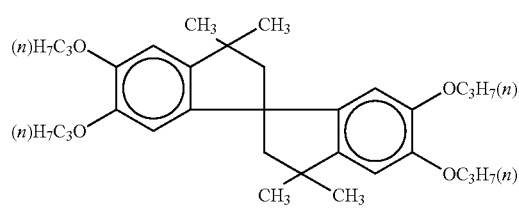
IV-8

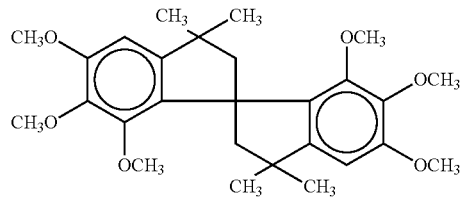
IV-9

As the antifading agent, the compound represented by General Formula [III] can also be preferably used.

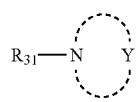
General Formula [III]

In General Formula [III], $R_{31}$ represents an aliphatic group or an aromatic group, and Y represents a non-metal atomic group necessary for forming a 5- to 7-membered ring with a nitrogen atom.

Next, in General Formula [III], $R_{31}$ represents an aliphatic group or an aromatic group, and is preferably an alkyl group, an aryl group, or a heterocyclic group (preferably, an aliphatic heterocyclic group), and more preferably an aryl group.

Examples of the heterocyclic ring formed by Y together with the nitrogen atom include a piperidine ring, a piperazine ring, a morpholine ring, a thiomorpholine ring, a thiomorpholine-1,1-dione ring, a pyrrolidine ring, and an imidazolidine ring.

In addition, the heterocyclic ring may further have a substituent, and examples of the substituent include an alkyl group and an alkoxy group.

Specific examples of the compound represented by General Formula [III] are shown below. However, the present invention is not limited thereto.

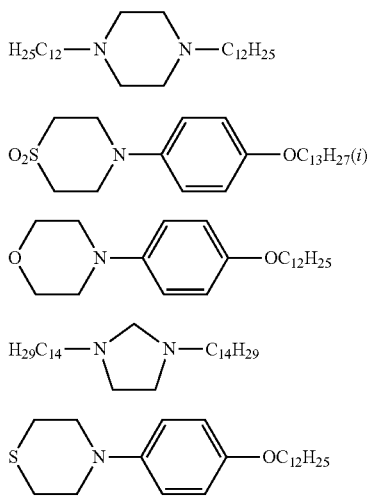

III-1
III-2
III-3
III-4
III-5

In addition to the above specific examples, specific examples of the compound represented by General Formula [III] above include exemplary compounds B-1 to B-65 described on pages 8 to 11 of JP2004-167543A (JP-H2-167543A), and exemplary compounds (1) to (120) described on pages 4 to 7 of JP1988-95439A (JP-S63-95439A).

The content of the antifading agent in the wavelength selective absorption filter according to the embodiment of the present invention is preferably 1% to 15% by mass, more preferably 5% to 15% by mass, still more preferably 5% to 12.5% by mass, and particularly preferably 10% to 12.5% by mass.

In a case where the antifading agent is contained within the above-described preferred range, the wavelength selective absorption filter according to the embodiment of the present invention can improve the light resistance of the dye (the coloring agent) without causing side effects such as discoloration of the wavelength selective absorption layer.

<Other Components>

In addition to the dye, the matrix resin, and the antifading agent for a dye described above, the wavelength selective absorption filter according to the embodiment of the present invention may contain a matting agent, a leveling agent (a surfactant), and the like.

(Matting Agent)

In order to impart sliding properties and prevent blocking, fine particles may be added on the surface of the wavelength selective absorption filter according to the embodiment of the present invention, as long as the effects of the present invention are not impaired. As the fine particles, silica (silicon dioxide, $SiO_2$) of which the surface is coated with a hydrophobic group and which has an aspect of secondary particles is preferably used. As the fine particles, in addition to or instead of silica, fine particles of titanium dioxide, aluminum oxide, zirconium oxide, calcium carbonate, talc, clay, calcined kaolin, calcined calcium silicate, hydrated calcium silicate, aluminum silicate, magnesium silicate, and calcium phosphate may be used. Examples of the commercially available product of the fine particles include the R972 or NX90S (product name, both manufactured by Nippon Aerosil Co., Ltd.).

The fine particles function as a so-called matting agent, and the addition of the fine particles forms minute unevenness on the surface of the wavelength selective absorption filter according to the embodiment of the present invention. Due to the unevenness, even in a case where the wavelength selective absorption filters according to the embodiment of the present invention overlap each other or the wavelength selective absorption filter according to the embodiment of the present invention and other films overlap each other, the films do not stick to each other and sliding properties are secured.

In a case where the wavelength selective absorption filter according to the embodiment of the present invention contains a matting agent as fine particles, and in the fine irregularities due to the protrusions in which fine particles protrude from the filter surface, there are $10^4/mm^2$ or more of protrusions having a height of 30 nm or more, the effect of improving sliding properties and blocking properties is particularly large.

It is preferable to apply the matting agent fine particles particularly onto the surface layer in order to improve the blocking properties and the sliding properties. Examples of the method of applying fine particles onto the surface layer include methods such as multilayer casting and coating.

The content of the matting agent in the wavelength selective absorption filter according to the embodiment of the present invention is appropriately adjusted depending on the intended purpose.

However, in a case where a gas barrier layer described later is provided in the wavelength selective absorption filter according to the embodiment of the present invention, the above-described matting agent fine particles are preferably applied onto the surface of the wavelength selective absorption filter in contact with the gas barrier layer, as long as the gas barrier properties are not impaired.

(Leveling Agent)

A leveling agent (a surfactant) can be appropriately mixed with the wavelength selective absorption filter according to the embodiment of the present invention. As the leveling agent, a commonly used compound can be used, and a fluorine-containing surfactant is particularly preferable. Specific examples thereof include the compounds described in paragraphs [0028] to [0056] of JP2001-330725A.

The content of the leveling agent in the wavelength selective absorption filter according to the embodiment of the present invention is appropriately adjusted depending on the intended purpose.

The wavelength selective absorption filter according to the embodiment of the present invention may contain, in addition to the above components, a low-molecular plasticizer, an oligomer-based plasticizer, a retardation modifier, an ultraviolet absorbing agent, a deterioration preventing agent, a peeling accelerating agent, an infrared absorbing agent, an antioxidant, a filler, a compatibilizer.

<Manufacturing Method for Wavelength Selective Absorption Filter>

The wavelength selective absorption filter can be produced by a solution film forming method, a melt extrusion method, or a method of forming a coating layer on a base material film (release film) (coating method) according to any method, according to a conventional method, and stretching can also be appropriately combined. The wavelength selective absorption filter according to the embodiment of the present invention is preferably produced by a coating method.

(Solution Film Forming Method)

In the solution film forming method, a solution in which a material constituting the wavelength selective absorption filter according to the embodiment of the present invention is dissolved in an organic solvent or water is prepared, a concentration step, a filtration step, and the like are appropriately carried out, and then the solution is uniformly cast on a support. Next, the raw dry film is peeled off from the support, both ends of a web are appropriately held by clips or the like, and the solvent is dried in the drying zone. In addition, stretching can be carried out separately while or after the film is dried.

(Melt Extrusion Method)

In the melt extrusion method, a material constituting the wavelength selective absorption filter according to the embodiment of the present invention (hereinafter, also simply referred to as a "material of the wavelength selective absorption filter") is melted by heat, a filtration step or the like is appropriately carried out, and then the material is uniformly casted on a support. Next, a film solidified by cooling or the like can be peeled off and appropriately stretched. In a case where the main material of the wavelength selective absorption filter according to the embodiment of the present invention is a thermoplastic polymer resin, a thermoplastic polymer resin can be selected as the main material of the release film, and the polymer resin in a molten state can be formed into a film by a known co-extrusion method. In this case, by adjusting the kind of polymer of the wavelength selective absorption filter according to the embodiment of the present invention and the release film and the additives mixed in each layer, or by adjusting the stretching temperature, the stretching speed, the stretching ratio, and the like of the co-extruded film, the adhesive force between the wavelength selective absorption filter according to the embodiment of the present invention and the release film can be controlled.

Examples of the co-extrusion method include a co-extrusion T-die method, a co-extrusion inflation method, and a co-extrusion lamination method. Among these, the co-extrusion T-die method is preferable. The co-extrusion T-die method includes a feed block method and a multi-manifold method. Among these, the multi-manifold method is particularly preferable from the viewpoint that a variation in thickness can be reduced.

In a case where the co-extrusion T-die method is adopted, the melting temperature of the resin in an extruder having a T-die is set to be a temperature higher than the glass transition temperature (Tg) of each resin by preferably 80° C. or higher and more preferably 100° C. or higher, and it is set to be a temperature higher than the glass transition temperature (Tg) of each resin by preferably 180° C. or lower and more preferably 150° C. or lower. In a case where the melting temperature of the resin in the extruder is set to be equal to or larger than the lower limit value of the above-described preferred range, the fluidity of the resin can be sufficiently enhanced, and in a case where the melting temperature is set to the upper limit value or less of the above-described preferred range, the resin can be prevented from being deteriorated.

In general, the sheet-shaped molten resin extruded from the opening portion of the die is brought into close contact with the cooling drum. The method of bringing the molten resin into close contact with the cooling drum is not particularly limited, and examples thereof include an air knife method, a vacuum box method, and an electrostatic contact method.

The number of cooling drums is not particularly limited; however, it is generally 2 or more. In addition, the method of disposing the cooling drum is not particularly limited, and examples of the disposition form include a linear form, a Z form, and an L form. Further, the method of passing the molten resin extruded from the opening portion of the die through the cooling drum is not particularly limited.

The degree of close contact of the extruded sheet-shaped resin with the cooling drum changes depending on the temperature of the cooling drum. In a case where the temperature of the cooling drum is raised, the intimate attachment is improved, but in a case where the temperature is raised too much, the sheet-shaped resin may not be peeled off from the cooling drum and may be wound around the drum. Therefore, the temperature of the cooling drum is preferably (Tg+30)° C. or lower, and still more preferably in a range of (Tg−5)° C. to (Tg−45)° C. in a case where Tg is the glass transition temperature of the resin of the layer that is brought into contact with the drum in the resin extruded from the die. In a case where the cooling drum temperature is set within the above-described preferred range, problems such as sliding and scratches can be prevented.

Here, it is preferable to reduce the content of the residual solvent in the film before stretching. Examples of the method of reducing the content include methods of (1) reducing the amount of the residual solvent of the resin as the raw material; and (2) predrying the resin before forming the film before stretching. Predrying is carried out, for example, by making the resin into a form of a pellet or the like and using a hot air dryer or the like. The drying temperature is preferably 100° C. or higher, and the drying time is preferably 2 hours or longer. In a case of carrying out predrying, it is possible to reduce the residual solvent in the film before stretching and to prevent the extruded sheet-shaped resin from foaming.

(Coating Method)

In the coating method, a solution of a material of the wavelength selective absorption filter is applied to a release film to form a coating layer. A release agent or the like may be appropriately applied to the surface of the release film in advance in order to control the adhesiveness to the coating layer. The coating layer can be used by peeling off the release film after being laminated with another member while interposing an adhesive layer in a later step. Any adhesive can be appropriately used as the adhesive constituting the adhesive layer. The release film can be appropriately stretched together with the release film coated with the solution of the material of the wavelength selective absorption filter or with the coating layer laminated.

The solvent that is used for the solution of the wavelength selective absorption filter material can be appropriately selected from the viewpoints that the wavelength selective absorption filter material can be dissolved or dispersed, a uniform surface shape can be easily achieved during the coating step and drying step, liquid storability can be secured, and a proper saturated vapor pressure is provided.

Addition of Dye (Coloring Agent) and Antifading Agent

The timing of adding the dye to the wavelength selective absorption filter material is not particularly limited as long as the dye and the antifading agent are added at the time of film formation. For example, the dye may be added at the time of synthesizing the matrix resin or may be mixed with the wavelength selective absorption filter material at the time of preparing the coating liquid for the wavelength selective absorption filter material. In addition, the same applies to other components that may be contained in the wavelength selective absorption filter, such as the antifading agent.

Release Film

The release film that is used for forming the wavelength selective absorption filter according to the embodiment of the present invention by a coating method or the like preferably has a film thickness of 5 to 100 μm, more preferably 10 to 75 μm, and still more preferably 15 to 55

µm. In a case where the film thickness is equal to or larger than the above-described preferred lower limit value, sufficient mechanical strength can be easily secured, and failures such as curling, wrinkling, and buckling are less likely to occur. In addition, in a case where the film thickness is equal to or smaller than the above-described preferred upper limit value, in the storage of a multi-layer film of the release film and the wavelength selective absorption filter according to the embodiment of the present invention, for example, in the form of a long roll, the surface pressure applied to the multi-layer film is easily adjusted to be in an appropriate range, and adhesion defect is less likely to occur.

The surface energy of the release film is not particularly limited, and in a case of adjusting the relationship between the surface energy of the material of the wavelength selective absorption filter or coating solution and the surface energy of the surface of the release film on which the wavelength selective absorption filter according to the embodiment of the present invention is to be formed, it is possible to adjust the adhesive force between the wavelength selective absorption filter according to the embodiment of the present invention and the release film. In a case where the surface energy difference is reduced, the adhesive force tends to increase, and in a case where the surface energy difference is increased, the adhesive force tends to decrease, and thus the surface energy can be set appropriately.

The surface energy of the release film can be calculated from the contact angle value between water and methylene iodide using the Owen's method. For the measurement of the contact angle, for example, DM901 (contact angle meter, manufactured by Kyowa Interface Science Co., Ltd.) can be used.

The surface energy of the surface of the release film on which the wavelength selective absorption filter according to the embodiment of the present invention is to be formed is preferably 41.0 to 48.0 mN/m and more preferably 42.0 to 48.0 mN/m. In a case where the surface energy is equal to or larger than the above-described preferred lower limit value, the evenness of the thickness of the wavelength selective absorption filter according to the embodiment of the present invention is increased. In a case where the surface energy is equal to or smaller than the above-described preferred upper limit value, it is easy to control the peeling force of the wavelength selective absorption filter according to the embodiment of the present invention from the release film within an appropriate range.

The surface unevenness of the release film is not particularly limited. However, the surface unevenness of the release film can be adjusted in response to the relationship between the surface energy, hardness, and surface unevenness of the surface of the wavelength selective absorption filter according to the embodiment of the present invention, and the surface energy and hardness of the surface of the release film opposite to the side on which the wavelength selective absorption filter according to the embodiment of the present invention is formed, for example, in order to prevent adhesion defect in a case where the multi-layer film of the release film and the wavelength selective absorption filter according to the embodiment of the present invention is stored in the form of a long roll. In a case where the surface unevenness is increased, adhesion defect tends to be suppressed, and in a case where the surface unevenness is reduced, the surface unevenness of the wavelength selective absorption filter according to the embodiment of the present invention tends to be decreased and the haze of the wavelength selective absorption filter according to the embodiment of the present invention tends to be small. Thus, the surface unevenness can be set appropriately.

For such a release film, any material and film can be appropriately used. Specific examples of the material include a polyester-based polymer (including polyethylene terephthalate-based film), an olefin-based polymer, a cycloolefin-based polymer, a (meth)acrylic polymer, a cellulose-based polymer, and a polyamide-based polymer. In addition, a surface treatment can be appropriately carried out for the intended purpose of adjusting the surface properties of the release film. For example, a corona treatment, a room temperature plasma treatment, or a saponification treatment can be carried out to decrease the surface energy, and a silicone treatment, a fluorine treatment, an olefin treatment, or the like can be carried out to raise the surface energy.

—Peeling Force Between Wavelength Selective Absorption Filter and Release Film—

In a case where the wavelength selective absorption filter according to the embodiment of the present invention is formed by a coating method, the peeling force between the wavelength selective absorption filter according to the embodiment of the present invention and the release film can be controlled by adjusting the material of the wavelength selective absorption filter according to the embodiment of the present invention, the material of the release film, and the internal strain of the wavelength selective absorption filter. The peeling force can be measured by, for example, a test of peeling off the release film in a direction of 90°, and the peeling force in a case of being measured at a rate of 300 mm/min is preferably 0.001 to 5 N/25 mm, more preferably 0.01 to 3 N/25 mm, and still more preferably 0.05 to 1 N/25 mm. In a case where the peeling force is equal to or larger than the above-described preferred lower limit value, peeling off the release film in a step other than the peeling step can be prevented, and in a case where the peeling force is equal to or smaller than the above-described preferred upper limit value, peeling failure in the peeling step (for example, zipping and cracking of the wavelength selective absorption filter according to the embodiment of the present invention) can be prevented.

<Film Thickness of Wavelength Selective Absorption Filter According to Embodiment of Present Invention>

The film thickness of the wavelength selective absorption filter according to the embodiment of the present invention is not particularly limited, and it is preferably 1 to 18 µm, more preferably 1 to 12 µm, and still more preferably 2 to 8 µm. In a case where the film thickness is equal to or smaller than the above-described preferred upper limit value, the decrease in the degree of polarization due to the fluorescence emitted by a dye (a coloring agent) can be suppressed by adding the dye to the thin film at a high concentration. In addition, the effects of the quencher and the antifading agent are easily exhibited. On the other hand, in a case where the film thickness is equal to or larger than the above-described preferred lower limit value, it becomes easy to maintain the evenness of the in-plane absorbance.

In the present invention, the film thickness of 1 to 18 µm means that the thickness of the wavelength selective absorption filter according to the embodiment of the present invention is within a range of 1 to 18 µm at any portion. The same applies to the film thicknesses of 1 to 12 µm and 2 to 8 µm. The film thickness can be measured with an electronic micrometer manufactured by Anritsu Corporation.

<Cutting-Out of Blue Light, Correlated Color Temperature, and Relative Brightness of Wavelength Selective Absorption Filter According to Embodiment of Present Invention>

According to the wavelength selective absorption filter according to the embodiment of the present invention, it is possible to achieve both an excellent function of cutting out blue light and an excellent correlated color temperature while suppressing a decrease in relative brightness in a case of being used on the front surface of an image display device.

Each of the values of the above-described cutting-out of blue light, correlated color temperature, and relative brightness are a value calculated from a display device equipped with the wavelength selective absorption filter according to the embodiment of the present invention, according to the method described in Examples described later. Hereinafter, the details thereof will be described in detail.

(Cutting-Out of Blue Light)

In a case where the wavelength selective absorption filter according to the embodiment of the present invention is used on the front surface of the image display device, it is preferable to satisfy the Low Blue Light Content of TÜV Rheinland Holding AG, shown below, from the viewpoint of providing an excellent function of cutting out blue light. Specifically, it is preferable that the following Ratio Blue to Green Ratio is less than 200%, the following Blue Power is less than 20%, and the Toxic Blue is less than 50%.

[Ratio Blue to Green Ratio (%)]=(a maximal absorption value in the blue wavelength range)/(a maximum absorption maximum value in colors other than the blue wavelength range)×100

[Blue Power (%)]=(an integrated value of the light intensity in a wavelength range of ±20 nm with respect to the wavelength at which the maximum in the blue wavelength range is exhibited)/(an integrated value of the light intensity in a wavelength range of 380 to 780 nm)×100

[Toxic Blue (%)]=(an integrated value of the light intensity at wavelengths of 415 to 455 nm)/(an integrated value of the light intensity at wavelengths of 400 nm to 500 nm)×100

(Correlated Color Temperature)

The correlated color temperature is one of the color display methods, and it represents a value of the temperature of the blackbody that gives the chromaticity closest to the chromaticity of the radiated light. The correlated color temperature is determined as an absolute temperature corresponding to an intersection that is obtained in a case where a perpendicular line is drawn on the CIE1960uv chromaticity diagram from the chromaticity point of the radiated light to the blackbody locus. For example, it can be calculated using software or the like published on the homepage described in Examples.

The correlated color temperature of 6,000 K corresponds to sunlight on a plateau on a sunny day having clear atmospheric air, and the correlated color temperature is preferably close to this.

As a result, in a case where the wavelength selective absorption filter according to the embodiment of the present invention is used on the front surface of the image display device, the correlated color temperature is preferably 5,500 to 7,000 K, more preferably 5,700 to 6,800 K, still more preferably 5,900 to 6,600 K, and particularly preferably 5,900 to 6,400 K.

(Relative Brightness)

In a case where the wavelength selective absorption filter according to the embodiment of the present invention is used on the front surface of the image display device, the relative brightness is preferably 84% or more and more preferably 86% or more. The upper limit value thereof is not particularly limited; however, it is practically 95% or less.

Specifically, it is preferable that the relative brightness satisfies 82% or more in a case where the formulation amount of the dye A is adjusted so that the value of the Toxic Blue is 48.6% to 48.8%, and the formulation amount of the dye D is adjusted so that the correlated color temperature is 5,900 K to 6,000 K. However, the Ratio Blue to Green Ratio is less than 200%, and the Blue Power is less than 20%.

<Color Gamut of Wavelength Selective Absorption Filter According to Embodiment of Present Invention>

In addition, in a case where the wavelength selective absorption filter according to the embodiment of the present invention is used on the front surface of the image display device, the color gamut is preferably 83% or more and more preferably 85% or more with respect to the color gamut defined by DCI-P3. The upper limit value thereof is not particularly limited; however, it is practically 99% or less.

The value of the color gamut described above is a value calculated from a display device equipped with the wavelength selective absorption filter according to the embodiment of the present invention, according to the method described in Examples described later.

<Light Resistance of Wavelength Selective Absorption Filter According to Embodiment of Present Invention>

The wavelength selective absorption filter according to the embodiment of the present invention preferably has light resistance from the viewpoint of preventing deterioration of display performance due to external light. Specifically, the light resistance is evaluated as follows.

The wavelength selective absorption filter according to the embodiment of the present invention is irradiated with light for 200 hours in an environment of 60° C. and 50% relative humidity using Super Xenon Weather Meter SX75 (product name, light source: 7.5 kW, a water-cooling type xenon lamp, irradiation illuminance: 150 W/m$^2$) (ultraviolet rays of 300 nm to 400 nm)) manufactured by Suga Test Instruments Co., Ltd. The maximal absorption values before and after this light irradiation are measured respectively, and the light resistance is calculated according to the following expression.

[Light resistance (%)]=([a maximal absorption value after light irradiation for 200 hours]/[a maximal absorption value before light irradiation])×100

Since the above light resistance test corresponds to an acceleration test, there is no problem as long as the light resistance is 10% or more as the practical level. The light resistance of the wavelength selective absorption filter according to the embodiment of the present invention is preferably 50% or more and more preferably 70% or more. The upper limit value thereof is not particularly limited; however, it is practically 98% or less.

<Absorbance of Wavelength Selective Absorption Filter of According to Embodiment According to Embodiment of Present Invention>

In the wavelength selective absorption filter according to the embodiment of the present invention, the absorbance at the maximal absorption wavelength at which the highest absorbance is exhibited at a wavelength of 400 to 430 nm (hereinafter, also simply referred to as "Ab ($\lambda_{max}$)") is preferably 0.3 or more, more preferably 0.5 or more, and still more preferably 0.8 or more.

In the wavelength selective absorption filter according to the embodiment of the present invention, the absorbance at the maximal absorption wavelength at which the highest absorbance is exhibited at a wavelength of 640 to 730 nm (hereinafter, also simply referred to as "Ab ($\lambda_{max}$)") is preferably 0.3 or more, more preferably 0.5 or more, and still more preferably 0.8 or more.

In the wavelength selective absorption filter according to the embodiment of the present invention, the absorbance at a wavelength of 450 nm is preferably 2.5 or less, more preferably 2.0 or less, and still more preferably 1.5 or less.

However, the absorbance of the wavelength selective absorption filter according to the embodiment of the present invention can be adjusted by the kind, adding amount, or film thickness of the dye.

The absorbance can be measured and calculated according to the methods described in Examples.

<Moisture Content of Wavelength Selective Absorption Filter According to Embodiment of Present Invention>

From the viewpoint of the durability, the moisture content of the wavelength selective absorption filter according to the embodiment of the present invention is preferably 0.5% by mass or less, and more preferably 0.3% by mass or less, in conditions of 25° C. and 80% relative humidity, regardless of the film thickness.

In the present specification, the moisture content of the wavelength selective absorption filter according to the embodiment of the present invention can be measured by using a sample having a thick film thickness as necessary. The moisture content can be calculated by humidity-conditioning the sample for 24 hours or longer, then measuring a moisture content (g) by the Karl Fischer method with a water measuring instrument and a sample drying apparatus "CA-03" and "VA-05" (both manufactured by Mitsubishi Chemical Corporation), and dividing the moisture content (g) by the sample mass (g, including the moisture content).

<Glass Transition Temperature (Tg) of Wavelength Selective Absorption Filter According to Embodiment of Present Invention>

The glass transition temperature of the wavelength selective absorption filter according to the embodiment of the present invention is preferably 50° C. or higher and 140° C. or lower. More preferably, the glass transition temperature is 60° C. or higher and 130° C. or lower, and still more preferably 70° C. or higher and 120° C. or lower. In a case where the glass transition temperature is equal to or higher than the above-described preferred lower limit value, deterioration of the wavelength selective absorption filter according to the embodiment of the present invention in a case of being used at a high temperature can be suppressed, and in a case where the glass transition temperature is equal to or lower than the above-described preferred upper limit value, it is possible to suppress the remaining of the organic solvent used in the coating liquid, in the wavelength selective absorption filter.

The glass transition temperature of the wavelength selective absorption filter according to the embodiment of the present invention can be measured according to the following method.

With a differential scanning calorimetry device (X-DSC7000 (manufactured by IT Measurement Control Co., Ltd.)), 20 mg of a wavelength selective absorption filter according to the embodiment of the present invention is placed in a measurement pan, and the temperature of the pan is raised from 30° C. to 120° C. in a nitrogen stream at a rate of 10° C./min, held for 15 minutes, and then cooled to 30° C. at −20° C./min. Thereafter, the temperature was raised again from 30° C. to 250° C. at a rate of 10° C./min, and the temperature at which the baseline began to deviate from the low temperature side was defined as the glass transition temperature Tg.

The glass transition temperature of the wavelength selective absorption filter according to the embodiment of the present invention can be adjusted by mixing two or more kinds of polymers having different glass transition temperatures, or by changing the adding amount of the small molecule compound such as the antifading agent.

<Treatment of Wavelength Selective Absorption Filter According to Embodiment of Present Invention>

The wavelength selective absorption filter according to the embodiment of the present invention may be subjected to a hydrophilic treatment by any one of a glow discharge treatment, a corona discharge treatment, or an alkali saponification treatment, where a corona discharge treatment is preferably used. It is also preferable to apply the method disclosed in JP1994-94915A (JP-H6-94915A) and JP1994-118232a (JP-H6-118232A).

As necessary, the obtained film may be subjected to a heat treatment step, a superheated steam contact step, an organic solvent contact step, or the like. In addition, a surface treatment may be appropriately carried out.

Further, as the pressure sensitive adhesive layer, a layer consisting of a pressure sensitive adhesive composition in which a (meth)acrylic resin, a styrene-based resin, a silicone-based resin, or the like is used as a base polymer, and a crosslinking agent such as an isocyanate compound, an epoxy compound, or an aziridine compound is added thereto can be applied.

Preferably, the description for the pressure sensitive adhesive layer in the OLED display device described later can be applied.

<Gas Barrier Layer>

The wavelength selective absorption filter according to the embodiment of the present invention may have a gas barrier layer on at least one surface.

The material that forms the gas barrier layer is not particularly limited, and examples thereof include an organic material (preferably a crystalline resin) such as polyvinyl alcohol or polyvinylidene chloride, an organic-inorganic hybrid material such as a sol-gel material, and an inorganic material such as $SiO_2$, $SiO_x$, or $SiON$, $SiN_x$, or $Al_2O_3$. The gas barrier layer may be a single layer or a multi-layer. In the case of a multi-layer, examples thereof include configurations such as an inorganic dielectric multi-layer film and a multi-layer film obtained by alternately laminating organic materials and inorganic materials.

In a case where the wavelength selective absorption filter according to the embodiment of the present invention includes the gas barrier layer at least on a surface that comes into contact with air in a case where the wavelength selective absorption filter according to the embodiment of the present invention is used, it is possible to suppress a decrease in the absorption intensity of the dye in the wavelength selective absorption filter according to the embodiment of the present invention. As long as the gas barrier layer is provided at an interface of the wavelength selective absorption filter according to the embodiment of the present invention in contact with air, the gas barrier layer may be provided on only one surface of the wavelength selective absorption filter according to the embodiment of the present invention, or may be provided on both surfaces.

Among the above, in a case of a configuration in which the gas barrier layer contains a crystalline resin, the gas barrier layer contains a crystalline resin, and it is preferable that the thickness of the layer is 0.1 µm to 10 µm and the oxygen permeability of the layer is 60 cc/m²·day·atm or less.

In the gas barrier layer, the "crystalline resin" is a resin having a melting point that undergoes a phase transition from a crystal to a liquid in a case where the temperature is raised, and it can impart gas barrier properties related to oxygen gas to the gas barrier layer.

(Crystalline Resin)

The crystalline resin contained in the gas barrier layer is a crystalline resin having gas barrier properties, and it can be used without particular limitation as long as a desired oxygen permeability can be imparted to the gas barrier layer.

Examples of the crystalline resin include polyvinyl alcohol and polyvinylidene chloride, and the polyvinyl alcohol is preferable from the viewpoint that a crystalline portion can effectively suppress the permeation of gas.

The polyvinyl alcohol may be modified or may not be modified. Examples of the modified polyvinyl alcohol include modified polyvinyl alcohol into which a group such as an acetoacetyl group and a carboxyl group is introduced.

The saponification degree of the polyvinyl alcohol is preferably 80.0% by mol or more, more preferably 90.0% by mol or more, still more preferably 97.0% by mol or more, and particularly preferably 98.0% by mol or more, from the viewpoint of further enhancing the oxygen gas barrier properties. The upper limit value thereof is not particularly limited, and it is practically 99.99% by mol or less. The saponification degree of the polyvinyl alcohol is a value calculated based on the method described in JIS K 6726 1994.

The gas barrier layer may contain any component usually contained in the gas barrier layer, as long as the effects of the present invention are not impaired. For example, in addition to the above crystalline resin, organic-inorganic hybrid materials such as an amorphous resin material and a sol-gel material, and inorganic materials such as $SiO_2$, $SiO_x$, $SiON$, $SiN_x$, and $Al_2O_3$ may be contained.

Further, the gas barrier layer may contain a solvent such as water and an organic solvent derived from a manufacturing step, as long as the effects of the present invention are not impaired.

The content of the crystalline resin in the gas barrier layer is, for example, preferably 90% by mass or more, and more preferably 95% by mass or more, in 100% by mass of the total mass of the gas barrier layer. The upper limit value thereof is not particularly limited, and it can be set to 100% by mass.

The oxygen permeability of the gas barrier layer is preferably 60 cc/m²·day·atm or less, more preferably 50 cc/m²·day·atm or less, still more preferably 30 cc/m²·day·atm or less, and particularly preferably 10 cc/m²·day·atm or less. Among the above, it is preferably 5 cc/m²·day·atm or less and most preferably 1 cc/m²·day·atm or less. The practical lower limit value thereof is 0.001 cc/m²·day·atm or more, and it is preferably, for example, more than 0.05 cc/m²·day·atm. In a case where the oxygen permeability is within the above-described preferred range, the light resistance can be further improved.

The oxygen permeability of the gas barrier layer is a value measured based on the gas permeability test method based on JIS K 7126-2 2006. As the measuring device, for example, an oxygen permeability measuring device OX-TRAN2/21 (product name) manufactured by MOCON can be used. The measurement conditions are set to a temperature of 25° C. and a relative humidity of 50%.

For the oxygen permeability, (fm)/(s·Pa) can be used as the SI unit. It is possible to carry out the conversion by (1 fm)/(s·Pa)=8.752 (cc)/(m²·day·atm). fm is read as femtometer and represents 1 fm=$10^{-15}$ m.

The thickness of the gas barrier layer is preferably 0.5 µm to 5 µm, and more preferably 1.0 µm to 4.0 µm, from the viewpoint of further improving the light resistance.

The thickness of the gas barrier layer is measured according to a method of capturing a cross-sectional image using a field emission scanning electron microscope S-4800 (product name) manufactured by Hitachi High-Technologies Corporation.

The degree of crystallinity of the crystalline resin contained in the gas barrier layer is preferably 25% or more, more preferably 40% or more, and still more preferably 45% or more. The upper limit value thereof is not particularly limited, and it is practically 55% or less and preferably 50% or less.

The degree of crystallinity of the crystalline resin contained in the gas barrier layer is a value measured and calculated according to the following method based on the method described in J. Appl. Pol. Sci., 81, 762 (2001).

Using a differential scanning calorimeter (DSC), a temperature of a sample peeled from the gas barrier layer is raised at 10° C./min over the range of 20° C. to 260° C., and a heat of fusion 1 is measured. In addition, as a heat of fusion 2 of a perfect crystal, the value described in J. Appl. Pol. Sci., 81, 762 (2001) is used. Using the obtained heat of fusion 1 and heat of fusion 2, the degree of crystallinity is calculated according to the following expression.

[Degree of crystallinity (%)]=([heat of fusion 1]/[heat of fusion 2])×100 The heat of fusion 1 and heat of fusion 2 may have the same unit, which is generally $Jg^{-1}$.

<Manufacturing Method for Gas Barrier Layer>

The method of forming the gas barrier layer is not particularly limited, and examples thereof include a forming method according to a conventional method, for example in a case of an organic material, according to a casting method such as spin coating or slit coating. In addition, examples thereof include a method of bonding a commercially available resin gas barrier film or a resin gas barrier film produced in advance to the wavelength selective absorption filter according to the embodiment of the present invention. Further, in a case of an inorganic material, examples thereof include a plasma CVD method, a sputtering method, and a vapor deposition method.

<Optical Film>

The wavelength selective absorption filter according to the embodiment of the present invention may appropriately have any optional optical film, as long as the effects of the present invention are not impaired.

The optional optical film is not particularly limited in terms of any of optical properties and materials, and a film containing (or containing as a main component) at least any of a cellulose ester resin, an acrylic resin, a cyclic olefin resin, and a polyethylene terephthalate resin can be preferably used. It is noted that an optically isotropic film or an optically anisotropic phase difference film may be used.

For the above optional optical films, for example, Fujitac TD80UL (manufactured by FUJIFILM Corporation) or the like can be used as a film containing a cellulose ester resin.

Regarding the optional optical film, as those containing an acrylic resin, an optical film containing a (meth)acrylic resin containing a styrene-based resin described in JP4570042B, an optical film containing a (meth)acrylic resin having a glutarimide ring structure in a main chain described in JP5041532B, an optical film containing a (meth)acrylic resin having a lactone ring structure described in JP2009-122664A, and an optical film containing a (meth)acrylic resin having a glutaric anhydride unit in described in JP2009-139754A can be used.

Further, regarding the optional optical films, as those containing a cyclic olefin resin, cyclic olefin-based resin film described in paragraphs [0029] and subsequent paragraphs of JP2009-237376A, and cyclic olefin resin film containing an additive reducing Rth described in JP4881827B, JP2008-063536B can be used.

In addition, the above-described optional optical film may contain an ultraviolet absorbing agent. As the ultraviolet absorbing agent, a commonly used compound can be used without particular limitation.

The content of the ultraviolet absorbing agent in the ultraviolet absorption layer is appropriately adjusted according to the intended purpose.

<<Manufacturing Method for Laminate>>

In a case where the above-described gas barrier layer is provided in the wavelength selective absorption filter according to the embodiment of the present invention, for example, a method of directly producing the above-described gas barrier layer on the wavelength selective absorption filter according to the embodiment of the present invention produced according to the above-described production method is included. In this case, it is also preferable to apply a corona treatment to the surface of the wavelength selective absorption filter according to the embodiment of the present invention to which the gas barrier layer is provided.

Further, in a case where the above-described optional optical film is provided, it is also preferable to carry out bonding by interposing a pressure sensitive adhesive layer. For example, it is also preferable to provide the gas barrier layer on the wavelength selective absorption filter according to the embodiment of the present invention, and then bond an optical film containing an ultraviolet absorbing agent with a pressure sensitive adhesive layer or an adhesive layer being interposed.

<Use Application of Wavelength Selective Absorption Filter According to Embodiment of Present Invention>

The wavelength selective absorption filter according to the embodiment of the present invention can be suitably applied to image display devices such as a notebook type or desktop type personal computer, a smartphone, and a tablet.

Hereinafter, among the image display devices, an OLED display device and a liquid crystal display device will be described in detail.

[OLED Display Device]

The organic electroluminescent display device according to the embodiment of the present invention (referred to as an organic electroluminescence (EL) display device or an organic light emitting diode (OLED) display device, and abbreviated as an OLED display device in the present invention) includes the wavelength selective absorption filter according to the embodiment of the present invention.

In a case where the OLED display device according to the embodiment of the present invention has a configuration including the wavelength selective absorption filter according to the embodiment of the present invention as a film having a function of cutting out blue light, it can display an image in which both an excellent function of cutting out blue light and an excellent correlated color temperature are achieved while a decrease in relative brightness is suppressed.

As another configuration of the OLED display device according to the embodiment of the present invention, the configuration of the typically used OLED display device can be used without particular limitation, as long as the wavelength selective absorption filter according to the embodiment of the present invention is included. The configuration example of the OLED display device according to the embodiment of the present invention is not particularly limited, and examples thereof include a display device including glass, a layer containing a thin film transistor (TFT), an OLED display element, a barrier film, a color filter, glass, a pressure sensitive adhesive layer, the wavelength selective absorption filter according to the embodiment of the present invention, and a surface film, in order from the opposite side to external light. It is noted that in a case where the gas barrier layer is provided, it is provided to be located at least on the external light side from the wavelength selective absorption filter according to the embodiment of the present invention.

The OLED display element has a configuration in which an anode electrode, a light emitting layer, and a cathode electrode are laminated in this order. In addition to the light emitting layer, a hole injection layer, a hole transport layer, an electron transport layer, an electron injection layer, and the like are included between the anode electrode and the cathode electrode. In addition, for example, the description in JP2014-132522A can also be referenced.

Further, as the color filter, in addition to a typical color filter, a color filter in which quantum dots are laminated can also be used.

A resin film can be used instead of the above glass.

The method of forming an OLED color image applicable to the OLED display device according to the embodiment of the present invention is not particularly limited, and any of a three-color painting method, a color conversion method, and a color filter method of red (R), green (G), and blue (B) can be used, and the three-color painting method can be suitably used. As a result, as the light source of the OLED display device according to the embodiment of the present invention, each light emitting layer corresponding to the above image forming method can be applied. For example, blue (B, 460 nm), green (G, 520 nm), and red (R, 620 nm) are used as the light emitting source of the OLED display device.

<Pressure Sensitive Adhesive Layer>

In the OLED display device according to the embodiment of the present invention, it is preferable that the wavelength selective absorption filter according to the embodiment of the present invention is bonded to the glass (the base material) with a pressure sensitive adhesive layer being interposed, on a surface positioned opposite to the side of the external light.

The composition of the pressure sensitive adhesive composition that is used for forming the pressure sensitive adhesive layer is not particularly limited, and for example, a pressure sensitive adhesive composition containing a base resin having a mass average molecular weight (MW) of 500,000 or more may be used. In a case where the mass average molecular weight of the base resin is less than 500,000, the durability reliability of the pressure sensitive adhesive may decrease due to a decrease in cohesive force causing bubbles or peeling phenomenon under at least one of the high temperature condition or the high humidity condition. The upper limit of the mass average molecular weight of the base resin is not particularly limited. However, in a case where the mass average molecular weight is excessively increased, the coating property may deteriorate due to the increase in viscosity, and thus the upper limit thereof is preferably 2,000,000 or less.

The specific kind of the base resin is not particularly limited, and examples thereof include an acrylic resin, a silicone-based resin, a rubber-based resin, and an ethylene-vinyl acetate (EVA)-based resin. In a case of being applied to an optical device such as a liquid crystal display device, an acrylic resin is mainly used in that the acrylic resin is excellent in transparency, oxidation resistance, and resistance to yellowing, and it is not limited thereto.

Examples of the acrylic resin include a polymer of monomer mixture containing 80 to 99.8 parts by mass of the (meth)acrylic acid ester monomer; and 0.02 to 20 parts by mass (preferably 0.2 to 20 parts by mass) of another crosslinkable monomer.

The kind of the (meth)acrylic acid ester monomer is not particularly limited, and examples thereof include alkyl (meth)acrylate. In this case, in a case where the alkyl group contained in the monomer becomes an excessively long chain, the cohesive force of the pressure sensitive adhesive may decrease, and it may be difficult to adjust the glass transition temperature ($T_g$) or the adhesiveness. Therefore, it is preferable to use a (meth)acrylic acid ester monomer having an alkyl group having 1 to 14 carbon atoms.

Examples of such a monomer include methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate, isobornyl (meth)acrylate, and tetradecyl (meth)acrylate.

In the present invention, the above-described monomers may be used alone, or two or more kinds thereof may be used in combination. The (meth)acrylic acid ester monomer is preferably contained in an amount of 80 to 99.8 parts by mass in 100 parts by mass of the monomer mixture. In a case where the content of the (meth)acrylic acid ester monomer is less than 80 parts by mass, the initial adhesive force may decrease, and in a case where the content exceeds 99.8 parts by mass, the durability may decrease due to the decrease in cohesive force.

The other crosslinkable monomer contained in the monomer mixture reacts with a polyfunctional crosslinking agent described later to impart a cohesive force to the pressure sensitive adhesive, and can impart a crosslinking functional group having a role of adjusting the pressure sensitive adhesive force and durability reliability to the polymer. Examples of such a crosslinkable monomer include a hydroxy group-containing monomer, a carboxyl group-containing monomer, and a nitrogen-containing monomer.

Examples of the hydroxy group-containing monomer include 2-hydroxyethyl (meth)acrylate, 2-hydroxypropyl (meth)acrylate, 4-hydroxybutyl (meth)acrylate, 6-hydroxyhexyl (meth)acrylate, and 8-hydroxyoctyl (meth)acrylate, 2-hydroxyethylene glycol (meth)acrylate, and 2-hydroxypropylene glycol (meth)acrylate. Examples of the carboxyl group-containing monomer include acrylic acid, methacrylic acid, 2-(meth)acryloyloxyacetic acid, 3-(meth)acryloyloxypropyl acid, 4-(meth)acryloyloxybutyl acid, an acrylic acid dimer, itaconic acid, maleic acid, and a maleic acid anhydride. Examples of the nitrogen-containing monomer include (meth)acrylamide, N-vinylpyrrolidone, and N-vinylcaprolactam.

In the present invention, these crosslinkable monomers may be used alone, or two or more kinds thereof may be used in combination.

The other crosslinkable monomer may be contained in an amount of 0.02 to 20 parts by mass in 100 parts by mass of the monomer mixture. In a case where the content is less than 0.02 parts by mass, the durability reliability of the pressure sensitive adhesive may decrease, and in a case where the content exceeds 20 parts by mass, at least one of the adhesiveness or the peelability may decrease.

The monomer mixture may further contain a monomer represented by General Formula (10). Such a monomer can be added for the intended purpose of adjusting the glass transition temperature of the pressure sensitive adhesive and imparting other functionality.

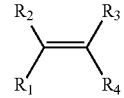

General Formula (10)

In the formula, $R_1$ to $R_3$ each independently represent a hydrogen atom or an alkyl group, and $R_4$ represents a cyano group; a phenyl group which may be substituted with an alkyl group; an acetyloxy group; or —C(=O)$R_5$ (here, $R_5$ represents an amino group which may be substituted with alkyl or alkoxyalkyl or a glycidyloxy group).

The numbers of carbon atoms of the alkyl group and the alkoxy group in terms of the definition of $R_1$ to $R_5$ in the above formula each independently mean 1 to 12, and they are preferably 1 to 8 and more preferably 1 to 12. Specific examples thereof include methyl, ethyl, methoxy, ethoxy, propoxy, and butoxy.

Examples of the monomer represented by General Formula (10) include one or two or more of nitrogen-containing monomers such as (meth)acrylonitrile, (meth)acrylamide, N-methyl (meth)acrylamide, and N-butoxymethyl (meth)acrylamide; styrene-based monomers such as styrene or methylstyrene; epoxy group-containing monomer such as glycidyl (meth)acrylate; or a carboxylic acid vinyl ester such as vinyl acetate, which are not limited thereto.

The monomer represented by General Formula (10) can be contained in an amount of 20 parts by mass or less with respect to 100 parts by mass in total of the (meth)acrylic acid ester monomer and other crosslinkable monomers. In a case where the content exceeds 20 parts by mass, at least one of the flexibility or the peelability of the pressure sensitive adhesive may decrease.

The method of producing a polymer using a monomer mixture is not particularly limited, and the polymer can be produced, for example, through a general polymerization method such as solution polymerization, photopolymerization, bulk polymerization, suspension polymerization, or emulsion polymerization. In the present invention, it is particularly preferable to use a solution polymerization method, and solution polymerization is preferably carried out at a polymerization temperature of 50° C. to 140° C. by mixing an initiator in a state where each monomer is uniformly mixed. In this case, examples of the initiator used include azo-based polymerization initiators such as azobisisobutyronitrile and azobiscyclohexanecarbonitrile; and ordinary initiators such as peroxides such as benzoyl peroxide and acetyl peroxide.

The pressure sensitive adhesive composition may further contain 0.1 to 10 parts by mass of a crosslinking agent with respect to 100 parts by mass of the base resin. Such a crosslinking agent can impart cohesive force to the pressure sensitive adhesive through a crosslinking reaction with the base resin. In a case where the content of the crosslinking agent is less than 0.1 parts by mass, the cohesive force of the pressure sensitive adhesive may decrease. On the other hand, in a case where the content exceeds 10 parts by mass, durability reliability may decrease due to delamination and floating phenomenon.

The kind of the crosslinking agent is not particularly limited, and for example, any crosslinking agent such as an isocyanate-based compound, an epoxy-based compound, an aziridine-based compound, and a metal chelate-based compound can be used.

Examples of the isocyanate-based compound include tolylene diisocyanate, xylene diisocyanate, diphenylmethane diisocyanate, hexamethylene diisocyanate, isophorone diisocyanate, tetramethylxylene diisocyanate, and naphthalene diisocyanate, and a reactant of any one of these compounds and polyol (for example, trimethylolpropane); examples of the epoxy-based compound include ethylene glycol diglycidyl ether, triglycidyl ether, trimethylolpropane triglycidyl ether, N,N,N',N'-tetraglycidyl ethylenediamine, and glycerin diglycidyl ether; and examples of aziridine-based compounds include N,N'-toluene-2,4-bis(1-aziridine carboxamide), N,N'-diphenylmethane-4,4'-bis(1-aziridine carboxamide), triethylene melamine, bisprothaloyl-1-(2-methylaziridine), and tri-1-aziridinylphosphine oxide. Examples of the metal chelate-based compound include compounds in which acetylacetone or ethyl acetoacetate is coordinated with at least any one of polyvalent metals such as aluminum, iron, zinc, tin, titanium, antimony, magnesium, or vanadium.

The pressure sensitive adhesive composition may further contain 0.01 to 10 parts by mass of a silane-based coupling agent with respect to 100 parts by mass of the base resin. The silane-based coupling agent can contribute to the improvement of adhesive reliability in a case where the pressure sensitive adhesive is left for a long time under high temperature or high humidity conditions, particularly improve the adhesive stability in a case where adhering to a glass base material, and improve heat resistance and moisture resistance.

Examples of the silane-based coupling agent include γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, vinyl triethoxysilane, γ-methacryloxypropyltrimethoxysilane, γ-methacryloxypropyltriethoxysilane, γ-aminopropyltriethoxysilane, 3-isocyanuppropyltriethoxysilane, γ-acetoacetatepropyltrimethoxysilane. These silane-based coupling agents may be used alone, or two or more kinds thereof may be used in combination.

The formulation amount of the silane-based coupling agent is preferably 0.01 to 10 parts by mass and more preferably 0.05 to 1 part by mass with respect to 100 parts by mass of the base resin. In a case where the content is less than 0.01 parts by mass, the effect of increasing the pressure sensitive adhesive force may not be sufficient, and in a case where the content exceeds 10 parts by mass, durability reliability may decrease, which includes the occurrence of bubbling or peeling phenomenon.

The above-described pressure sensitive adhesive composition can further contain an antistatic agent. As the antistatic agent, any compound can be used, as long as the antistatic agent has excellent compatibility with other components contained in the pressure sensitive adhesive composition such as an acrylic resin, not adversely affect the transparency of the pressure sensitive adhesive, workability, and durability and can impart the antistatic performance to the pressure sensitive adhesive. Examples of the antistatic agent include inorganic salts and organic salts.

The inorganic salt is a salt containing an alkali metal cation or an alkaline earth metal cation as a cation component.

Examples of the cation include one or two or more of a lithium ion ($Li^+$), a sodium ion ($Na^+$), a potassium ion ($K^+$), a rubidium ion ($Rb^+$), a cesium ion ($Cs^+$), a beryllium ion ($Be^{2+}$), a magnesium ion ($Mg^{2+}$), a calcium ion ($Ca^{2+}$), a strontium ion ($Sr^{2+}$), and a barium ion ($Ba^{2+}$), and preferred examples thereof include a lithium ion ($Li^+$), a sodium ion ($Na^+$), a potassium ion (K), a cesium ion ($Cs^+$), a beryllium ion ($Be^{2+}$), a magnesium ion ($Mg^{2+}$), a calcium ion ($Ca^{2+}$), and a barium ion ($Ba^{2+}$). The inorganic salt may be used alone, or two or more kinds thereof may be used in combination. A lithium ion ($Li^+$) is particularly preferable in terms of ion safety and mobility within the pressure sensitive adhesive.

The organic salt is a salt containing onium cations as a cation component. The term "onium cation" means ion charged to the cation (+), where at least some of the charge is unevenly distributed on one or more of the nitrogen atom (N), the phosphorus atom (P), and the sulfur atom (S).

The onium cation may be any cation of cyclic or acyclic compound cations.

In a case of being a cyclic compound, it may be any one of an alicyclic compound or an aromatic compound. Further, in a case of being a cyclic compound, it can contain one or more heteroatoms (for example, oxygen atoms) other than the nitrogen atom, the phosphorus atom, or the sulfur atom.

The cyclic or acyclic compound may be optionally substituted with a substituent such as a halogen atom, an alkyl group, or an aryl group. In a case of being an acyclic compound, it may be substituted with one or more, preferably four or more substituents, where the substituent(s) may be either cyclic or acyclic, and the cyclic substituent may be either aromatic or alicyclic.

The onium cation is preferably a cation containing a nitrogen atom and more preferably an ammonium ion. The ammonium ion is preferably a quaternary ammonium ion or an aromatic ammonium ion.

Specifically, the quaternary ammonium ion is preferably a cation represented by General Formula 11.

General Formula 11

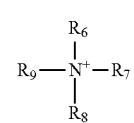

In General Formula 11, $R_6$ to $R_9$ each independently represent an alkyl group, an alkoxy group, an alkenyl group, an alkynyl group, an aryl group, or a heteroaryl group.

The numbers of carbon atoms of the above-described alkyl group and alkoxy group each independently mean 1 to 12, and they are preferably 1 to 8.

The number of carbon atoms of the alkenyl group and the alkynyl group described above each independently mean 2 to 12, and they are preferably 2 to 8.

Examples of the aryl group include phenyl, biphenyl, naphthyl, and anthracenyl.

It suffices that the heteroaryl group is a heteroaryl group having the number of ring members of 5 to 12 (preferably 5 and 6), which contains one or more heteroatoms of O, N, and S as ring-constituting atoms, and it may be a monocyclic ring a fused ring. Examples thereof include puryl, pyrrolyl, pyrrolidinyl, thienyl, pyridinyl, piperidyl, indolyl, quinolyl, thiazole, benzothiazole, and triazole.

The alkyl group, the alkoxy group, the alkenyl group, the alkynyl group, the aryl group, and the heteroaryl group, which can be employed as $R_6$ to $R_9$, may be unsubstituted or may have a substituent.

Examples of the substituent which may be contained in these groups include a hydroxy group, a halogen atom, an alkyl group having 1 to 12 carbon atoms, or an alkoxy group (preferably having 1 to 8 carbon atoms and more preferably 1 to 4 carbon atoms).

Regarding the cation represented by General Formula 11, $R_6$ to $R_9$ are each independently preferably an alkyl group having 1 to 12 carbon atoms, and more preferably an alkyl group having 1 to 8 carbon atoms.

Examples of the quaternary ammonium ion represented by General Formula 11 include N-ethyl-N,N-dimethyl-N-(2-methoxyethyl) ammonium ion, N,N-diethyl-N-methyl-N-(2-methoxyethyl) ammonium ion, N-ethyl-N,N-dimethyl-N-propylammonium ion, N-methyl-N,N,N-trioctylammonium ion, N,N,N-trimethyl-N-propylammonium ion, tetrabutylammonium ion, tetramethylammonium ion, tetrahexylammonium ion, N-methyl-N,N,N-tributylammonium ion.

Examples of the aromatic ammonium ion include one or more ions of pyridinium, pyridadinium, pyrimidinium, pyrazinium, imidazolium, pyrazolium, thiazolium, oxazolium, and triazolium. Preferred examples thereof are an N-alkylpyridinium ion substituted with an alkyl group having 4 to 16 carbon atoms, a 1-alkyl-3-methylimidazolium ion substituted with an alkyl group having 2 to 10 carbon atoms, and a 1,2-dimethyl-3-alkylimidazolium ion substituted with an alkyl group having 2 to 10 carbon atoms. These aromatic ammonium ions may be used alone, or two or more kinds thereof may be used in combination.

In addition, the aromatic ammonium ion is preferably a cation represented by General Formula 12.

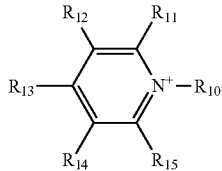

General Formula 12

In General Formula 12, $R_{10}$ to $R_{15}$ each independently represent a hydrogen atom, an alkyl group, an alkoxy group, an alkenyl group, an alkynyl group, an aryl group, or a heteroaryl group.

The alkyl group, the alkoxy group, the alkenyl group, the alkynyl group, the aryl group, and the heteroaryl group, which can be employed as $R_{10}$ to $R_{15}$, are respectively have the same meaning as the alkyl group, the alkoxy group, the alkenyl group, the alkynyl group, the aryl group, and the heteroaryl group, which can be employed as $R_6$ to $R_9$ in General Formula 11.

Regarding the cation represented by General Formula 12, it is preferable that $R_{11}$ to $R_{15}$ are each independently a hydrogen atom or an alkyl group, where $R_{10}$ is an alkyl group.

Preferred examples of the anion contained in the cation-containing inorganic salt or organic salt as described above in the antistatic agent include fluoride ($F^-$), chloride ($Cl^-$), and bromide ($Br^-$), iodide ($I^-$), perchlorate ($ClO_4^-$), hydroxide ($OH^-$), carbonate ($CO_3^{2-}$), nitrate ($NO_3^-$), sulfonate ($SO_4^-$), methylbenzenesulfonate ($CH_3(C_6H_4)SO_3^-$), p-toluene sulfonate ($CH_3C_6H_4SO_3^-$), carboxybenzenesulfonate ($COOH(C_6H_4)SO_3^-$), trifluoromethanesulfonate ($CF_3SO_2^-$), benzoate ($C_6H_5COO^-$), acetate ($CH_3COO^-$), trifluoroacetate ($CF_3COO^-$), tetrafluoro borate ($BF_4^-$), tetrabenzylborate ($B(C_6H_5)_4^-$), hexafluorophosphate ($PF_6^-$), trispentafluoro ethyltrifluorophosphate ($P(C_2F_5)_3F_3^-$), bis-trifluoromethanesulfonimide ($N(SO_2CF_3)_2^-$), bispentafluoroethanesulfonimide ($N(SOC_2F_5)_2^-$), bispentafluoroethanecarbonylimide ($N(COC_2F_5)_2^-$), bisperfluorobutane sulfoneimide ($N(SO_2C_4F_9)_2^-$), bisperfluorobutanecarbonylimide ($N(COC_4F_9)_2^-$), tristrifluoromethanesulfonylmethide ($C(SO_2CF_3)_3^-$), and tristrifluoromethanecarbonylmethide ($C(SO_2CF_3)_3^-$), which are not limited thereto.

Among the anions, the anion is preferably an imide-based anion which can exhibit an electron withdrawing function, is substituted with a fluorine atom having good hydrophobicity, and has high ionic stability.

An antistatic agent having a quaternary ammonium ion represented by General Formula 11 is particularly preferable from the viewpoint of increasing the durability of the dye contained in the wavelength selective absorption filter according to the embodiment of the present invention.

The pressure sensitive adhesive composition contains an antistatic agent in an amount of 0.01 to 5 parts by mass, preferably 0.01 to 2 parts by mass, more preferably 0.1 to 2 parts by mass, with respect to 100 parts by mass of the base resin. In a case where the content is less than 0.01 parts by mass, the desired antistatic effect may not be obtained, and in a case where the content exceeds 5 parts by mass, the compatibility with other components is reduced and the durability reliability of the pressure sensitive adhesive or the transparency may be deteriorated.

The pressure sensitive adhesive composition further includes a compound capable of forming a coordinate bond with an antistatic agent, specifically, with a cation contained in the antistatic agent (hereinafter, referred to as a "coordinate-bonding compound"). In a case where a coordinate-bonding compound is properly contained, it is possible to effectively impart antistatic performance by increasing the anion concentration inside the pressure sensitive adhesive layer even in a case where a relatively small amount of antistatic agent is used.

The kind of the coordinate-bonding compound that can be used is not particularly limited as long as it has a functional group capable of coordinating with the antistatic agent in the molecule, and examples thereof include alkylene oxide-based compounds.

The alkylene oxide-based compound is not particularly limited, and it is preferable to use an alkylene oxide-based compound in which an alkylene moiety in the alkylene oxide unit that is a basic unit has 2 or more carbon atoms, preferably 3 to 12 carbon atoms, and more preferably 3 to 8 carbon atoms.

The alkylene oxide-based compound preferably has a molecular weight of 5,000 or less. The "molecular weight" means the molecular weight or mass average molecular weight of a compound. In the present invention, in a case where the molecular weight of the alkylene oxide-based compound exceeds 5,000, the viscosity may be excessively increased and the coating property may be deteriorated, or the complex forming ability with the metal may be lowered.

On the other hand, the lower limit of the molecular weight of the alkylene oxide compound is not particularly limited; however, it is preferably 500 or more, and more preferably 4,000 or more.

The alkylene oxide-based compound is not particularly limited as long as the compound exhibits the above-described characteristics, and for example, a compound represented by General Formula 13 can be used.

General Formula 13

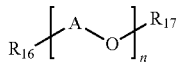

In General Formula 13, A represents an alkylene group having 2 or more carbon atoms, n is 1 to 120, $R_{16}$ and $R_{17}$ each independently represent a hydrogen atom, a hydroxy group, an alkyl group, or $C(=O)R_{18}$, where $R_{18}$ represents a hydrogen atom or an alkyl group.

In General Formula 13, the alkylene group preferably has 3 to 12 carbon atoms and more preferably 3 to 8 carbon atoms. Specifically, it represents ethylene, propylene, butylene, or pentylene.

In General Formula 13, the alkyl group preferably has 1 to 12 carbon atoms, more preferably 1 to 8 carbon atoms, and still more preferably 1 to 4 carbon atoms, n is preferably 1 to 80 and more preferably 1 to 40.

Examples of the compound represented by General Formula 13 include a polyalkylene oxide, a fatty acid-based alkyl ester of the polyalkylene oxide, and a carboxylic acid ester of the polyalkylene oxide, which are not limited thereto.

Examples of the polyalkylene oxide include polyethylene oxide, polypropylene oxide, polybutylene oxide, and polypentylene oxide.

In the present invention, in addition to the above-described alkylene oxide-based compound, various coordinate-bonding compounds such as an ester compound having one or more ether bonds disclosed in KR2006-0018495A, an oxalate group-containing compound disclosed in KR2006-0128659A, a diamine group-containing compound, a polyvalent carboxyl group-containing compound, or a ketone group-containing compound can be appropriately selected and used as necessary.

The coordinate-bonding compound is preferably contained in the pressure sensitive adhesive composition at a ratio of 3 parts by mass or less with respect to 100 parts by mass of the base resin, more preferably 0.1 to 3 parts by mass, and still more preferably, 0.5 to 2 parts by mass. In a case where the content exceeds 3 parts by mass, the pressure sensitive adhesive physical properties such as peelability may deteriorate.

From the viewpoint of adjusting the adhesive performance, the pressure sensitive adhesive composition may further contain 1 to 100 parts by mass of a tackifying resin with respect to 100 parts by mass of the base resin. In a case where the content of the tackifying resin is less than 1 part by mass, the addition effect may not be sufficient, and in a case where the exceeds 100 parts by mass, at least one of the compatibility or the cohesive force improving effect may be lowered.

Such a tackifying resin is not particularly limited, and examples thereof include a hydrocarbon resin, a rosin resin, a rosin ester resin, a terpene resin, a terpene phenol resin, a polymerized rosin resin, and a polymerized rosin ester resin.

The above-described hydrocarbon resin, rosin resin, rosin ester resin, terpene resin, and terpene phenol resin may be hydrogenated.

These tackifying resins may be used alone, or two or more kinds thereof may be used in combination.

The pressure sensitive adhesive composition may contain one or more additives, as long as the effect of the present invention is not affected, a polymerization initiator such as a thermal polymerization initiator or a photopolymerization initiator; an epoxy resin; a curing agent; an ultraviolet stabilizer; an antioxidant; a toning agent, a reinforcing agent; a filler; an antifoaming agent; a surfactant; a photopolymerizable compound such as a polyfunctional acrylate; and a plasticizer.

<Base Material>

In the OLED display device according to the embodiment of the present invention, it is preferable that the wavelength selective absorption filter according to the embodiment of the present invention is bonded to the glass (the base material) with a pressure sensitive adhesive layer being interposed, on a surface positioned opposite to the side of the external light.

The method of forming the pressure sensitive adhesive layer is not particularly limited, and for example, a method of applying the pressure sensitive adhesive composition to the wavelength selective absorption filter according to the embodiment of the present invention by a usual means such as a bar coater, drying, and curing the pressure sensitive adhesive composition; a method of applying the pressure sensitive adhesive composition first to the surface of a peelable base material, and drying the composition, and then transferring the pressure sensitive adhesive layer using the peelable base material to the wavelength selective absorption filter according to the embodiment of the present invention and then aging and curing the composition is used.

The peelable base material is not particularly limited, and any peelable base material can be used. For example, the release film in the manufacturing method for the wavelength selective absorption filter according to the embodiment of the present invention described above is exampled.

In addition, the conditions of application, drying, aging, and curing can be appropriately adjusted based on a conventional method.

[Liquid Crystal Display Device]

The liquid crystal display device according to the embodiment of the present invention includes the wavelength selective absorption filter according to the embodiment of the present invention.

The wavelength selective absorption filter according to the embodiment of the present invention may be used as at least any one of a polarizing plate-protective film or a pressure sensitive adhesive layer as described later, or it may be included in a backlight unit that is used in the liquid crystal display device.

It is preferable that the liquid crystal display device includes a wavelength selective absorption filter, polarizing plates including a polarizer and a polarizing plate-protective film, a pressure sensitive adhesive layer, and a liquid crystal cell, and it is preferable that the polarizing plates are bonded to the liquid crystal cell with a pressure sensitive adhesive layer being interposed. In the liquid crystal display device, the wavelength selective absorption filter may also serve as the polarizing plate-protective film or the pressure sensitive adhesive layer. That is, it is divided into a case where the liquid crystal display device includes polarizing plates including a polarizer and an wavelength selective absorption filter (a polarizing plate-protective film), a pressure sensitive adhesive layer, and a liquid crystal cell, and a case where the liquid crystal display device includes polarizing plates including a polarizer and a polarizing plate-protective film, an wavelength selective absorption filter (a pressure sensitive adhesive layer), and a liquid crystal cell.

FIG. 1 is a schematic view illustrating an example of the liquid crystal display device according to the embodiment of the present invention. In FIG. 1, a liquid crystal display device 10 consists of a liquid crystal cell that has a liquid crystal layer 5 and a liquid crystal cell having a liquid crystal cell upper electrode substrate 3 and a liquid crystal cell lower electrode substrate 6, which are respectively disposed above and below the liquid crystal layer 5; and an upper polarizing plate 1 and a lower polarizing plate 8, which are respectively disposed on both sides of the liquid crystal cell. A color filter layer may be laminated on the upper electrode substrate 3 or the lower electrode substrate 6. A backlight is disposed on the rear surface of the liquid crystal display device 10. As a light source of the backlight, those described in the above backlight unit can be used.

Each of the upper polarizing plate 1 and the lower polarizing plate 8 has a configuration in which each of them is laminated such that a polarizer is sandwiched between two polarizing plate-protective films, and in the liquid crystal display device 10, at least one polarizing plate is preferably a polarizing plate including the wavelength selective absorption filter according to the embodiment of the present invention.

In addition, in the liquid crystal display device 10, the liquid crystal cell may be bonded to the polarizing plates (the upper polarizing plate 1 and/or the lower polarizing plate 8) with a pressure sensitive adhesive layer (not illustrated in the drawing) being interposed. In this case, the wavelength selective absorption filter according to the embodiment of the present invention may also serve as the above-described pressure sensitive adhesive layer.

The liquid crystal display device 10 includes an image direct vision-type liquid crystal display device, an image projection-type liquid crystal display device, and a light modulation-type liquid crystal display device. An active matrix liquid crystal display device in which a three-terminal or two-terminal semiconductor element such as TFT or Metal-Insulator-Metal (MIM) is used is effective for the present invention. In addition, a passive matrix liquid crystal display device represented by an STN mode which is called as the time division driving is also effective.

In a case where the wavelength selective absorption filter according to the embodiment of the present invention is included in the backlight unit, the polarizing plate of the liquid crystal display device may be a typical polarizing plate (a polarizing plate that does not include the wavelength selective absorption filter according to the embodiment of the present invention) or may be a polarizing plate that includes the wavelength selective absorption filter according to the embodiment of the present invention. In addition, the pressure sensitive adhesive layer may be a typical pressure sensitive adhesive layer (which does not correspond to the wavelength selective absorption filter according to the embodiment of the present invention) or may be a pressure sensitive adhesive layer formed of the wavelength selective absorption filter according to the embodiment of the present invention.

The IPS mode liquid crystal display device described in paragraphs 0128 to 0136 of JP2010-102296A is preferable as the liquid crystal display device according to the embodiment of the present invention except that the wavelength selective absorption filter according to the embodiment of the present invention s used.

<Polarizing Plate>

The polarizing plate that is used in the present invention includes a polarizer and at least one polarizing plate-protective film.

The polarizing plate that is used in the present invention is preferably a polarizing plate having a polarizer and polarizing plate-protective films on both surfaces of the polarizer, and it is preferable that at least one surface of the polarizer includes the wavelength selective absorption filter according to the embodiment of the present invention as the polarizing plate-protective film. The surface of the polarizer opposite to the surface having the wavelength selective absorption filter according to the embodiment of the present invention (the polarizing plate-protective film according to the embodiment of the present invention) may have a typical polarizing plate-protective film.

The film thickness of the polarizing plate-protective film is 5 μm to 120 μm and more preferably 10 μm to 100 μm. A thinner film is preferable since in a case of being incorporated in the liquid crystal display device, the display unevenness after elapse of time in high temperature and high humidity is less likely to occur. On the other hand, in a case where the film is too thin, it is difficult to transport the film stably at the time of producing the film and producing the polarizing plate. In a case where the wavelength selective absorption filter according to the embodiment of the present invention also serves as the polarizing plate-protective film, it is preferable that the thickness of the wavelength selective absorption filter satisfies the above-described range.

—Performance of Polarizing Plate—

The polarizing plate that is used in the present invention has a degree of polarization of preferably 99.950% or more, more preferably 99.970%, and most preferably 99.990% or more.

In the present invention, the degree of polarization of the polarizing plate is calculated according to the following expression from an orthogonal transmittance and a parallel transmittance measured at a wavelength of 380 to 700 nm using an automatic polarizing film measurement instrument. VAP-7070 (manufactured by JASCO Corporation).

Degree of polarization (%)=[(parallel transmittance−orthogonal transmittance)/(parallel transmittance+orthogonal transmittance)]$^{1/2}$×100

The degree of polarization can be measured as follows. Two samples (5 cm×5 cm) in which a polarizing plate has been stuck to glass with a pressure sensitive adhesive being interposed are prepared. The orthogonal transmittance and the parallel transmittance are measured by setting a glass side of the sample toward a light source. The two samples are measured, and the average values thereof are defined as the orthogonal transmittance and the parallel transmittance, respectively. In a case of investigating the influence on the degree of polarization with the polarizing plate-protective film, in general, the polarizing plate-protective film to be evaluated is stuck to the glass while being disposed on the glass side.

Other preferred optical properties of the polarizing plate that is used in the present invention are described in [0238] to [0255] of JP2007-086748A, and it is preferable to satisfy these characteristics.

—Shape and Configuration—

The shape of the polarizing plate that is used in the present invention includes not only a polarizing plate of an aspect of a film piece cut into a size capable of being incorporated in the liquid crystal display device as it is, but also a polarizing plate of an aspect in which the polarizing plate is produced in a longitudinal shape by a continuous production and wound up in a rolled shape (for example, an aspect having a roll length of 2,500 m or more or 3,900 m or more). In order to use the polarizing plate as a large-sized screen liquid crystal display device, the width of the polarizing plate is preferably 1,470 mm or more.

The polarizing plate that is used in the present invention is composed of a polarizer and at least one polarizing plate-protective film; however, it is also preferable that the polarizing plate is further composed by bonding a separate film on one surface of the polarizing plate.

The separate film is used for the intended purpose of protecting the polarizing plate during the shipping of the polarizing plate and the examination of the product. The separate film is used for the intended purpose of covering an adhesive layer which is bonded to a liquid crystal plate, and it is used on a surface on which the polarizing plate is bonded to the liquid crystal plate.

(Polarizer)

The polarizer that is used in the polarizing plate that is used in the present invention will be described.

The polarizer that can be used in the polarizing plate that is used in the present invention is preferably composed of polyvinyl alcohol (PVA) and a dichroic molecule. However, as described in JP1999-248937A (JP-H11-248937A), a polyvinylene-based polarizer in which a polyene structure is generated by dehydrating PVA or dechlorinating polyvinyl chloride and aligning the polyene structure can also be used.

—Film Thickness of Polarizer—

The film thickness of the polarizer before stretching is not particularly limited, however, from the viewpoint of stability of retaining film and homogeneity of stretching, it is preferably 1 µm to 1 mm and particularly preferably 5 to 200 µm. In addition, as described in JP2002-236212A, a thin PVA film of which the stress generated in a case of being stretched 4 to 6 times in water is 10 N or less may be used.

—Manufacturing Method for Polarizer—

The manufacturing method for a polarizer is not particularly limited, and it is preferable that, for example, the PVA is formed into a film and then a dichroic molecule is introduced thereto to constitute the polarizer. The PVA film can be produced with reference to the method described in [0213] to [0237] of JP2007-86748A, JP3342516B, JP1997-328593A(JP-H09-328593A), JP2001-302817A, JP2002-144401A.

(Method of Laminating Polarizer and Polarizing Plate-Protective Film)

The polarizing plate that is used in the present invention is manufactured by adhering (laminating) at least one polarizing plate-protective film (preferably the wavelength selective absorption filter according to the embodiment of the present invention) on at least one surface of the above-described polarizer.

The polarizing plate that is used in the present invention is preferably produced according to a method in which a polarizing plate-protective film is subjected to an alkali treatment and bonded, using a completely saponified polyvinyl alcohol aqueous solution, to both surfaces of a polarizer produced by dipping and stretching a polyvinyl alcohol film in an iodine solution.

Examples of the adhesive that is used to bond the treated surface of the polarizing plate-protective film to the polarizer include polyvinyl alcohol-based adhesives such as polyvinyl alcohol and polyvinyl butyral and vinyl-based latex such as butyl acrylate.

In the polarizing plate that is used in the present invention, the bonding of the polarizing plate-protective film to the polarizer is preferably such bonding that the transmission axis of the polarizer and the slow axis of the polarizing plate-protective film are substantially parallel, orthogonal, or 45°.

The slow axis can be measured by various known methods, for example, using a birefringence meter (KOBRADH, manufactured by Oji Scientific Instruments).

Here, "substantially parallel" refers to that the direction of the main refractive index nx of the polarizing plate-protective film and the direction of the transmission axis of the polarizing plate intersect at an angle within ±5°, preferably at an angle within ±1°, and more preferably angle within ±0.5°. In a case where the intersecting angle is within ±1°, the performance of the degree of polarization under polarizing plate crossed nicols is less likely to be deteriorated and light leakage does not easily occur, which is preferable.

The description in which the direction of the main refractive index nx and the direction of the transmission axis are orthogonal or 45° means that the angle at which the direction of the main refractive index nx and the direction of the transmission axis intersect is within a range of ±5° with respect to an exact angle of being orthogonal and 45°, and the difference with respect to the exact angle is preferably within a range of ±1° and more preferably within a range of ±0.5°.

(Functionalization of Polarizing Plate)

The polarizing plate that is used in the present invention is preferably used as a functionalized polarizing plate complexed with an antireflection film for improving the visibility of the display, a brightness improving film, or an optical film having a functional layer such as a hard coat layer, a forward scattering layer, an antiglare layer, an antifouling layer, and an antistatic layer. The antireflection film for functionalization, the brightness improving film, other functional optical films, the hard coat layer, the forward scattering layer, and the antiglare layer are described in [0257] to [0276] of JP2007-86748A, and a functionalized polarizing plate can be prepared based on the description.

<Pressure Sensitive Adhesive Layer>

In the liquid crystal display device according to the embodiment of the present invention, the polarizing plate is preferably bonded to the liquid crystal cell with a pressure sensitive adhesive layer being interposed. The wavelength selective absorption filter according to the embodiment of the present invention may also serve as the pressure sensitive adhesive layer. In a case where the wavelength selective absorption filter according to the embodiment of the present invention does not serve as the pressure sensitive adhesive layer, a typical pressure sensitive adhesive layer can be used as the pressure sensitive adhesive layer.

The pressure sensitive adhesive layer is not particularly limited as long as the polarizing plate can be bonded to the liquid crystal cell, and for example, an acrylic type, a urethane type, polyisobutylene, or the like is preferable.

In a case where the wavelength selective absorption filter according to the embodiment of the present invention also serves as a pressure sensitive adhesive layer, the pressure sensitive adhesive layer includes the coloring agent and the binder resin, and further contains a crosslinking agent, a coupling agent, or the like to impart adhesiveness.

In a case where the wavelength selective absorption filter additionally serves as a pressure sensitive adhesive layer, the pressure sensitive adhesive layer includes the binder resin in an amount of preferably 90% to 100% by mass and preferably 95% to 100% by mass. The content of the coloring agent is as described above.

The thickness of the pressure sensitive adhesive layer is not particularly limited; however, it is preferably 1 to 50 μm and more preferably 3 to 30 μm.

<Liquid Crystal Cell>

The liquid crystal cell is not particularly limited, and a typical liquid crystal cell can be used.

EXAMPLES

Hereinafter, the present invention will be described in more detail based on Examples. The materials, using amount, ratio, details of treatment, procedures of treatment, and the like described in Examples below can be appropriately changed without departing from the spirit of the present invention. Therefore, it is to be understood that the scope of the present invention is not limited to Examples described below.

It is noted that "parts" and "%" that indicate the composition in Examples below are based on mass unless otherwise specified.

In addition, all steps from a preparation step of a wavelength selective absorption filter forming liquid to a production step of a base material-attached wavelength selective absorption filter using the wavelength selective absorption filter forming liquid and to the use thereof in the light resistance test were carried out under a yellow lamp to avoid ultraviolet irradiation.

[Production of Wavelength Selective Absorption Filter]

The materials used in the production of the wavelength selective absorption filter are shown below.

<Matrix Resin>

(Resin 1)

A polystyrene resin (PSJ-polystyrene GPPS SGP-10 (product name), Tg: 100° C., fd: 0.56) manufactured by PS Japan Corporation was heated at 110° C., allowed to cool to room temperature (23° C.), and used as a resin 1.

(Resin 2)

A polyphenylene ether resin (manufactured by Asahi Kasei Corporation, Zylon S201A (product name), poly(2,6-dimethyl-1,4-phenylene oxide), Tg: 210° C.)

(Peelability Control Resin Component 1)

Byron 550 (product name, manufactured by Toyobo Co., Ltd., a polyester-based additive)

<Dye A>

Coloring agent represented by General Formula (A1)

Exemplary compound E-24

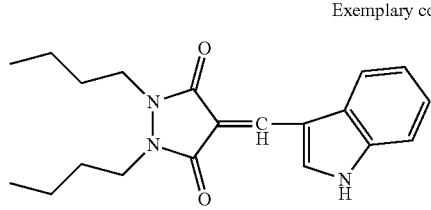

Exemplary compound E-13

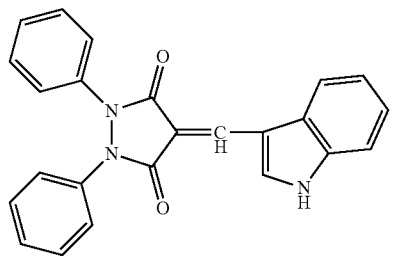

The following dyes used in Example of JP2017-142412A

Coloring agent (B-3)

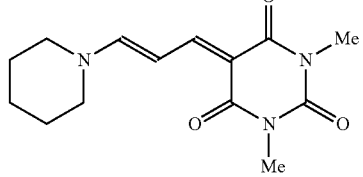

Coloring agent (A-1)

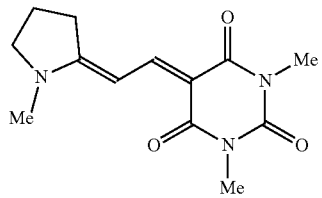

The following dyes used in Example of WO2014/2087149A

Compound example 5

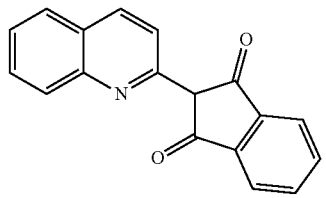

Compound example 15

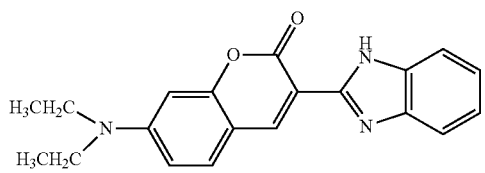

<Dye D>

Manufactured by BASF SE, Lumogen IR788 (product name)

<Other Dyes>

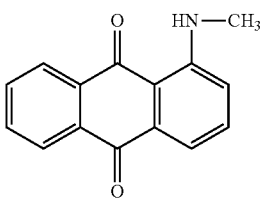

Solvent Red 111

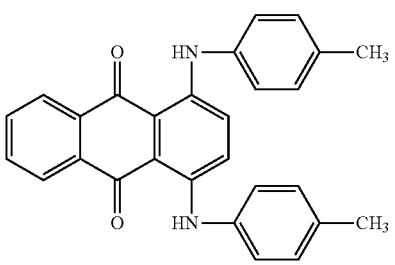

Solvent Green 3

<Additive>
(Antifading Agent 1)
An exemplary compound IV-8 in the above antifading agent

IV-8

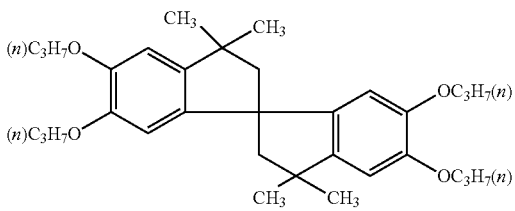

(Leveling Agent 1)
A polymer surfactant composed of the following constitutional components was used as a leveling agent 1. In the following structural formulae, the proportion of each constitutional component is in terms of a molar ratio, and t-Bu means a tert-butyl group.

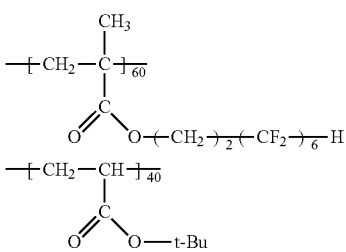

(Base Material 1) A polyethylene terephthalate film, LUMIRROR XD-510P (product name, film thickness: 50 μm, manufactured by Toray Industries, Inc.) was used as a base material 1.

EXAMPLES

<Production of Base Material-Attached Wavelength Selective Absorption Filter No. 101>
(1) Preparation of Wavelength Selective Absorption Filter Forming Liquid
Each component was mixed according to the composition shown below to prepare a wavelength selective absorption filter forming liquid (a composition) No. 101.

| Composition of wavelength selective absorption filter forming liquid No. 101 | |
|---|---|
| Resin 1 | 59.9 parts by mass |
| Resin 2 | 17.5 parts by mass |
| Peelability control resin component 1 | 0.2 parts by mass |
| Leveling agent 1 | 0.1 parts by mass |
| Dye A: Exemplary Compound E-24 | 5.9 parts by mass |
| Dye D: Lumogen IR788 | 4.0 parts by mass |
| Antifading agent 1 | 12.4 parts by mass |
| Toluene (a solvent) | 1710.0 parts by mass |
| Cyclohexanone (a solvent) | 190.0 parts by mass |

Subsequently, the obtained wavelength selective absorption filter forming liquid No. 101 was filtered using a filter paper (#63, manufactured by Toyo Filter Paper Co., Ltd.) having an absolute filtration precision of 10 μm, and further subjected to filtration using a metal sintered filter (product name: Pall filter PMF, media code: FH025, manufactured by Pall) with an absolute filtration precision of 2.5 μm.

(2) Production of Base Material-Attached Wavelength Selective Absorption Filter

The above-described wavelength selective absorption filter forming liquid No. 101 after the filtration treatment was applied onto the base material 1 by using a bar coater so that the film thickness after drying was 2.5 μm, and dried at 120° C. to produce a base material-attached wavelength selective absorption filter No. 101.

<Production of Base Material-Attached Wavelength Selective Absorption Filter Nos. 102 and 103, r01, and c11 to c18>

The base material-attached wavelength selective absorption filter Nos. 102 and 103, r01, and c11 to c18 were produced in the same manner as in the production of the wavelength selective absorption filter No. 101, except that the kind and the formulation amount of the dye were changed to the contents shown in Table 2.

Here, the Nos. 101 to 103 are the wavelength selective absorption filters according to the embodiment of the present invention, and Nos. c11 to c18 are wavelength selective absorption filters for comparison. It is noted that the No. r01 is a control filter which does not contain a dye.

In these wavelength selective absorption filter Nos. 101 to 103, c11 to c14, and c17, the formulation amount of the dye A was adjusted so that the value of the Toxic Blue described later was 48.6% to 48.8%. Further, for those to which the dye D was added, the formulation amount of the dye D was adjusted so that the correlated color temperature was 5,900 K to 6,000 K. This made it possible to discuss the difference in relative brightness. As will be described later, it is noted that in the wavelength selective absorption filter Nos. c15 and 16, the Toxic Blue could not be adjusted to the desired level.

In addition, the wavelength selective absorption filter No. c18 for comparison is a filter of which the transmission characteristics are adjusted so that they are between the light transmission characteristics of the film 274 and the light transmission characteristics of the film 276 described in Table 3 of paragraph 0077 of JP2017-116951A. Specifically, the wavelength selective absorption filter No. c18 exhibits a value shown in the following table, where the value is the "energy remaining after film application" described in Table 3 of JP2017-116951A. It is noted that in the following table, UV is an abbreviation for Ultraviolet and HEV is an abbreviation for High energy visible.

TABLE 1

|  | Wavelength (nm) | Energy remaining after application of filter No. c18 |
|---|---|---|
| UV | 380 to 400 | 1% |
| HEV blue | 415 to 455 | 77% |
| Entire blue | 400 to 500 | 68% |
| Cyan | 500 to 520 | 71% |
| Green | 520 to 565 | 73% |
| Yellow | 565 to 580 | 73% |
| Orange | 580 to 625 | 65% |
| Red | 625 to 740 | 52% |

[Evaluation]

The base material-attached wavelength selective absorption filters produced as described above were evaluated as follows. The results are collectively shown in Table 2.

<Maximal Absorption Value of Wavelength Selective Absorption Filter>

Using a UV3150 spectrophotometer (product name) manufactured by Shimadzu Corporation, the absorbance of the base material-attached wavelength selective absorption filter in a wavelength range of 380 nm to 800 nm was measured for every 1 nm. Using an absorbance $Ab_x(\lambda)$ at each wavelength $\lambda$ nm of the base material-attached wavelength selective absorption filter and an absorbance $Ab_0(\lambda)$ of the control filter which does not contain a dye (that is, the wavelength selective absorption filter No. r01), the absorbance $Ab(\lambda)$ of the wavelength selective absorption filter was calculated according to the following expression.

$$Ab(\lambda)=Ab_x(\lambda)-Ab_0(\lambda)$$

Hereinafter, among the absorbances $Ab(\lambda)$ of the wavelength selective absorption filter in a wavelength range of 380 to 800 nm, the wavelength at which the highest absorbance $Ab(\lambda)$ among the wavelengths at which the highest maximum absorption is exhibited was defined as the maximal absorption wavelength (hereinafter, also simply referred to as "$\lambda_{max}$"), and the absorbance at $\lambda_{max}$ was defined as the maximal absorption value (hereinafter, also simply referred to as "$Ab(\lambda_{max})$").

<Simulation of Color Gamut, Relative Brightness, Correlated Color Temperature, and Function of Cutting Out Blue Light>

A simulation was carried out on a liquid crystal display device equipped with the wavelength selective absorption filter, and the color gamut, the relative brightness, the correlated color temperature, and the cutting-out of blue light were calculated.

[Manufacturing of Liquid Crystal Display Device and Measurement of Emission Spectrum]

In a commercially available liquid crystal display device (manufactured by BenQ Corporation, product name: SW2700PT), a polarizing plate and a phase difference film, located on the viewer side, were integrally peeled from the liquid crystal cell. An acrylic pressure sensitive adhesive was used to bond a base material-attached wavelength selective absorption filter on the phase difference film side so that the surface of the wavelength selective absorption filter was on the pressure sensitive adhesive side, and then the base material was peeled off. In this way, a laminate in which the polarizing plate, the phase difference film, and the wavelength selective absorption filter were bonded in this order was produced. An acrylic pressure sensitive adhesive was used to bond the surface on wavelength selective absorption filter side of this laminate to the liquid crystal cell in the above-described liquid crystal display device, thereby producing a liquid crystal display device equipped with the wavelength selective absorption filter (hereinafter, simply also referred to as a "liquid crystal display device").

The liquid crystal display device was allowed to carry out full screen display for each of white, red, green, and blue, and using a spectroradiometer (manufactured by TOPCON TECHNOHOUSE CORPORATION, product name: SR-UL2), the brightness of white display as well as the chromaticity of each of red, green, and blue was measured.

(1) Color Gamut

An area obtained by overlapping a triangle created by connecting the measured chromaticity points of red, green, and blue on the xy chromaticity diagram in the xyY color system of the International Commission on Illumination (CIE) 1931 and a triangle created by connecting the three primary color points of the DCI-P3 standard (the standard advocated by Digital Cinema Initiatives) was determined, and the area of this overlapped portion was divided by the area of the triangle created by connecting the three primary color points of the DCI-P3 standard to calculate the coverage rate in terms of the DCI-P3 standard (hereinafter, referred to as the "DCI-P3 coverage rate").

In the present invention, the color gamut is preferably 83% or more.

The three primary color points of the DCI-P3 standard are as follows.

Red: x=0.680, y=0.320
Green: x=0.265, y=0.690
Blue: x=0.150, y=0.060

(2) Relative Brightness

The relative brightness of the brightness of white display, measured in a case where the wavelength selective absorption filter had been used, with respect to the brightness of white display, measured in a case where a control filter which does not contain a dye (that is, the wavelength selective absorption filter No. r01) had been used, was calculated.

In the present invention, the relative brightness of 82% or more is the pass level.

(3) Correlated Color Temperature

Using the chromaticity of white light, the correlated color temperature was calculated using the calculation software published on the following homepage.

http://n-colorspace.cool.coocan.jp/s-download.html

In the present invention, the correlated color temperature of 5,900 K to 6400 K is the pass level.

(4) Cutting-Out of Blue Light

The function of cutting out blue light was evaluated based on the following indicators.

In the present invention, the function of cutting out blue light having a Blue Power of less than 20% and a Toxic Blue of less than 50% is the pass level.

[Blue Power (%)]=(an integrated value of the light intensity in a wavelength range of ±20 nm with respect to the wavelength at which the maximum in the blue wavelength range is exhibited)/(an integrated value of the light intensity in a wavelength range of 380 to 780 nm)×100

[Toxic Blue (%)]=(an integrated value of the light intensity at wavelengths of 415 to 455 nm)/(an integrated value of the light intensity at wavelengths of 400 nm to 500 nm)×100

It is noted that regarding the following Ratio Blue to Green Ratio, both Examples and Comparative Examples had a value of less than 200%, which satisfied the criteria and thus at the pass level.

[Ratio Blue to Green Ratio (%)]=(a maximal absorption value in the blue wavelength range)/(a maximum absorption maximum value in colors other than the blue wavelength range)×100

<Evaluation of Light Resistance>

The base material-attached wavelength selective absorption filter of the present invention was irradiated with light for 200 hours in an environment of 60° C. and 50% relative humidity using Super Xenon Weather Meter SX75 (product name, light source: 7.5 kW, a water-cooling type xenon lamp, irradiation illuminance: 150 W/m$^2$) (ultraviolet rays of 300 nm to 400 nm)) manufactured by Suga Test Instruments Co., Ltd. The maximal absorption values before and after this light irradiation were measured respectively, and the light resistance was calculated according to the following expression.

[Light resistance (%)]=([a maximal absorption value after light irradiation for 200 hours]/[a maximal absorption value before light irradiation])−100

Since the above light resistance test corresponds to an acceleration test, there is no problem as long as the light resistance is 10% or more as the practical level. In the present invention, it is preferable to satisfy 70% or more.

maximal absorption wavelengths possessed by the wavelength selective absorption filter in a wavelength range of 380 to 800 nm, at which the highest absorbance Ab (λ) is exhibited.

Ab ($\lambda_{max}$) means the value of the absorbance at the maximal absorption wavelength $\lambda_{max}$.

Ab (450)/Ab (430) means a ratio of a value of the absorbance at a wavelength of 450 nm to a value of the absorbance at a wavelength of 430 nm.

The wavelength selective absorption filter No. c18 contains 2.7% of Solvent Red 111 and 2.9% of Solvent Green 3, in addition to the dye A and the dye D. The definition of the content of these dyes is the same as the definition of the content of the above-described dyes.

The "-" notation in the column of the light resistance evaluation indicates that the corresponding dye is not contained.

"DCI-P3" means DCI-P3 coverage rate.

From Table 2, the following facts can be seen.

The wavelength selective absorption filter Nos. c15 and c16 of Comparative Examples have a value of Ab (450)/Ab (430) of 0.02, which is a value outside the range defined in the present invention, and furthermore, they do not contain the dye D. In these wavelength selective absorption filter Nos. c15 and c16 of Comparative Examples, the Blue Power

TABLE 2

| | Composition | | | | | | Evaluation | | | | | | |
|---|---|---|---|---|---|---|---|---|---|---|---|---|---|
| | Dye A | | | | Dye D | | Cutting-out of blue light | | Color gamut | Relative bright- | Correlated color | (200 hr Xe) | |
| No. | Kind | λmax [nm] | Ab (450)/ Ab (430) | Content | Kind | λmax [nm] | Content | Blue Power (%) | Toxic Blue (%) | DCI-P3 (%) | ness (%) | temperature (K.) | Dye A | Dye D |
| 101 | E-24 | 409 | 0.19 | 5.9% | Lumogen IR788 | 716 | 4.0% | 19.1 | 48.7 | 87.1 | 90.6 | 5973 | 95% | 95% |
| 102 | E-13 | 426 | 0.49 | 2.4% | Lumogen IR788 | 716 | 5.2% | 18.7 | 48.6 | 86.9 | 88.9 | 5954 | 74% | 95% |
| 103 | Compound example 5 | 416 | 0.63 | 1.2% | Lumogen IR788 | 716 | 6.0% | 17.5 | 48.6 | 85.5 | 86.9 | 5977 | 10% | 95% |
| r01 | — | — | — | — | — | — | — | 23.1 | 59.1 | 90.8 | 100 | 6280 | — | — |
| C11 | E-24 | 409 | 0.19 | 6.6% | — | — | — | 18.0 | 48.7 | 89.1 | 99.3 | 5356 | 95% | — |
| C12 | E-13 | 426 | 0.49 | 2.7% | — | — | — | 17.5 | 48.6 | 89.0 | 99.3 | 5297 | 74% | — |
| C13 | Compound example 5 | 416 | 0.63 | 1.4% | — | — | — | 17.5 | 48.6 | 88.3 | 99.4 | 5112 | 10% | — |
| C14 | Compound example 15 | 439 | 1.01 | 1.5% | — | — | — | 12.3 | 48.8 | 86.8 | 98.7 | 4766 | 3% | — |
| C15 | Coloring agent (B-3) | 410 | 0.02 | 3.4% | — | — | — | 22.9 | 57.5 | 90.6 | 99.2 | 6170 | 12% | — |
| C16 | Coloring agent (A-1) | 418 | 0.02 | 4.3% | — | — | — | 22.2 | 55.9 | 90.4 | 100 | 6010 | 2% | — |
| C17 | Compound example 15 | 439 | 1.01 | 1.2% | Lumogen IR788 | 716 | 9.1% | 15.0 | 48.8 | 82.7 | 81.1 | 5963 | 3% | 95% |
| C18 | Coloring agent (A-1) | 418 | 0.02 | 4.9% | Lumogen IR788 | 716 | 2.6% | 20.8 | 59.6 | 88.6 | 68.2 | 8019 | 2% | 95% |

(Note in Table)

The content of the dye means the content proportion of the dye in the wavelength selective absorption filter in terms of the mass ratio.

The notation of "-" in the column of "Dye" indicates that the dye is not contained.

$\lambda_{max}$ in each of the dye A and the dye D means a wavelength derived from the dye A or the dye D among the was more than 20% and the Toxic Blue was more than 50%. As described above, in a case where the value of Ab (450)/Ab (430) is less than 0.05, the blue light cutting-out properties are restricted, and thus it is not possible to suppress the Blue Power and the Toxic Blue to a desired level even in a case where the content of the dye A is adjusted.

In addition, the wavelength selective absorption filter No. c14 of Comparative Example has a value of Ab (450)/Ab (430) of 1.01, which is a value outside the range defined in the present invention, and furthermore, it does not contain the dye D. Although this wavelength selective absorption filter No. c14 of Comparative Example was able to achieve a desired level of blue light cutting-out properties, it had a low correlated color temperature of 4,766 K and thus was unable to achieve both the excellent function of cutting out blue light and the suppression of the decrease in the correlated color temperature due to the addition of the dye.

Although the wavelength selective absorption filter Nos. c11 to c13 of Comparative Examples have a value of Ab (450)/Ab (430), which is within the range defined in the present invention, and furthermore, they do not contain the dye D. Similar to the No. c14, these wavelength selective absorption filter Nos. c11 to c13 of Comparative Examples were able to achieve a desired level of blue light cutting-out properties. However, although the decrease in the correlated color temperature could be suppressed as compared with the No. c14, the correlated color temperature was still low, and thus it was unable to achieve both the excellent function of cutting out blue light and the suppression of the decrease in the correlated color temperature due to the addition of the dye.

The wavelength selective absorption filter Nos. c17 of Comparative Example has a value of Ab (450)/Ab (430) of 1.01, which is a value outside the range defined in the present invention, and it contains the dye D. This wavelength selective absorption filter No. c17 of Comparative Example was able to achieve a desired level of blue light cutting-out properties, and it was also able to suppress the decrease in the correlated color temperature by containing the dye D. However, the relative brightness was reduced to 81.1%, and thus it was not possible to achieve both an excellent function of cutting out blue light and an excellent correlated color temperature while suppressing the decrease in relative brightness.

In addition, the wavelength selective absorption filter No. c18 of Comparative Example has characteristics in a range of those between films 274 and 276 (the energy remaining after the film application) described in JP2017-116951A, and the value of Ab (450)/Ab (430) is 0.02, which is a value outside the range defined in the present invention. Similar to the Nos. c15 and c16, this wavelength selective absorption layer filter No. c18 of Comparative Example had an insufficient function of cutting out blue light as compared with that defined in the present invention. In addition to this, it was found that the relative brightness is 68.2% and the decrease thereof cannot be suppressed, and the correlated color temperature was too high.

On the other hand, it was found that the wavelength selective absorption filter Nos. 101 to 103 according to the embodiment of the present invention are able to realize all of the suppression of the decrease in relative brightness, the excellent function of cutting out blue light, and the excellent correlated color temperature. Further, it was found that the Nos. 101 and 102 containing a coloring agent represented by General Formula (A1) as the dye A are excellent in light resistance as well.

Although the present invention has been described with reference to the embodiments, it is the intention of the inventors of the present invention that the present invention should not be limited by any of the details of the description unless otherwise specified and rather be construed broadly within the spirit and scope of the invention appended in WHAT IS CLAIMED IS.

1: upper polarizing plate
2: direction of absorption axis of upper polarizing plate
3: upper electrode substrate of liquid crystal cell
4: alignment control direction of upper substrate
5: liquid crystal layer
6: lower electrode substrate of liquid crystal cell
7: alignment control direction of lower substrate
8: lower polarizing plate
9: direction of absorption axis of lower polarizing plate
B: backlight unit
10: liquid crystal display device

What is claimed is:

1. A wavelength selective absorption filter comprising a resin; and
the following dye A and dye D, each of which has a main absorption wavelength band in a different wavelength range,
wherein an absorbance Ab ($\lambda$) at a wavelength $\lambda$ nm of the wavelength selective absorption filter satisfies a relationship of the following Expression (I),
the dye A: a dye having a main absorption wavelength band in the wavelength selective absorption filter at a wavelength of 400 to 430 nm,
the dye D: a dye having a main absorption wavelength band in the wavelength selective absorption filter at a wavelength of 640 to 730 nm, and $$0.05 \leq Ab(450)/Ab(430) < 1.00. \quad \text{Relational Expression (I)}$$

2. The wavelength selective absorption filter according to claim 1,
wherein the dye A is a coloring agent represented by General Formula (A1),

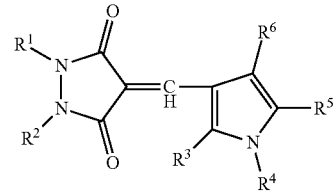

General Formula (A1)

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

3. A polarizing plate comprising the wavelength selective absorption filter according to claim 1.

4. An organic electroluminescent display device or a liquid crystal display device, comprising the wavelength selective absorption filter according to claim 1.

5. The wavelength selective absorption filter according to claim 1,
wherein the dye A is a coloring agent represented by General Formula (A1),

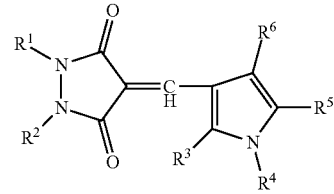

General Formula (A1)

in the formula, $R^1$ and $R^2$ each independently represent an unsubstituted alkyl group or a substituted alkyl group having a substituent, or an unsubstituted aryl group or a substituted aryl group having a substituent, $R^3$ to $R^6$ each independently represent a hydrogen atom or a substituent, and $R^5$ and $R^6$ may be bonded to each other to form a 6-membered ring which may have a substituent, provided that the substituent of the substituted alkyl group or the substituted aryl group, the substituent employable as $R^3$ to $R^6$, and the substituent of the 6-membered ring that may be formed by bonding $R^5$ and $R^6$ are selected from the group consisting of the following substituents:

a halogen atom, an alkyl group, a cycloalkyl group, an aralkyl group, an alkenyl group, an alkynyl group, an aryl group, a heterocyclic group, a cyano group, a hydroxy group, a nitro group, a carboxyl group (may be in the form of a salt), an alkoxy group, an aryloxy group, a silyloxy group, a heterocyclic oxy group, an acyloxy group, a carbamoyloxy group, a sulfonyloxy group, an alkoxycarbonyloxy group, an aryloxycarbonyloxy group, an amino group, an aminocarbonylamino group, an alkylcarbonylamino group, an alkoxycarbonylamino group, an aryloxycarbonylamino group, a mercapto group, an alkylthio group, an arylthio group, a heterocyclic thio group, a sulfo group (may be in the form of a salt), an alkylsulfinyl group, an arylsulfinyl group, an alkylsulfonyl group, an arylsulfonyl group, an acyl group, an aryloxycarbonyl group, an alkoxycarbonyl group, an imide group, a phosphino group, a phosphinyl group, a phosphinyloxy group, a phosphinylamino group, or a silyl group.

6. The wavelength selective absorption filter according to claim 1,
wherein the dye A is a coloring agent represented by General Formula (A1),

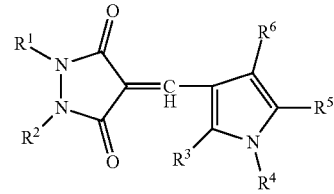

General Formula (A1)

in the formula, $R^1$ and $R^2$ each independently represent an alkyl group, $R^3$ to $R^6$ each independently represent a hydrogen atom or a substituent, and $R^5$ and $R^6$ may be bonded to each other to form a 6-membered ring.

* * * * *